US012648575B2

(12) United States Patent
Thorogood et al.

(10) Patent No.: US 12,648,575 B2
(45) Date of Patent: Jun. 9, 2026

(54) APPLIANCE TO COOK PIZZA

(71) Applicant: BREVILLE PTY LIMITED, Alexandria (AU)

(72) Inventors: Michael Thorogood, Alexandria (AU); Emma Larkin, Alexandria (AU); Marian Silviu Rosian, Alexandria (AU); Brendan John Foxlee, Earlwood (AU); Vyvyan Rose, Bronte (AU); John Chul-Won Lee, Alexandria (AU)

(73) Assignee: BREVILLE PTY LIMITED, Alexandria (AU)

( * ) Notice: Subject to any disclaimer, the term of this patent is extended or adjusted under 35 U.S.C. 154(b) by 1116 days.

(21) Appl. No.: 16/627,756

(22) PCT Filed: Jul. 2, 2018

(86) PCT No.: PCT/AU2018/000111
§ 371 (c)(1),
(2) Date: Dec. 30, 2019

(87) PCT Pub. No.: WO2019/000019
PCT Pub. Date: Jan. 3, 2019

(65) Prior Publication Data
US 2021/0161151 A1     Jun. 3, 2021

(30) Foreign Application Priority Data

Jun. 30, 2017   (AU) ................................. 2017902546
May 4, 2018   (AU) ................................. 2018901524

(51) Int. Cl.
*A47J 36/32*     (2006.01)
*A21B 1/22*     (2006.01)
(Continued)

(52) U.S. Cl.
CPC ................. *A21B 1/40* (2013.01); *A21B 1/22* (2013.01); *A47J 36/32* (2013.01); *A47J 37/0629* (2013.01);
(Continued)

(58) Field of Classification Search
CPC .. A47J 37/0623; A47J 37/042; A47J 37/0641; A47J 37/0629; A47J 37/0664;
(Continued)

(56) References Cited

U.S. PATENT DOCUMENTS 2,042,855 A   *   6/1936   Merklein   ............ A47J 37/0635
                                99/422
2,098,729 A     11/1937   Myers
(Continued)

FOREIGN PATENT DOCUMENTS

CN         102777945 A    11/2012
EP          2983452 A2     2/2016
(Continued)

OTHER PUBLICATIONS

International Search Report and Written Opinion for PCT/AU2018/000111, mailed Sep. 17, 2018.

*Primary Examiner* — Chris Q Liu
(74) *Attorney, Agent, or Firm* — KDW Firm PLLC

(57) ABSTRACT

There is disclosed a cooking appliance (2010) including:
a body (2014) providing a floor (2016), a ceiling (2018) and an intermediate wall (2020) locating between the floor (2016) and ceiling (2018), the floor (2016), ceiling (2018), and wall (2020) at least partly surrounding a cooking cavity (2022), the body (2014) having an opening (2024) via which product to be cooked can be moved relative to the cavity (2022);
at least one upper heating element (2030) located in an upper portion (2032) of the cavity (2022) to deliver radiant energy to cook the product; and
(Continued)

at least one shield (2034) positioned relative to the element (2030) to shield a portion of the product from the radiant energy.

12 Claims, 48 Drawing Sheets

(51) Int. Cl.

| | |
|---|---|
| *A21B 1/40* | (2006.01) |
| *A47J 37/06* | (2006.01) |
| *F24C 7/08* | (2006.01) |
| *F24C 15/00* | (2006.01) |
| *F24C 15/02* | (2006.01) |
| *F24C 15/16* | (2006.01) |
| *H05K 7/20* | (2006.01) |

(52) U.S. Cl.
CPC ........... *A47J 37/0658* (2013.01); *F24C 7/087* (2013.01); *F24C 15/006* (2013.01); *F24C 15/027* (2013.01); *F24C 15/162* (2013.01); *H05K 7/20145* (2013.01); *A47J 2202/00* (2013.01)

(58) Field of Classification Search
CPC ...... A47J 37/041; A47J 37/043; A47J 37/047; A47J 37/0611; A47J 37/0658; A47J 36/027; A47J 37/0745; A47J 2037/0617; A47J 36/06; A47J 37/0635; A47J 37/0786; A47J 2202/00; A47J 27/04; A47J 36/04; A47J 36/20; A47J 36/22; A47J 36/32; A47J 37/01; A47J 37/015; A47J 37/0647; A47J 37/067; A47J 37/0704; A47J 37/0727; A47J 37/0731; A47J 37/0763; A47J 39/003; F24C 15/325; F24C 15/162; F24C 7/087; F24C 15/16; F24C 7/046; F24C 15/006; F24C 15/02; F24C 15/022; F24C 15/027; F24C 15/04; F24C 15/22; F24C 15/322; F24C 15/34; F24C 3/027; F24C 7/06
USPC ....... 219/400, 394, 386, 387, 388, 395, 399, 219/407, 411, 450.1
See application file for complete search history.

(56) References Cited

U.S. PATENT DOCUMENTS

| | | | |
|---|---|---|---|
| 2,953,419 A | | 9/1960 | Ingolia |
| 5,315,922 A | * | 5/1994 | Keller .................... A47J 36/06 |
| | | | 99/422 |
| 6,054,697 A | | 4/2000 | Woodward et al. |
| 8,063,342 B2 | | 11/2011 | Hines, Jr. |
| 2007/0108179 A1 | * | 5/2007 | Hines, Jr. ................ F24C 7/087 |
| | | | 219/400 |
| 2014/0287119 A1 | * | 9/2014 | Dahle ...................... A21B 1/44 |
| | | | 426/520 |
| 2016/0227965 A1 | * | 8/2016 | Johnston ............. A47J 37/0704 |
| 2016/0309956 A1 | | 10/2016 | Glucksman |
| 2017/0020335 A1 | * | 1/2017 | Chen .................... A47J 37/0745 |
| 2017/0055767 A1 | * | 3/2017 | Brown .................. A47J 37/041 |
| 2017/0079475 A1 | * | 3/2017 | Buckley ............... A47J 37/042 |

FOREIGN PATENT DOCUMENTS

| | | | |
|---|---|---|---|
| JP | 2005078823 A | 3/2005 |
| JP | 2012237508 A | 12/2012 |
| KR | 20050063944 A | 6/2005 |

* cited by examiner

337

333

339

333

332

341

338

333

372

333

383

400

400

1200

1274    1270

1230    1272

1300

1374

1372

1400

1475     1474

1473

1472

1474

1475

APPLIANCE TO COOK PIZZA

FIELD

The present invention relates to cooking appliances, and more particularly, but not exclusively to appliances for cooking pizza.

BACKGROUND

Appliances used to cook pizza, such as an oven, provide for circulation of heat around a cavity within which the pizza is being cooked. The oven includes a heating element positioned within the cavity to radiate heat around the cavity to cook the pizza. Typically, the outer circumference of the pizza (referred to as the crust of the pizza) benefits from a more intense heat than the centre of the pizza where most of the delicate ingredients are arranged. Consequently, more power is supplied to the heating element to increase the radiated heat supplied to the crust. Disadvantageously, whilst the pizza crust is exposed to an intense heat, so too is the delicate centre of the pizza. Moreover, the intense heat may damage vulnerable electrical components of the appliance.

It is an object of the present invention to substantially overcome, or at least ameliorate, one or more of the above disadvantages.

SUMMARY OF INVENTION

In a first aspect, the invention provides a cooking appliance including:
  a body providing a floor, a ceiling and an intermediate wall locating between the floor and ceiling, the floor, ceiling, and wall at least partly surrounding a cooking cavity, the body having an opening via which product to be cooked can be moved relative to the cavity;
  at least one upper heating element located in an upper portion of the cavity to deliver radiant energy to cook the product; and
  at least one shield positioned relative to the element to shield a portion of the product from the radiant energy.
  Preferably, the cooking appliance further includes a deck depending from the floor for receiving the product to be cooked.

Preferably, the cooking appliance further includes a door to selectively close the opening, wherein the deck is supported by a mechanism to both lower and withdraw the deck from the cavity as the door is opened and to both raise and insert the deck into the cavity as the door is closed.

Preferably, the ceiling has a central axis extending perpendicularly between the floor and the ceiling to centrally locate the product.

Preferably, the cooking appliance further includes:
  a pair of inner and outer upper heating elements centrally located on the axis; and
  a primary shield and a secondary shield both centrally located on the axis, such that the primary shield is surrounded by the outer upper heating element and the secondary shield is surrounded by the inner upper heating element.

Preferably, the cooking appliance further includes a controller operatively associated with each of the inner and outer upper heating elements, wherein each of the inner and outer upper heating elements are independently controllable by the controller to provide for selective delivery of electric power thereto thereby to provide a heating profile across the product.

Preferably, the cooking appliance further includes:
  a lower heating element located in a lower portion of the cavity to deliver radiant energy to cook the product; and
  a cooling system coupled to the body, the cooling system including a first airflow channel communicating with the cavity, the first airflow channel configured to direct airflow to a cold pin of the lower heating element to selectively cool the cold pin.

Preferably, the upper heating element is centrally located on the axis and extends circumferentially around the ceiling.

Preferably, the shield is centrally located on the axis in the upper portion of the cavity such that the shield is surrounded by the upper heating element.

Preferably, the shield is annular.

Preferably, the shield is detachably mounted to the ceiling so that the shield can be removed from the appliance.

Preferably, the shield is angularly rotatable and movable about the central axis relative to the floor such that the shield can be raised away from the floor or lowered towards the floor to vary the amount of radiant energy that is shielded from the portion of the product.

Preferably, the ceiling includes a slotted profile inclined relative to the floor, and wherein the shield includes a radial pin extending from a periphery of the shield to cooperate with the profile such that, as the shield is rotated about the axis, the pin slides towards an upper end of the profile or towards a lower end of the profile to respectively raise or lower the shield.

Preferably, the cooking appliance further includes an inner shield and an outer shield, the inner shield having a smaller diameter than a diameter of the outer shield so that the inner shield is nestable within the outer shield, the inner shield being rotatable about the axis relative to the outer shield.

Preferably, each of the inner and outer shields have at least one aperture to permit radiant energy to pass therethrough, wherein the apertures of both the inner and outer shields are alignable such that rotation of the inner shield relative to the outer shield causes at least partial alignment of the apertures to vary the amount of radiant energy that is shielded from the portion of the product.

Preferably, the cooking appliance further includes a motor assembly to drive the rotation of the shield about the central axis.

Preferably, the shield is threadedly engageable with the ceiling such that the shield can be rotated in a conventional screw-like manner to raise or lower the shield.

In a second aspect, the invention provides a cooking appliance including:
  a body providing a floor, a ceiling and an intermediate wall locating between the floor and ceiling, the floor, ceiling, and wall at least partly surrounding a cooking cavity, the body having an opening via which product to be cooked can be moved relative to the cavity;
  a door to selectively close the opening of the cavity; the door being hinged about a lower portion of the door, such that an upper portion of the door travels in an arc as the door is opened;
  a deck depending from the floor for receiving the product to be cooked;
  wherein the deck is supported by a mechanism to both lower and withdraw the deck from the cavity as the door is opened and to both raise and insert the deck into the cavity as the door is closed.

Preferably, the mechanism includes a rear support arm and a front support bracket, wherein the support arm is pivotally coupled with respect to the floor of the cavity and pivotally supports a rear portion of the deck, and wherein the support bracket is hingedly coupled to the door such that opening and closing the door respectively withdraws and inserts the deck.

Preferably, a length of the support arm and a height of the support bracket hinged coupling are sized to maintain the deck generally horizontal as it is raised and lowered.

Preferably, the support arm rotates past the horizontal as the door is being closed, wherein an equilibrium is reached before the door is fully closed, such that the further insertion of the product causes the weight of the deck to over balance the support and further assist closure of the door.

Preferably, the cooking appliance of the second aspect further includes an upper heating element located in an upper portion of the cavity to deliver radiant energy to cook the product.

Preferably, the cooking appliance of the second aspect further includes a lower heating element embedded in the deck.

Preferably, the cooking appliance of the second aspect further includes a controller operatively associated with the upper heating element and the lower heating element to provide for selective delivery of electric power thereto thereby to provide a heating profile across the product.

Preferably, the cooking appliance of the second aspect further includes a temperature sensor located within the cavity to provide a signal indicative of the temperature within the cavity to the controller.

In a third aspect, the invention provides a cooking appliance including:

a body providing a floor, a ceiling and an intermediate wall locating between the floor and ceiling, the floor, ceiling, and wall at least partly surrounding a cooking cavity, the body having an opening via which product to be cooked can be moved relative to the cavity;

at least one upper heating element located in an upper portion of the cavity to deliver radiant energy to cook the product;

a lower heating element located in a lower portion of the cavity to deliver radiant energy to cook the product, and a controller operatively associated with each upper heating element and the lower heating element to provide for selective delivery of electric power thereto thereby to provide a heating profile across the product.

Preferably, the cooking appliance of the third aspect further includes a pair of inner and outer upper heating elements, each of the inner and outer upper heating elements being independently controllable by the controller.

Preferably, the controller is configured to operate in a first mode and a second mode to alter the electric power and temperature of each of the upper heating elements and the lower heating element thereby to vary the heating profile across the product.

Preferably, the cooking appliance of the third aspect further includes a user operable control hub having a plurality of dials operatively associated with the controller to manually alter the electric power and temperature of each of the upper heating elements and the lower heating element in both the first mode and the second mode of the controller.

Preferably, in the first mode, a first dial is configured to control the temperature of the lower heating element.

Preferably, in the first mode, a second dial is configured to control the temperature of the inner and outer upper heating elements.

Preferably, in the first mode, a third dial is configured to control the electric power to the inner and outer upper heating elements to provide fine tuning to cooking an outer edge of the product, or even cooking across the whole of the product, or general control over cooking of a centre portion or the outer edge of the product.

Preferably, the controller includes a timer operatively associated with the inner and outer upper heating elements and the lower heating element to stop the delivery of electric power to the inner and outer upper heating elements and the lower heating element after a duration of time, wherein, in the second mode, a first dial is configured to control the duration of the timer.

Preferably, the controller includes a range of pre-set settings having different durations of the timer and temperatures of the inner and outer upper heating elements and the lower heating element, wherein a second dial is configured to select a pre-set setting from the range.

Preferably, in the second mode, a third dial is configured to fine-tune the temperature of the lower heating element.

Preferably, the cooking appliance of the third aspect further includes a temperature sensor located within the cavity to provide a signal indicative of the temperature within the cavity to the controller to adjust the delivery of electric power to each of the inner and outer upper heating elements and the lower heating element.

In a fourth aspect, the invention provides a cooking appliance including:

a body providing a floor, a ceiling and an intermediate wall locating between the floor and ceiling, the floor, ceiling, and wall at least partly surrounding a cooking cavity, the body having an opening via which product to be cooked can be moved relative to the cavity;

a lower heating element located in a lower portion of the cavity to deliver radiant energy to cook the product; and a cooling system coupled to the body, the cooling system including a first airflow channel communicating with the cavity, the first airflow channel configured to direct airflow to a cold pin of the lower heating element to selectively cool the cold pin.

Preferably, the cooling system includes a vent proximate the cold pin to expel air directed by the first airflow channel.

Preferably, the cooling system includes a fan mounted to the body and positioned away from the vent, wherein the fan drives the airflow through the first airflow channel to the vent.

Preferably, the cooking appliance of the fourth aspect further includes a controller operatively associated with the lower heating element to provide for selective delivery of electric power thereto thereby to provide a heating profile across the product.

Preferably, the cooking appliance of the fourth aspect further includes a temperature sensor located within the cavity to provide a signal indicative of the temperature within the cavity to the controller to adjust the delivery of electric power to the lower heating element.

Preferably, the cooking appliance of the fourth aspect further includes a deck depending from the floor to receive the product to be cooked.

Preferably, the temperature sensor is mounted to the deck.

Preferably, the fan is actuated when the temperature sensor detects a temperature above a certain temperature threshold monitored by the controller.

Preferably, the wall has a compartment to house electronics of the appliance, wherein the cooling system further includes a second airflow channel communicating with the compartment of the wall to cool the electronics.

Preferably, the cooking appliance of the fourth aspect further includes a door to selectively close the opening of the cavity; the door being hinged about a lower portion of the door, wherein a passage is located about the lower portion of the door to house electronics of the appliance, wherein the cooling system further includes a third airflow channel communicating with the passage to cool the electronics when the door closes the opening.

Preferably, the product is pizza.

There is also disclosed a pizza oven apparatus, the apparatus including:

an oven body that defines a cooking cavity; the cooking cavity having a floor and a ceiling with intermediate wall that defines a front opening;

a door that selectively closes the opening of the cavity;

a pizza deck within the cavity for receiving a pizza for cooking;

at least one heating element located about the ceiling of the cooking cavity; wherein a variable heating or cooking profile is provided across the pizza deck.

The at least one heating element preferably defines a substantially circumferential heat source.

The variable heating or cooking profile may be provided by a shield. Preferably the shield is circumferential and located within the area defined by the heating element or elements.

The variable heating or cooking profile may be provided by a plurality of heating elements, each heating element having a different heat power output.

The variable heating or cooking profile may be provided by a plurality of heating elements, each heating element having a different heat power output.

The variable heating or cooking profile may be provided by a heating element having different heat power output along its length.

BRIEF DESCRIPTION OF DRAWINGS

Preferred forms of the present invention will now be described by way of example with reference to the accompanying drawings wherein.

DESCRIPTION OF EMBODIMENTS

Figure 1:
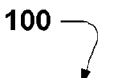
FIG. 1 is a sectional side view of an embodiment pizza oven, shown with the door in a closed configuration.
Figure 1:
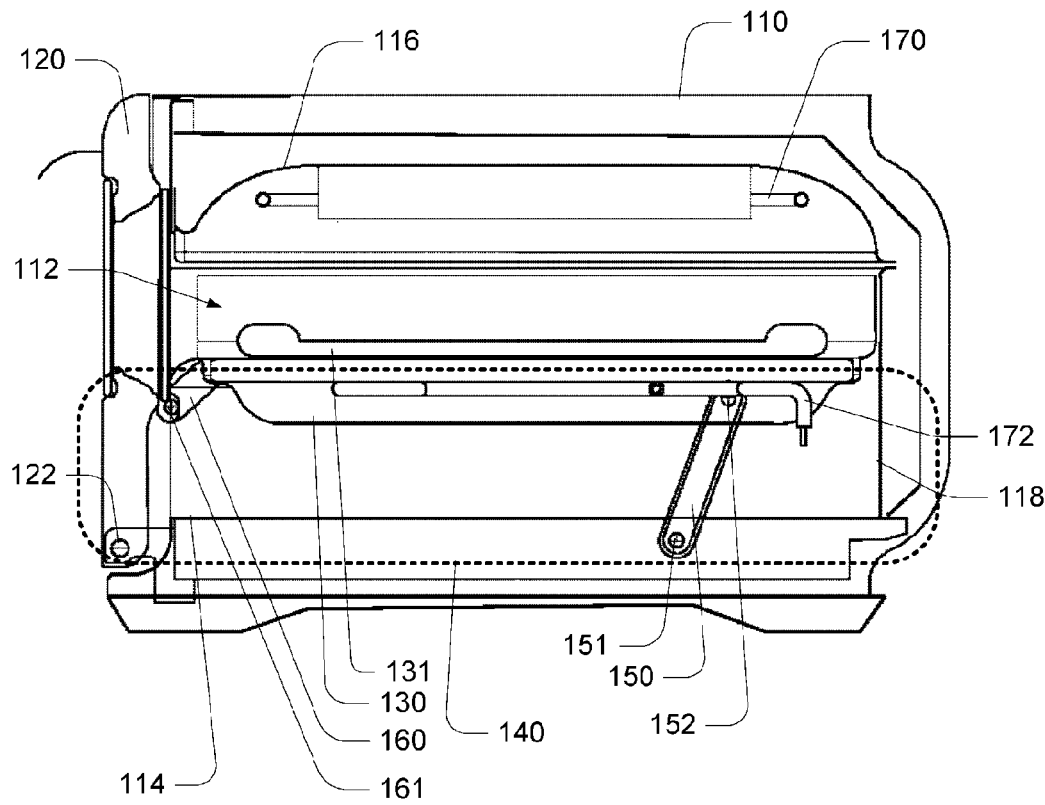

In order to cook a pizza with a result as outlined by The True Neapolitan Pizza Association (Associazione Verace Pizza napoletana, AVPN), the pizza needs to be cooked rapidly and exposed to heat of a high intensity. Achieving the required heat intensity in domestic electrical appliances is difficult due to voltage & current-draw limitations. One way to effectively increase heat intensity without increasing wattage/current-draw is to increase the proximity of the heat source and food (for example, locate the food closer to a heating element). Doing so also reduces the total cooking chamber volume which allows for more rapid heating and recovery cycles. The downside is that this typically makes the product difficult to use & difficult to clean due to the narrow aperture in which to load foods.

One way of alleviating this problem is by incorporating a deck that is connected to the oven door, which lowers when the pizza is being loaded onto the deck and rises when the oven door is closed for the cooking operation.

Increasing the proximity of the heaters to the deck also reduces the total cavity volume which allows for the cavity temperature to rise faster with the same amount of power than would be possible with a larger cooking cavity.

FIG. 1 through FIG. 5, shows an embodiment pizza oven apparatus 100. The apparatus includes:

an oven body 110 that defines a cooking cavity 112; the cavity having a floor 114 and a ceiling 116 with intermediate wall 118 that has a front opening;

a door 120 selectively closes the opening of the cavity; the door being hinged (at 122) about a lower portion of the door, such that an upper portion of door travels in an arc as the door is opened;

a pizza deck 130 within the cavity for receiving a pizza 131 for cooking;

wherein the pizza deck is supported by a mechanism 140;

wherein the mechanism both lowers and withdraws the pizza deck as the door is opened and both raises and inserts the pizza deck as the door is closed.

The mechanism includes one or more rear support arm 150 and one or more front support bracket 160; the support arm is pivotally coupled (at 151) with respect to the floor of the cavity and pivotally supports (at 152) a rear portion of the pizza deck; the support bracket is hingedly coupled (at 161) to the door, such that opening and closing the door respectively withdraws and inserts the pizza deck.

The length of the support arm and height of the support bracket hinged coupling are sized to maintain the pizza deck substantially horizontal as it is raised and lowered.

The support arm rotates past the horizontal as the door is being closed, wherein an equilibrium is reached before the door is fully closed, and the further insertion of the pizza deck causes the weight of the pizza deck to over balance the support arm and support mechanism to further assist closure of the door.

Figure 4:
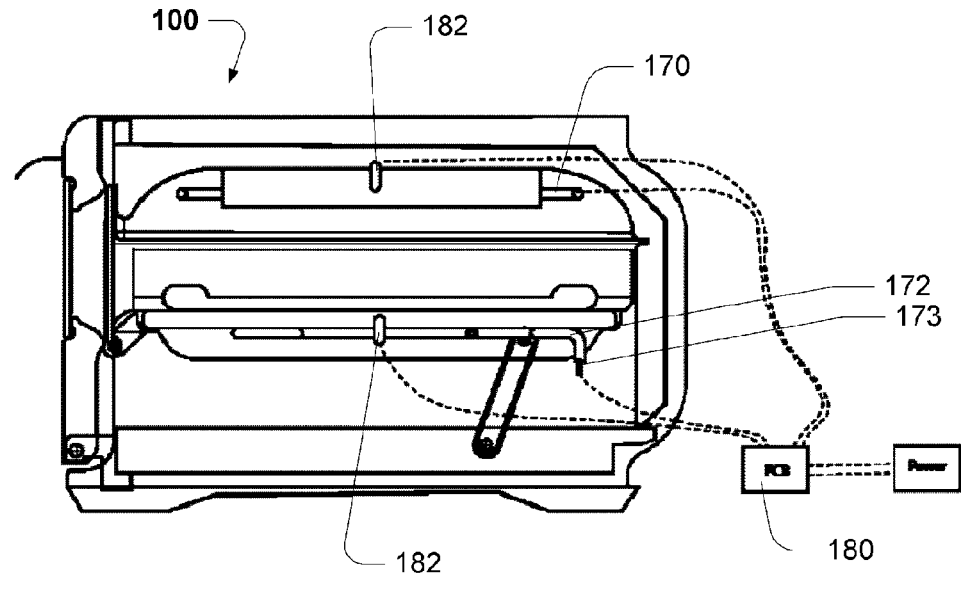
FIG. 4 is a sectional side view of the pizza oven of FIG.1, shown connected to a processor module and temperature sensors.

An electrical heating element 170 is located about the top of the cavity. Operation of the cavity heating element is controlled by a processor 180 module that receives a temperature signal from a temperature sensor element 182 (as shown in FIG. 4).

The pizza deck is heated by a second electrical heating element 172. Operation of the second heating element is controlled by a processor module that receives a temperature signal from a temperature sensor element.

Figure 2:
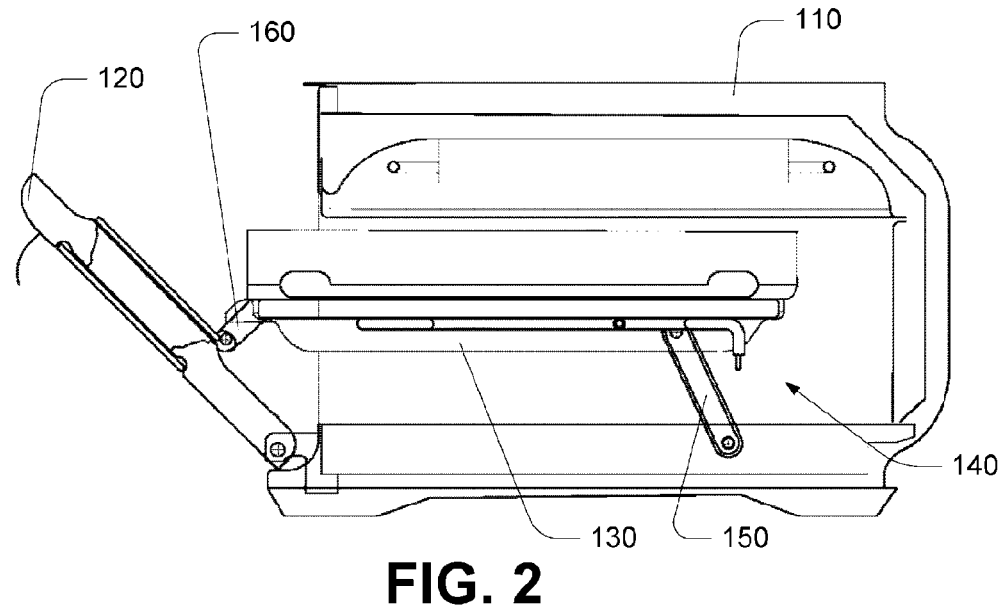
FIG. 2 is a sectional side view of the pizza oven of FIG.1, shown with the door in a part opened configuration.
Figure 3:
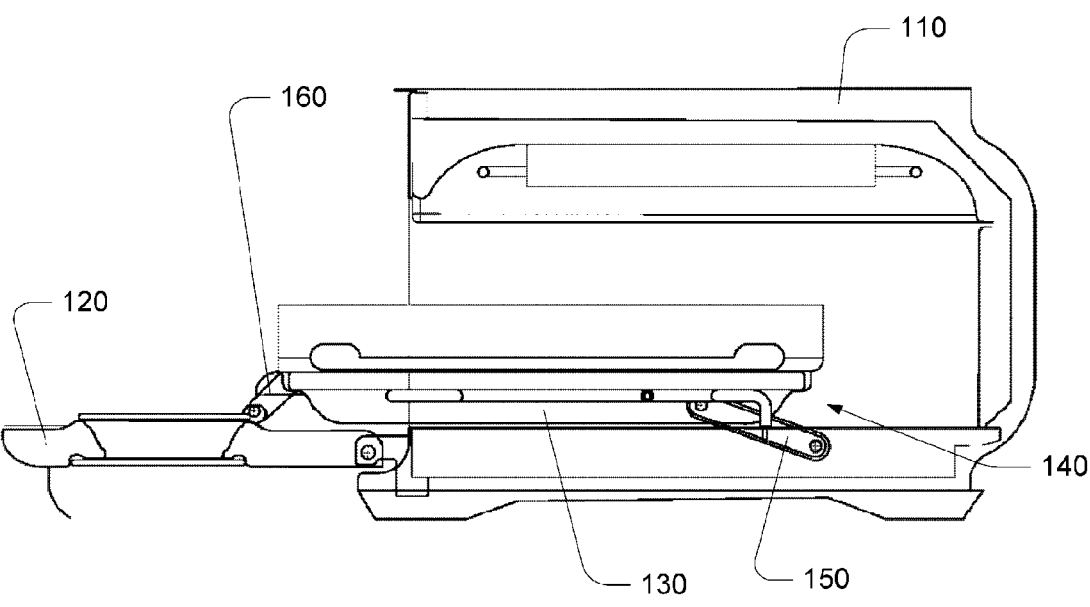
FIG. 3 is a sectional side view of the pizza oven of FIG.1, shown with the door in an open configuration.

Referring to FIG. 1 through FIG. 3, the deck support mechanism (or assembly) has a hinge linking it to the front door and pivoting rear supports that are linked to the lower chassis. When the door is opened, the deck moves with the door, traveling out of the cooking cavity and lowering as the door rotates on its lower hinges. The rear support arm rotates with the movement of the deck and substantially keeps the deck horizontal. Lowering the deck means the pizza can be loaded and removed easily, the deck can be cleaned easily. Raising the deck means that the pizza can be cooked at the optimum distance from the upper heater element or elements.

The oven door has at least a bottom pivoting hinge and is attached to the front bottom hinge of the pizza oven. The deck support mechanism and door are adapted to enable the deck to maintain a substantially horizontal configuration during opening and closing the door.

A close mechanism may be included that acts to assist closing of the door (not shown). The close mechanism may include an arm, which is pivotally attached to the door at one end and extend into the side wall of the oven, and the other end of the arm is biased by a spring located within the oven sidewall toward a closed door configuration.

Figure 5:
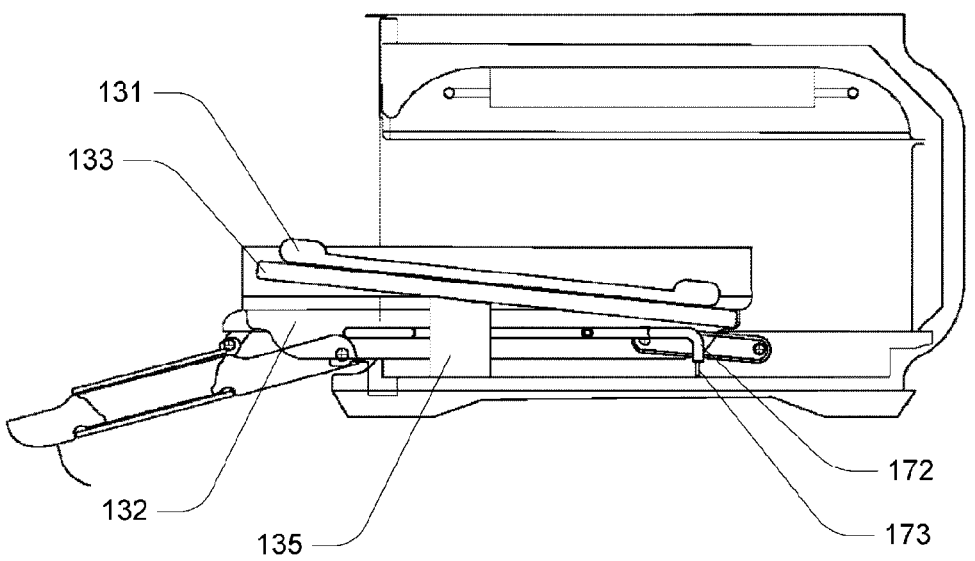
FIG. 5 is a sectional side view of the pizza oven of FIG.1, shown with the door in an extended-opened configuration.

FIG. 5 shows the pizza deck may include a deck carriage 132 that houses a heating element 172 and supports a cooking base 133. In this embodiment, the cooking base is a ceramic cooking base. It will be appreciated that a cooking base may be may be made of one or more appropriate materials. The heating element has connectors 173 that protrude through the back of the deck carriage for connection to power source under control of a processor module. The temperature sensor 182 can be located about the underside of the ceramic cooking base.

FIG. 5 shows that the door can be hyper-extend past the horizontal, wherein an abutment surface 135 passes through an aperture in the carriage 132 and engages an underside of the ceramic cooking base 133, which cause the ceramic cooking base 133 to rise with respect to carriage to provide improved access for removal.

FIG. 6A through FIG. 6D show sectional side views of an embodiment pizza oven 200, wherein the door is in a variety of configurations.

In this embodiment, the pizza deck support mechanism 240 includes one or more rear support arm 250 and a front support bracket 260; the support arm is pivotally coupled (at 251) with respect to the floor or cavity and pivotally supports (at 252) a rear portion of the pizza deck 230; the support bracket is hingedly coupled (at 261) to the door, such that opening and closing the door respectively withdraws and inserts the pizza deck. The door 220 is hinged (at 221) with respect to the cavity.

Figure 6A:
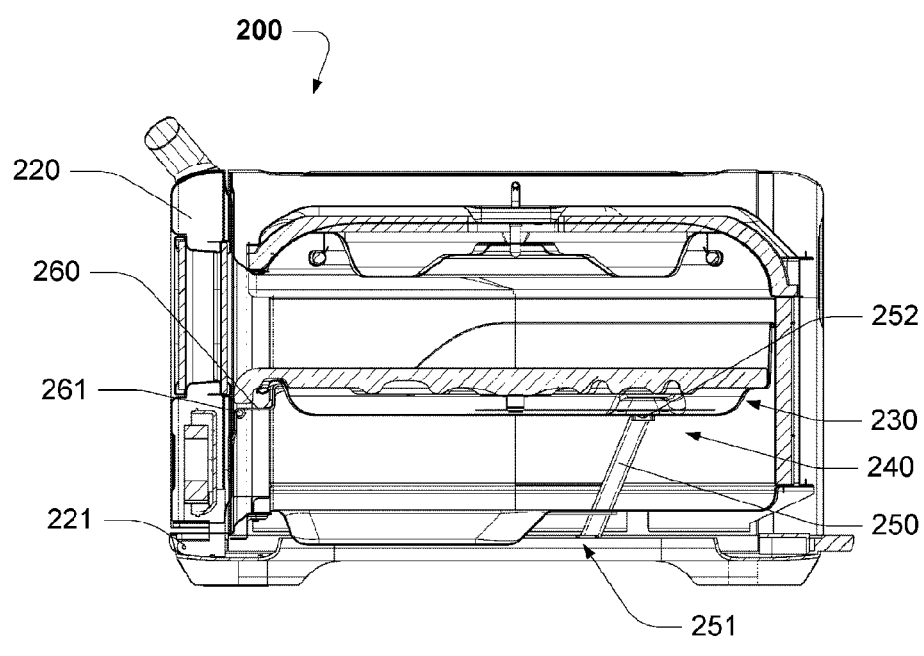
FIG. 6A is a sectional side view of an embodiment pizza oven, shown with the door in a closed configuration.
Figure 6B:
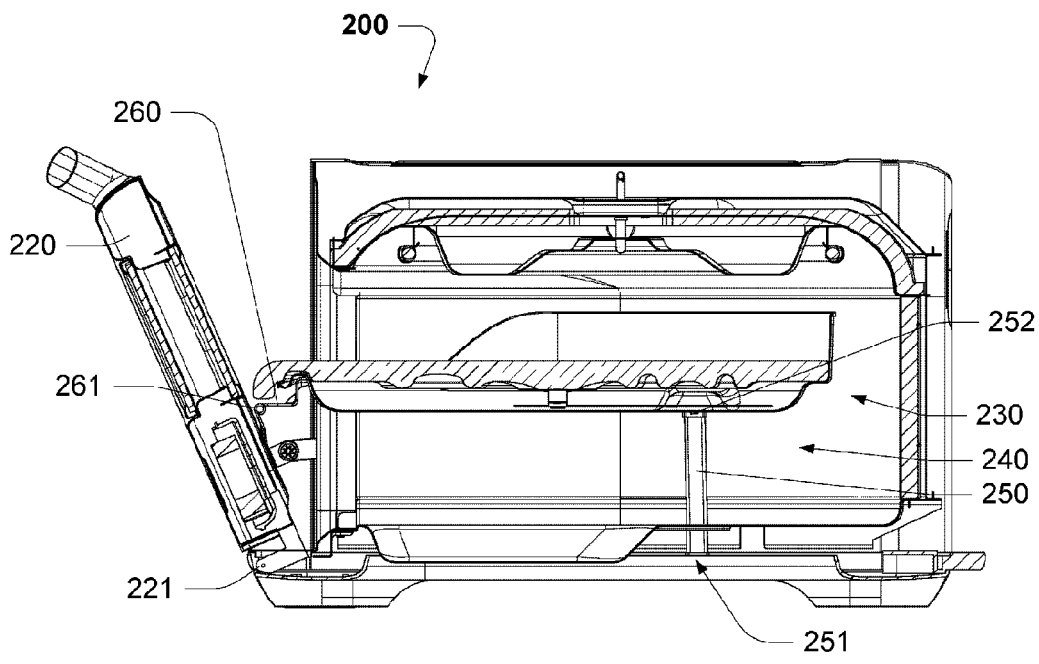
FIG. 6B is a sectional side view of the pizza oven of FIG.6A, shown with the door in a part opened configuration.
Figure 6C:
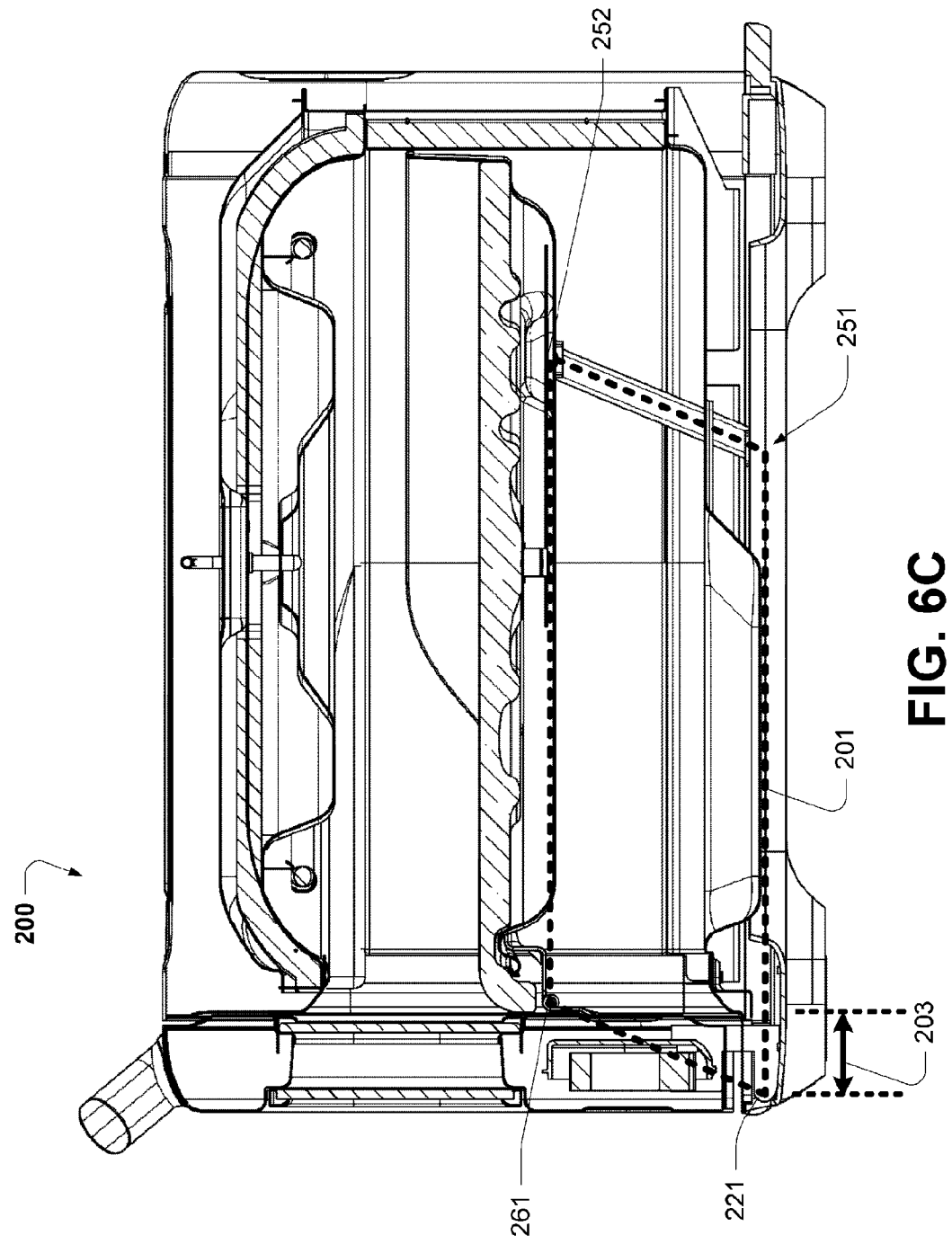
FIG. 6C is a sectional side view of the pizza oven of FIG.6A, showing the pivot locations of a pizza deck support mechanism.

It will be appreciated that, to maintain the deck in a substantially horizontal configuration as the door is opened or closed, each pivot point must form a corner of a parallelogram (e.g. see 201 in FIG. 6C).

Figure 6D:
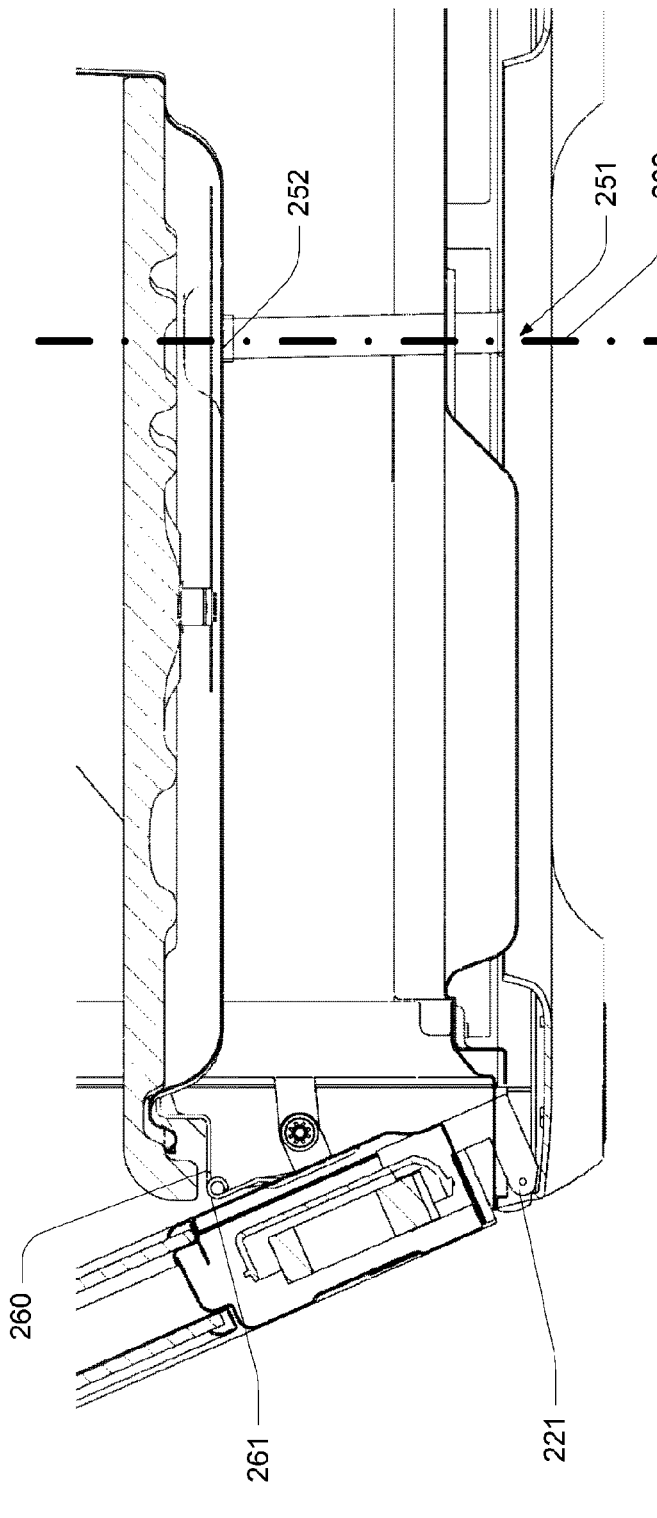
FIG. 6D is an enlarges part sectional side view of the pizza oven of FIG.6A, showing the pizza deck support mechanism.

FIG. 6B and FIG. 6D show the embodiment pizza oven 200, with the door in a part or mostly closed configuration. In this configuration, the rear support arm is vertical (e.g. see 202 in FIG. 6D), and further closing of the door will cause the arm to lean toward the rear of the cooking cavity, thereby creating a moment about the pivot point (at 251) that will further assist closure of the door.

It will be appreciated that, by locating the door hinge (at 221) and forward bracket hinge (at 261) such that they are offset (203) when the door is in the closed position, the parallelogram arrangement 201 can be maintained while allowing the rear pivot arm 250 moving past the vertical. While this will cause a slight lowering the deck when the door moves to a fully closed configuration, there is assistance to close the door through the moment applied to the arm by the deck.

In this embodiment, the oven door has a thickness, which enables the pivot hinge to be located at the bottom of the oven door and about the front wall of the door. By way of example only, an L shaped hinge 222 is used. The forward hinge 260 is connected between the pizza deck and door, such that the pivot (at 261) is behind that of the door hinge pivot (at 221).

It will be appreciated that, this feature causes the raising of the deck as the door is initially opened, which causes the pizza to be brought into closer proximity of the upper heat element. This process in the cooking of a pizza enables the user to give the pizza ingredients a final more intense exposure to heat.

Figure 7A:
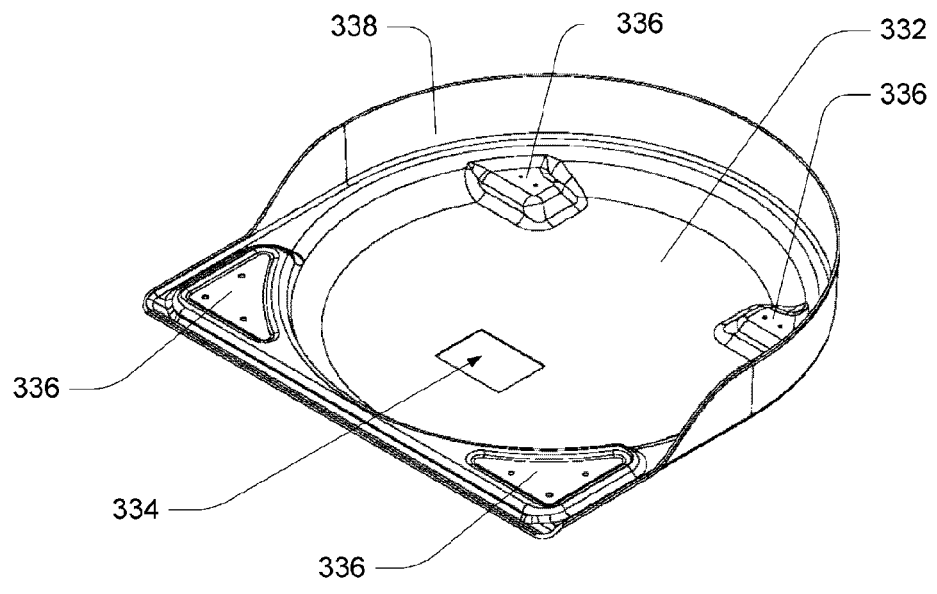
FIG. 7A is a perspective view of a pizza deck carriage element.
Figure 7B:
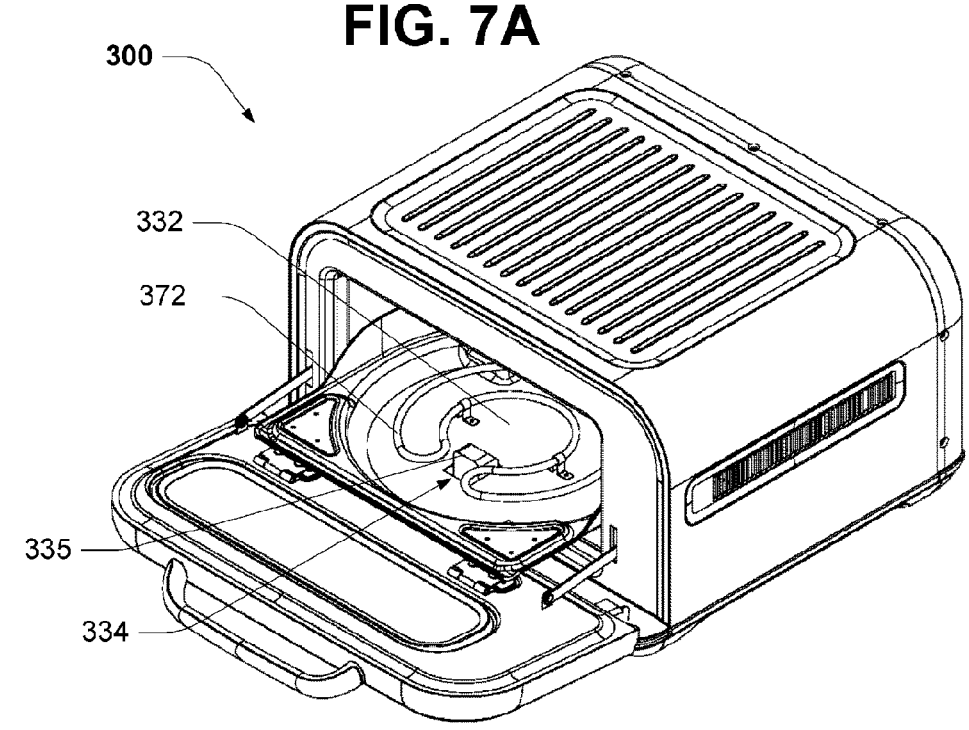
FIG. 7B is a perspective view of an embodiment pizza oven, shown with the pizza deck carriage element of FIG. 7A.
Figure 7C:
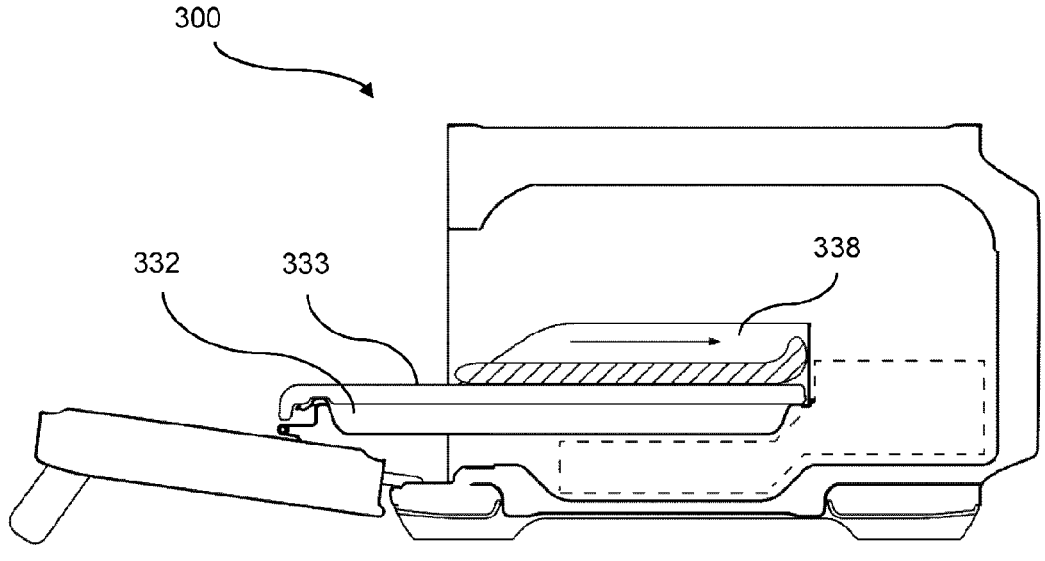
FIG. 7C is a sectional side view of the pizza oven of FIG. 7B, showing a cooking base and a rear shield of the carriage element of FIG. 7A.
Figure 7D:
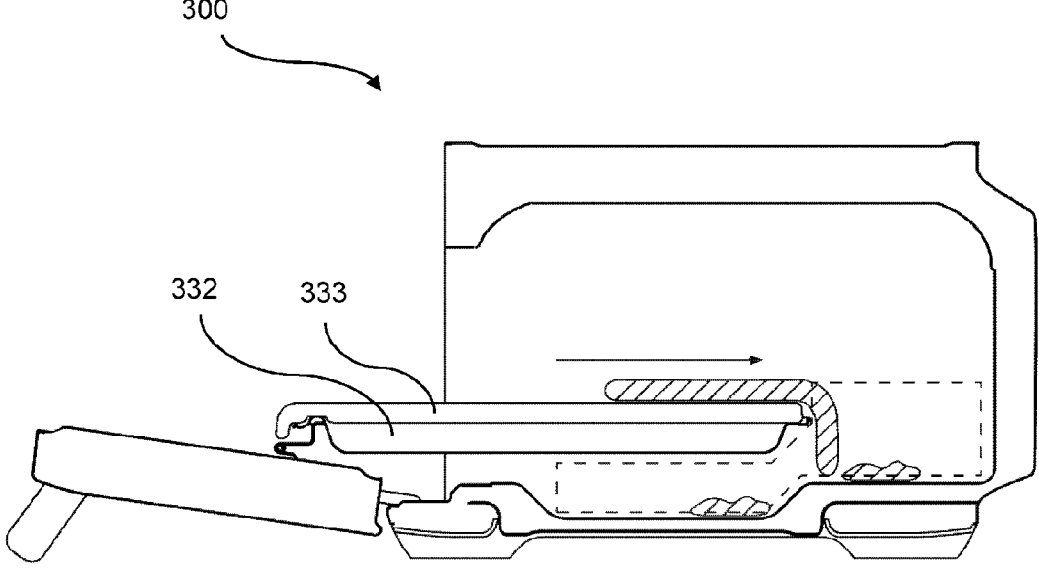
FIG. 7D is a sectional side view of the pizza oven of FIG. 7C, showing the effect of the removal of the rear shield.

FIGS. 7A-7J show an embodiment pizza oven 300 having a pizza deck comprising a carriage element 332 that supports a lower electrical heating element 372 and a cooking base 333 (shown in FIG. 7D).

The carriage element 332 defines an aperture 334, which enables an abutment surface 335 to pass through an aperture and engage an underside of the cooking base 333, when the door is hyper-extended past the horizontal. This causes the cooking base 333 to rise with respect to carriage and provide improved access for removal.

In this embodiment, the carriage element 332 has a plurality of support surfaces 336 to support the cooking base 333. A rear shield 338 is provided, which may conform to the rear portion of the D-shaped cavity. As shown in FIGS. 7C and 7D, the rear shield 338 reduces the likelihood of the pizza positioned on the cooking base 333 from sliding off onto the floor of the pizza oven 300 as the door is opened.

Figure 7E:
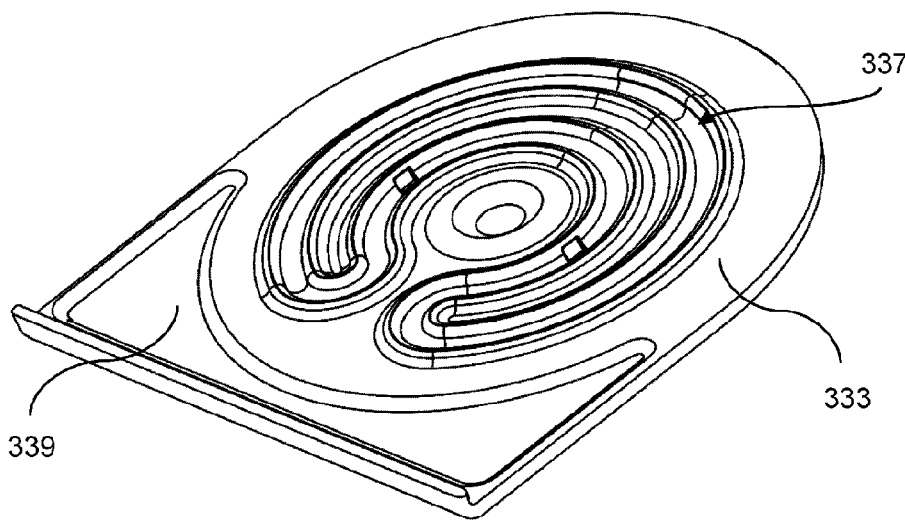
FIG. 7E is a schematic perspective view of the underside of the cooking base of FIG. 7C.
Figure 7F:
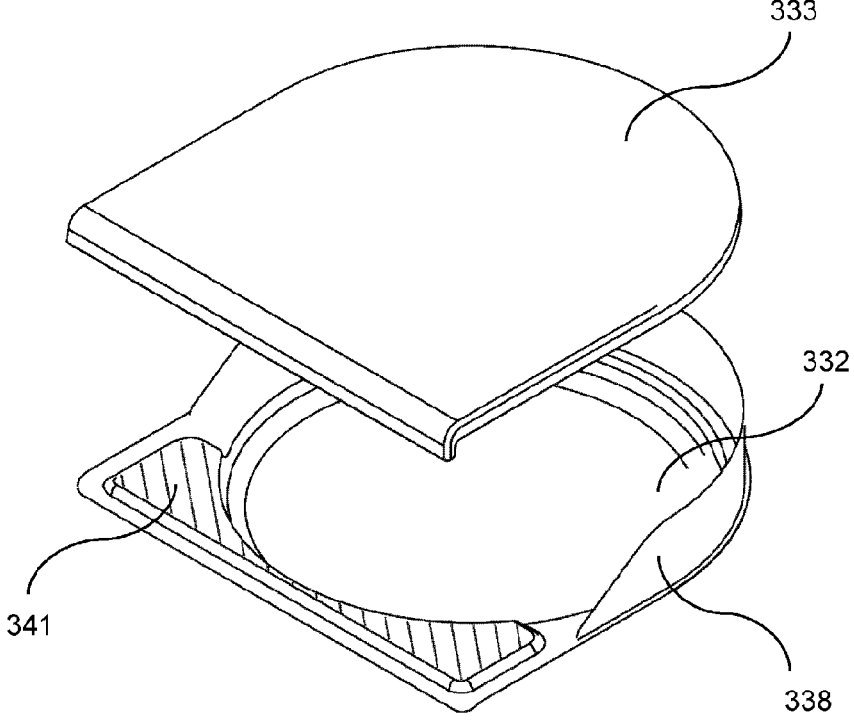
FIG. 7F is a schematic parts exploded isometric view of the cooking base and the carriage element of FIG. 7C.
Figures 7G, 7H:
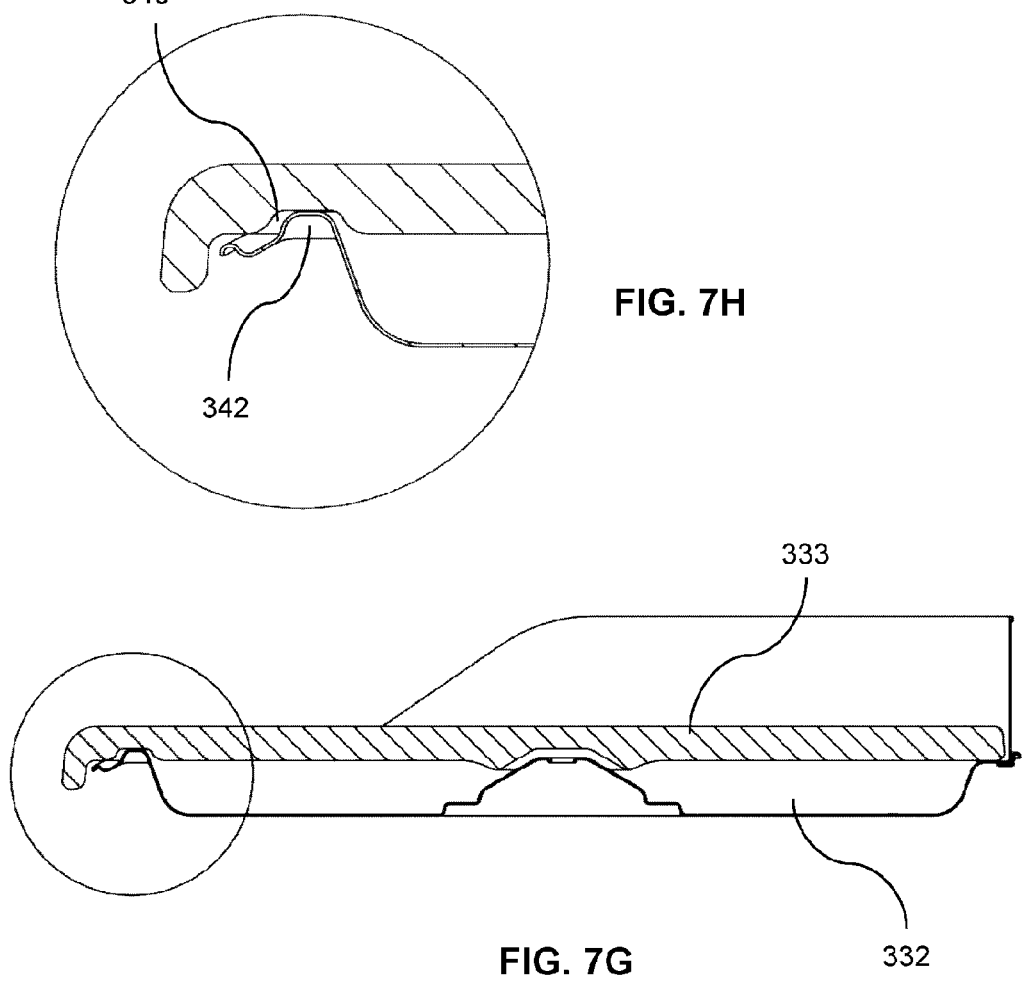
FIG. 7G is a sectional side view of the cooking base and the carriage element of FIG. 7C.
FIG. 7H is a detail view of locking detail between the cooking base and the carriage element of FIG. 7G.

As shown in FIG. 7E, the cooking base 333 may be provided with a complementary profile 337 for mating with the lower electrical heating element 372 so that the heating element 372 can be substantially embedded into the cooking base 333. This in turn increases the heat transfer (compared to the arrangement in which the element is not embedded) due to increased surface of the cooking base 333 that surrounds the heating element 372 (shown in FIG. 7I). As shown FIGS. 7E-7H, the cooking base 333 and the carriage element 332 may have complementary locating detail in the form of recessed portions 339, 340 and raised platforms 341, 342 to removably secure the cooking base 333 to the carriage element 332 when in use.

Figures 7I, 7J:
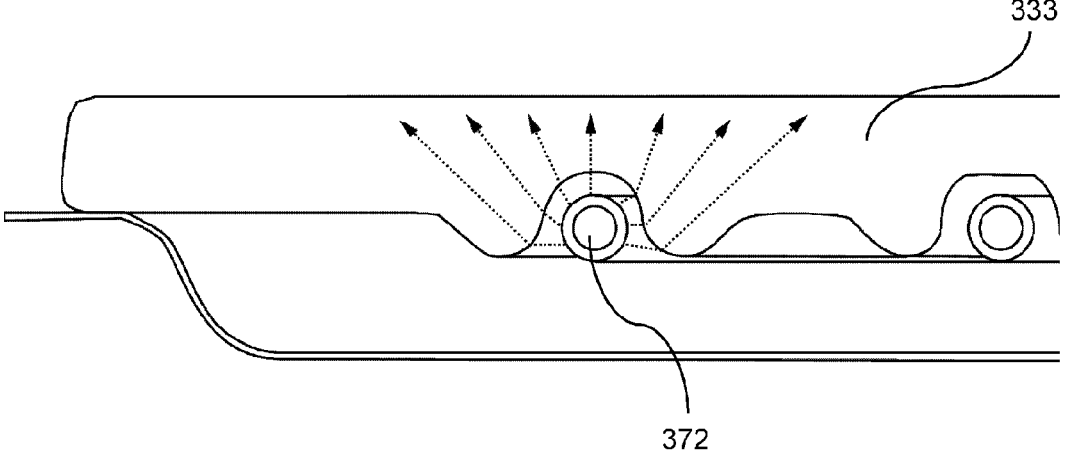
FIG. 7I is a sectional side view of the cooking base and the carriage element of FIG. 7C, showing the heating element embedded within the cooking base.
FIG. 7J is a sectional side view of the cooking base and the carriage element of FIG. 7C, showing a temperature sensor embedded within the cooking base.

As shown in FIG. 7J, a temperature sensor 383 may be embedded in the cooking base 333 to provide feedback to the processor module in order to cause the power which is applied to the heating element 372 to be controlled and eventually decreased/increased upon the desired temperature being reached.

Figure 8A:
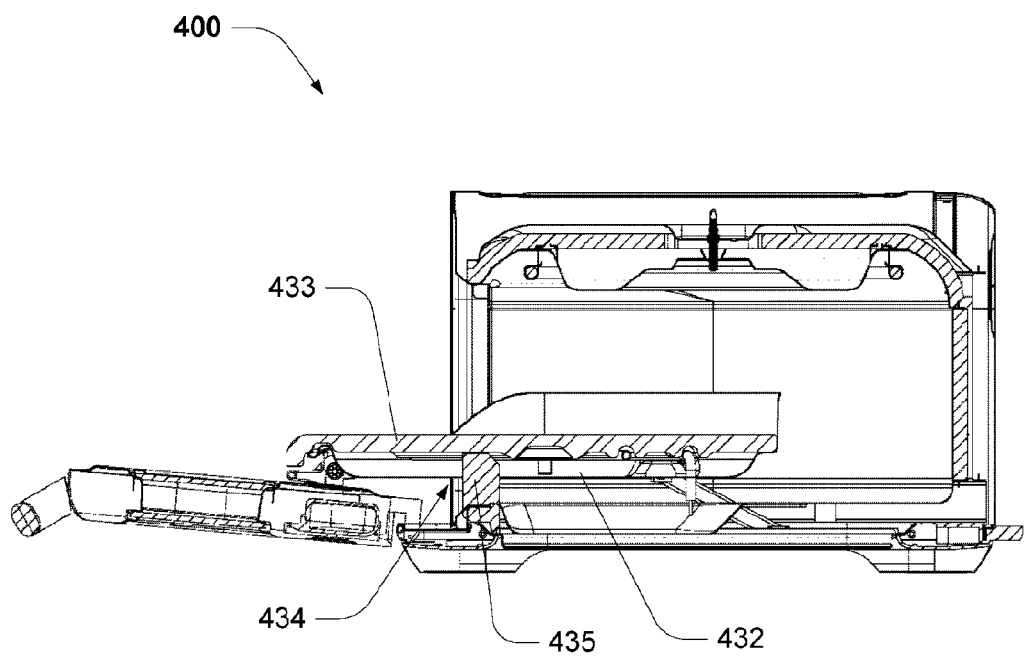
FIG. 8A is a sectional side view of an embodiment pizza oven, shown with the door in an open configuration.
Figure 8B:
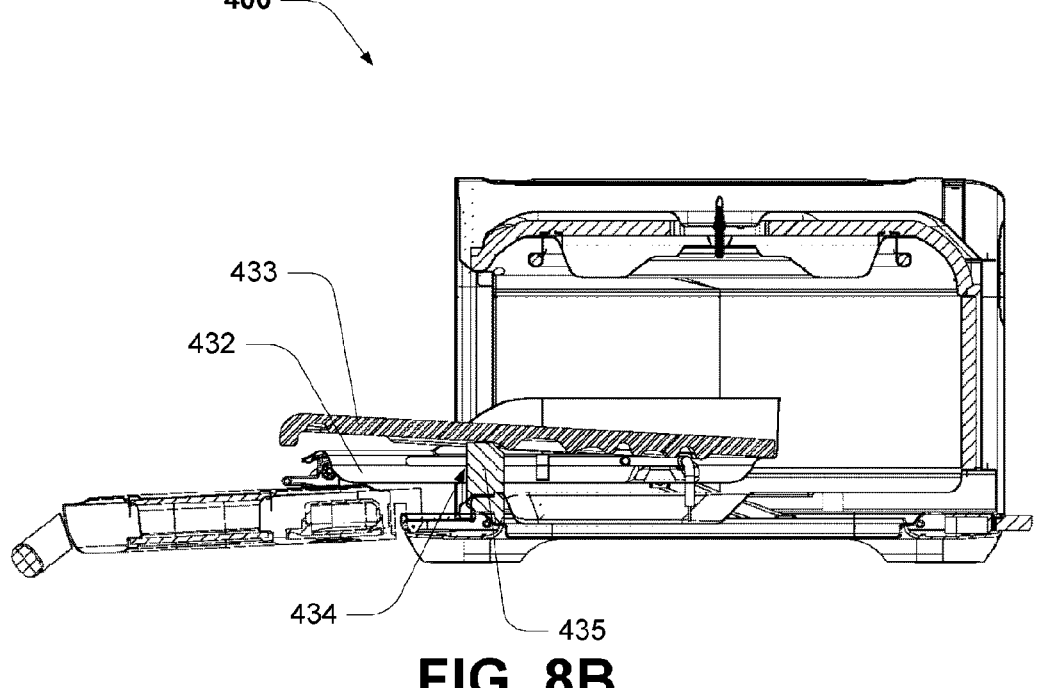
FIG. 8B is a sectional side view of the pizza oven of FIG.8A, shown with the door in an extended-opened configuration.

By way of example only, FIG. 8A and FIG. 8B shows an embodiment pizza oven 400 having an abutment device 435 supported by the floor of cavity, as discussed above.

It will be appreciated that a carriage element 432 defines an aperture 434, which enables an abutment surface 435 to pass through an aperture and engage an underside of the cooking base 433, when the door is hyper-extended past the horizontal (as shown in FIG. 8B). This causes the cooking base 433 to rise with respect to carriage 432 and provide improved access for removal.

Figure 9A:
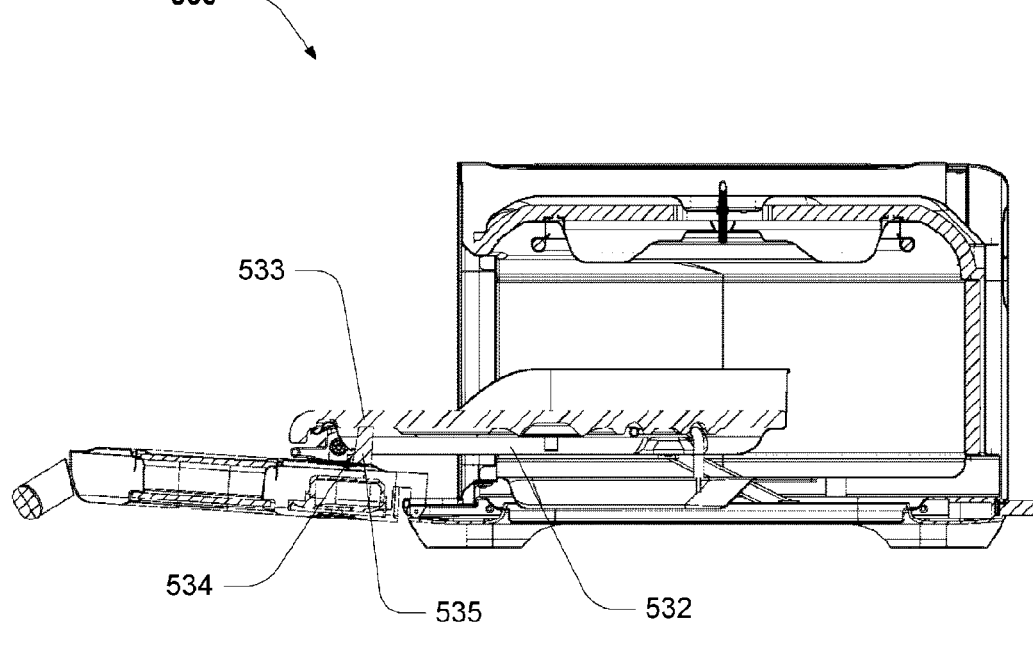
FIG. 9A is a sectional side view of an embodiment pizza oven, shown with the door in an open configuration.
Figure 9B:
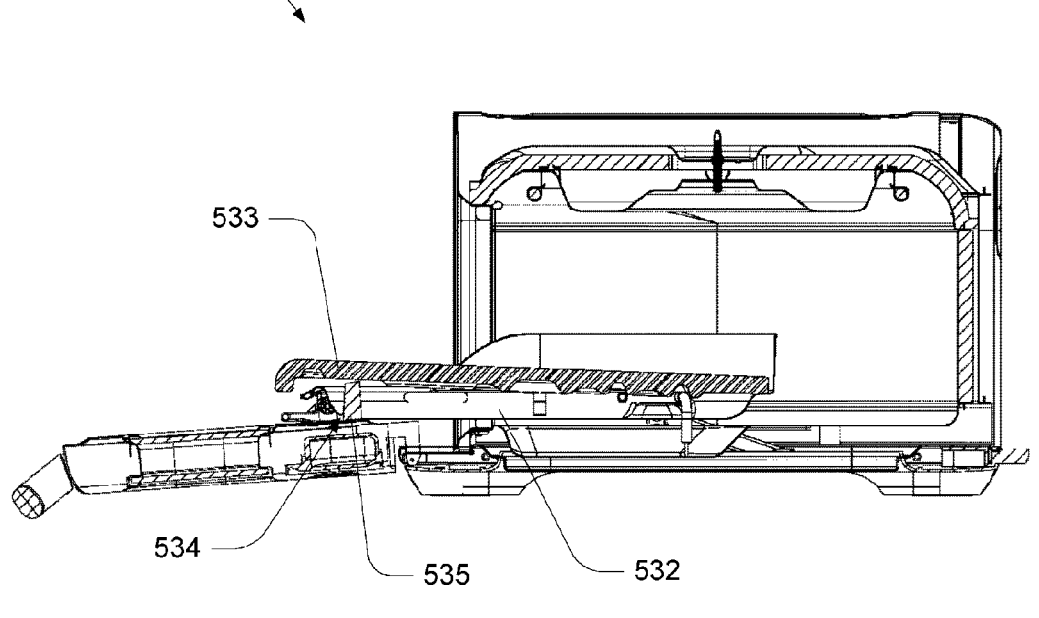
FIG. 9B is a sectional side view of the pizza oven of FIG.9A, shown with the door in an extended-opened configuration.

By way of example only, FIG. 9A and FIG. 9B shows an alternative embodiment pizza oven 500 having an abutment device 535 supported by the door.

It will be appreciated that a carriage element 532 defines an aperture 534, which enables an abutment surface 535 to pass through an aperture and engage an underside of the cooking base 533, when the door is hyper-extended past the horizontal (as shown in FIG. 9B). This causes the cooking base 533 to rise with respect to carriage 532 and provide improved access for removal.

Figures 10A, 10B, 10C:
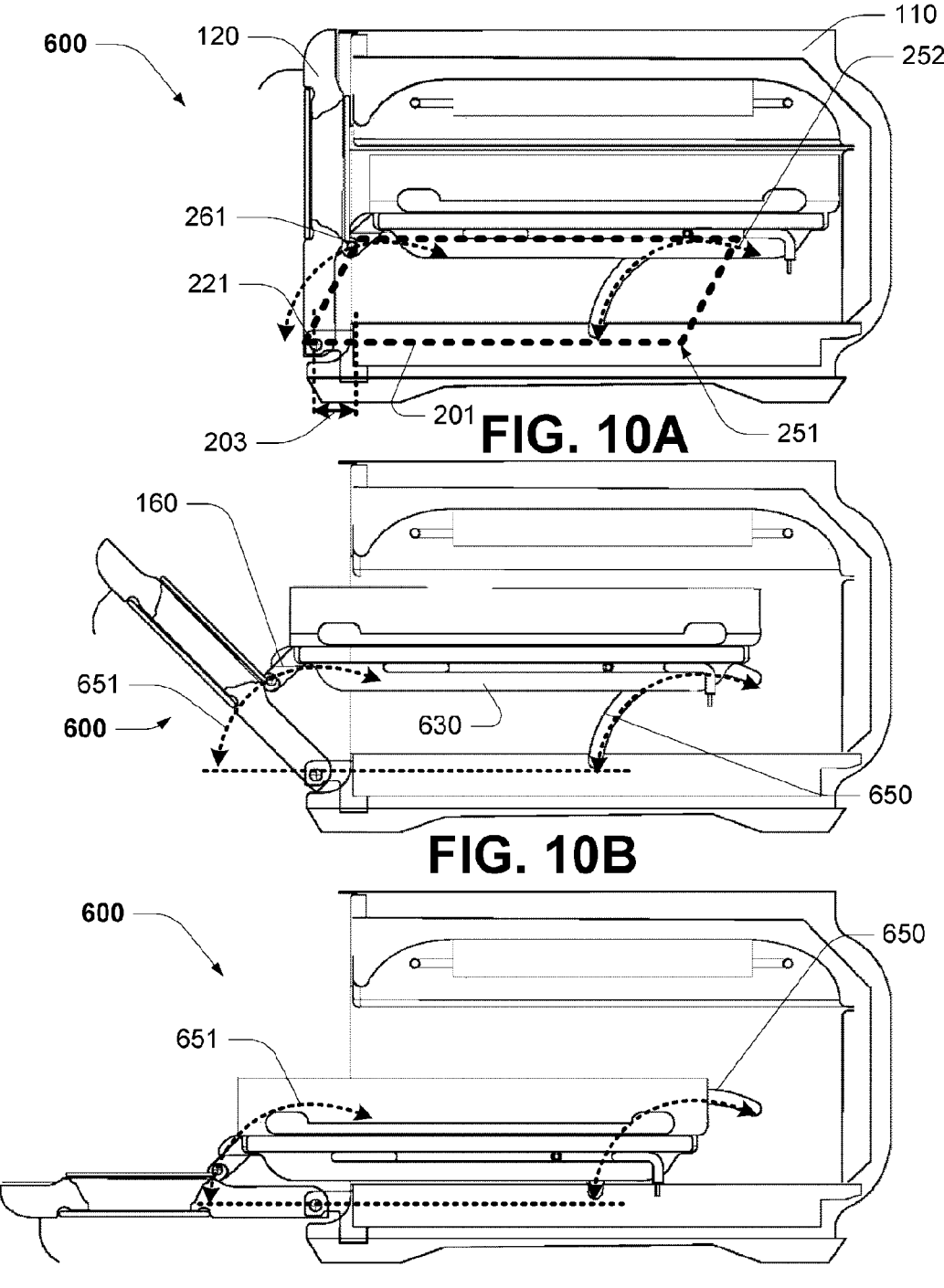
FIG. 10A is a sectional side view of an embodiment pizza oven, shown with the door in a closed configuration.
FIG. 10B is a sectional side view of the pizza oven of FIG.10A, shown with the door in a part-opened configuration.
FIG. 10C is a sectional side view of the pizza oven of FIG.10A, shown with the door in an opened configuration.

FIG. 10A through FIG. 10C shows an embodiment 600 using an alternative deck support mechanism, wherein the pizza deck carriage 630 is supported in an arcuate guide 650 located about the cooking cavity sidewall without use of the one or more rear support arm (e.g. 150). By way of example the arcuate guide 650 may be a guide or slot that cooperates with the deck.

It will be appreciated that, to maintain the deck in a substantially horizontal configuration as the door is opened or closed, each pivot point must form a corner of a parallelogram (e.g. see 201 in FIG. 6C). Corners (251,252,221, 261) of the parallelogram are described with reference to FIG. 6C.

In this embodiment, with the door closed, there is horizontal displacement (203) between location the door hinge (at 221) and the location that the deck support bracket is hingedly coupled (at 261) to the door. This causes the location deck support bracket hinged coupling (at 261) to initially rise then fall in an arcuate path 651 as the door is opened. Accordingly, the arcuate guide 650 conforms in shape to the arcuate path 651 travelled by the support bracket hinged coupling.

Figure 11A:
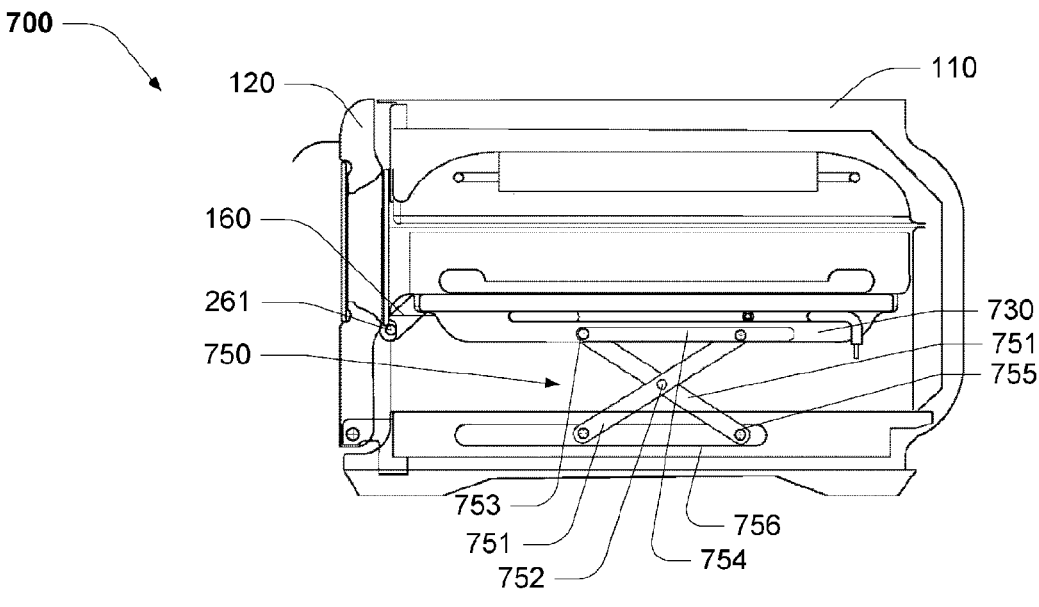
FIG. 11A is a sectional side view of an embodiment pizza oven, shown with the door in a closed configuration.
Figure 11B:
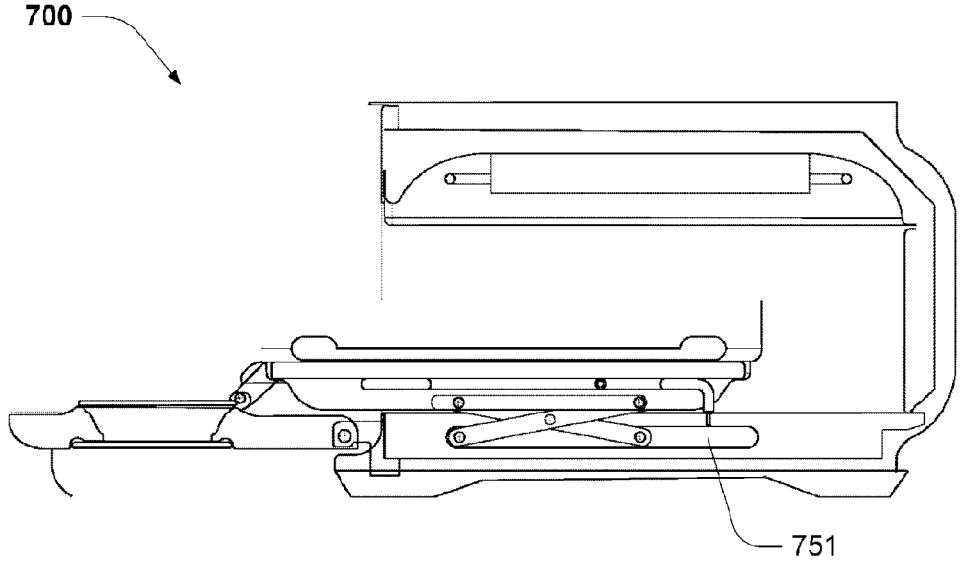
FIG. 11B is a sectional side view of the pizza oven of FIG.11A, shown with the door in an opened configuration.

FIG. 11A and FIG. 11B shows an embodiment 700 using an alternative deck support mechanism, wherein the pizza deck carriage 730 is supported by a movable scissor lift arrangement 750 that is coupled to the door 120. By way of example, the scissor lift arrangement 750 is in the form of a two arms 751 that are pivotally coupled together (at 752) along their length, with the upper ends 753 slidably mounted to the pizza deck by a guide or rail 754, and the lower ends

755 slidably mounted with respect to the cavity by a guide or rail 756. The arrangement causes the pizza deck carriage 730 to remain horizontal as it is raised (as shown in FIG. 11A) or lowered (as show in FIG. 11B).

In this embodiment, the deck is hinged attached (at 261) to the door 120. With the door closed, the support bracket 160 holds the arm in the raised configuration as shown in FIG. 11A. As the door is opened, the support bracket 160 lowers, allowing the pizza deck carriage 730 to respectively lower. The rails and guides (754,756) enable the door to draw out the pizza deck carriage to an open configuration as shown in FIG. 11B.

An alternative to the deck support mechanism (e.g. 140), a pizza deck carriage may be supported by telescopic support elements, which are controlled by a micro controller (not shown). These telescopic support elements may be further attached a mechanism which tilts them under control of a processor module. Upon opening the pizza door, a switch is activated and the telescopic supports are, in a controlled matter, extended and tilted towards the door, bringing the deck towards and past the opening of the pizza oven.

Figure 12:
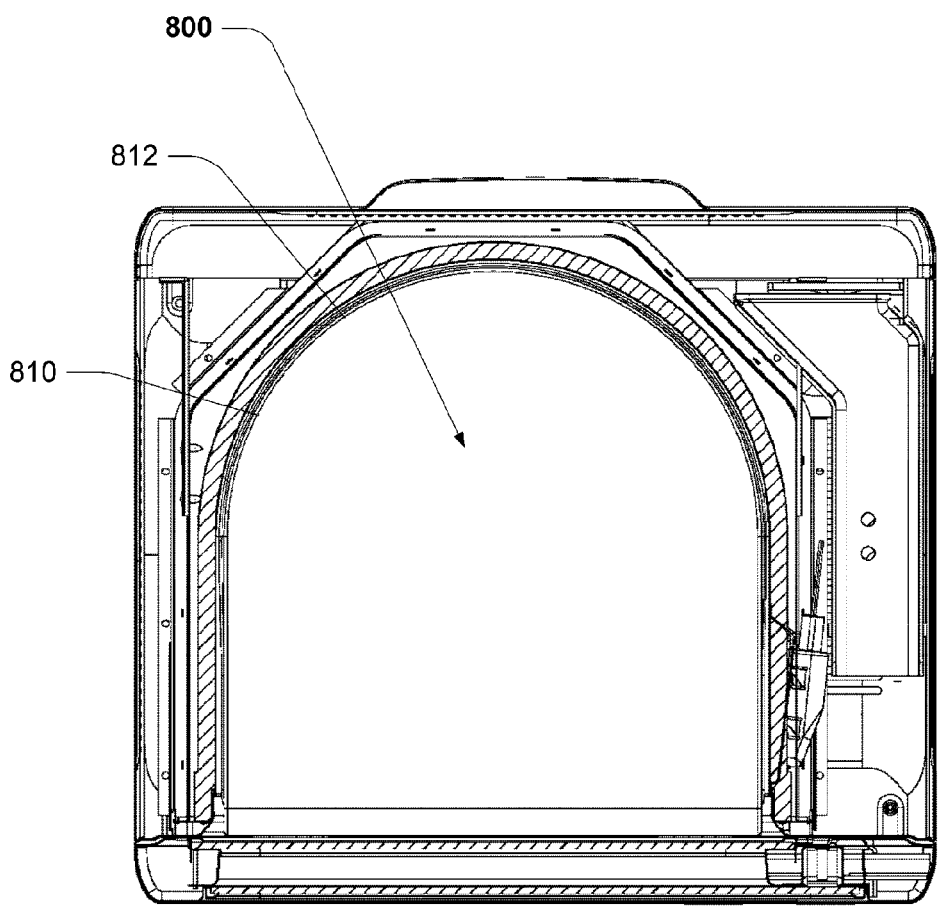
FIG. 12 is a sectional plan view of an embodiment pizza oven, showing a configuration of the cooking cavity.

FIG.12 shows a sectional top view of the cooking cavity 800 that can be used in any embodiment pizza oven, and defines a D-Shaped configuration. As the rear portion 810 of the oven cavity is rounded, the floor surface is restricted and provides a 180 degree wall structure 812 that can reflect radiant heat onto the pizza, which enhances crust browning. It will also be appreciated that the pizza deck can substantially conform to the configuration of the oven cavity, for example, being D-shaped.

In an example embodiment, the rear portion of the D-shaped cavity has a reflective wall that conforms to the pizza deck (and half way around the sides of the deck).

Improvements are made to the cooking of pizza crust or 'cornicione' evenly in an asymmetric cooking chamber, while protecting delicate ingredients in the centre of the pizza.

The pizza crust (or outer circumference of the pizza) should be exposed to an intense heat source so as to cause blistering and intense darkening during the cooking process. However, doing so causes the inner portion of the pizza to be overcooked. For example, delicate ingredients such as cheese or basil can quickly overcook and become spoilt if not protected.

It was identified that the problem may be alleviated in any one or more of the following three means:
a) using a shield (e.g. cylindrical, frustoconical, domed, or rounded) located at the top of the cooking cavity (or chamber), such that the upper heating element substantially surrounds the shield. The shield is located to deflect radiant heat away from the pizza centre, and preferably toward the outer circumference of the pizza;
b) configuring the upper heating element (or elements) to provide different heating power across the pizza deck, wherein more heat is provided to the front of the cooking chamber (the cooler region) and less heat is provided to the back of the cooking chamber.
c) providing a D-shaped cooking chamber, wherein a circular pizza is located about the rear of the oven and substantially wrapped around through 180° by reflective sidewalls for increasing the radiant heat.

Figure 13:
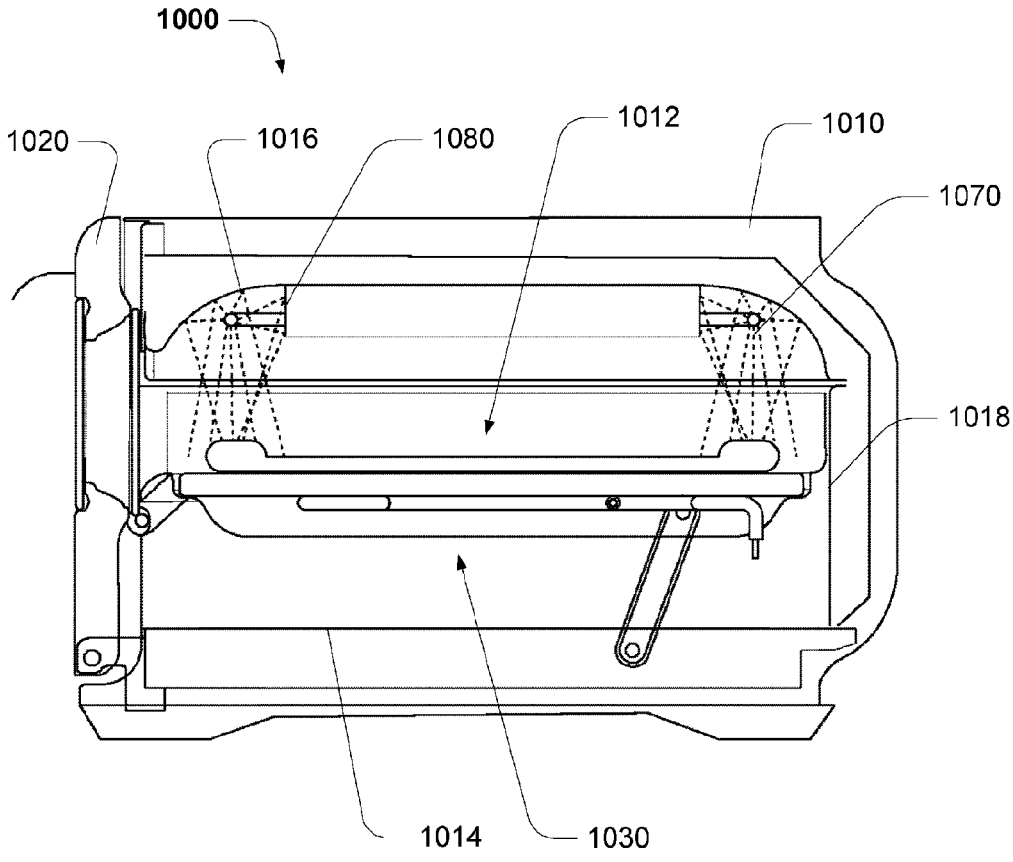
FIG. 13 is a sectional side view of an embodiment pizza oven, shown with a heating profile provided across the pizza deck.

FIG. 13 shows a sectional side view of an embodiment pizza oven 1000, that provides a heating profile across a pizza deck 1030. The pizza deck may be movable (i.e. slidable and/or raisable) or fixed. The pizza deck may be supported by a support mechanism as disclosed herein.

This embodiment pizza oven apparatus 1000 includes:

an oven body 1010 that defines a cooking cavity 1012; the cooking cavity having a floor 1014 and a ceiling 1016 with intermediate wall 1018 that has a front opening;

a door 1020 that selectively closes the opening of the cavity;

a pizza deck 1030 within the cavity for receiving a pizza for cooking;

at least one heating element 1070 located about the ceiling of the cooking cavity.

The cooking cavity can be formed of a heat reflective material (e.g. stainless steel), including any one or more of the floor 1014, the ceiling 1016 and intermediate wall 1018.

The least one heating element 1070 preferably defines a substantially circumferential heat source, wherein a variable heating or cooking profile is provided across the pizza deck.

A circumferential shield element 1080 is located within the area defined by the circumferential heating element or elements. The shield may be integral with, or coupled to, the shield element. The shield defines an annular channel-like region 1085 that encompasses the heating element.

The shield reduces radiant heat from the heating element reaching the centre portion of the pizza deck (and pizza), thereby providing a heating or cooking profile across the pizza that has greater radiant heat applied to the crust and less radiant heat applied to the centre.

In this embodiment the reflector shield directs heat energy from the heating element onto the pizza, such that a more intense heat is focused on the crust, while a less intense heat is applied to the rest of the pizza.

It will be appreciated that the reflector shield can be a simple strip of metal disposed about the inner periphery of the heating element, such that some heat energy can be blocked from the middle of the pizza. The shield height can determine an amount of heat radiated to the centre of the pizza. The shield can be a separate part mounted to the ceiling such as a ring of sheet metal or could be formed as part of the ceiling. This shield can be used effectively in symmetric or asymmetric oven cavities.

Figure 14A:
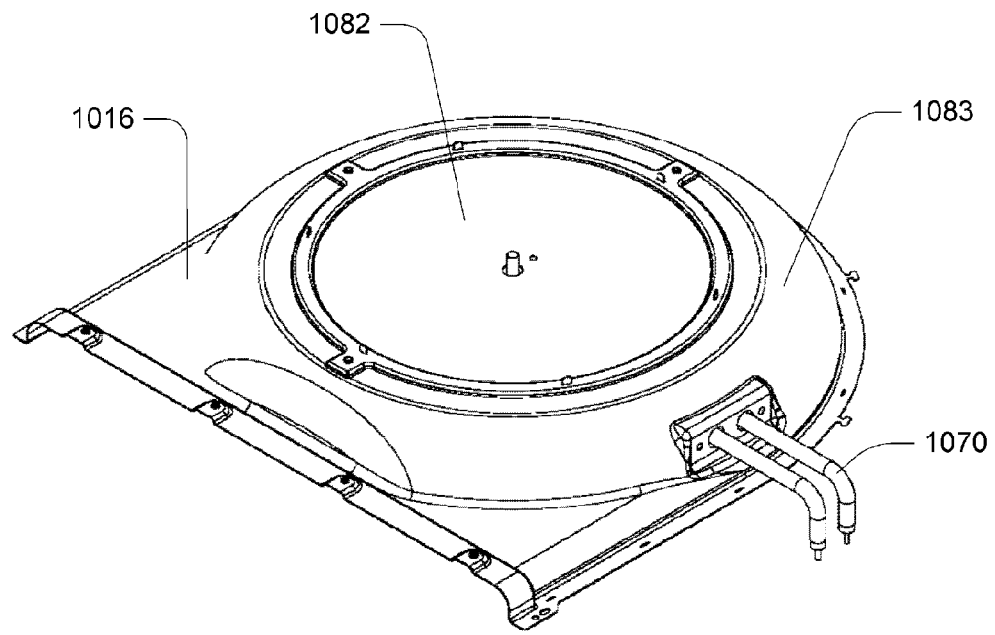
FIG. 14A is a perspective view of a ceiling element for a cooking cavity of the embodiment pizza oven of FIG. 13.
Figure 14B:
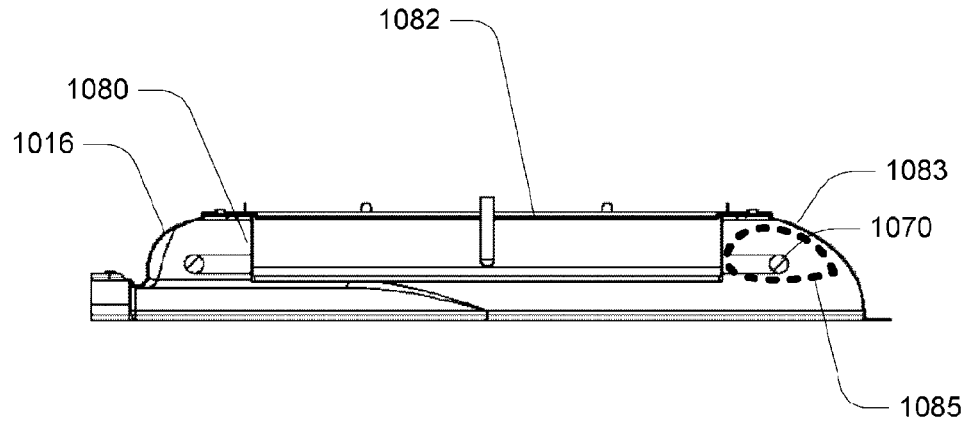
FIG. 14B is a sectional side view of a ceiling element of FIG. 14A.
Figure 14C:
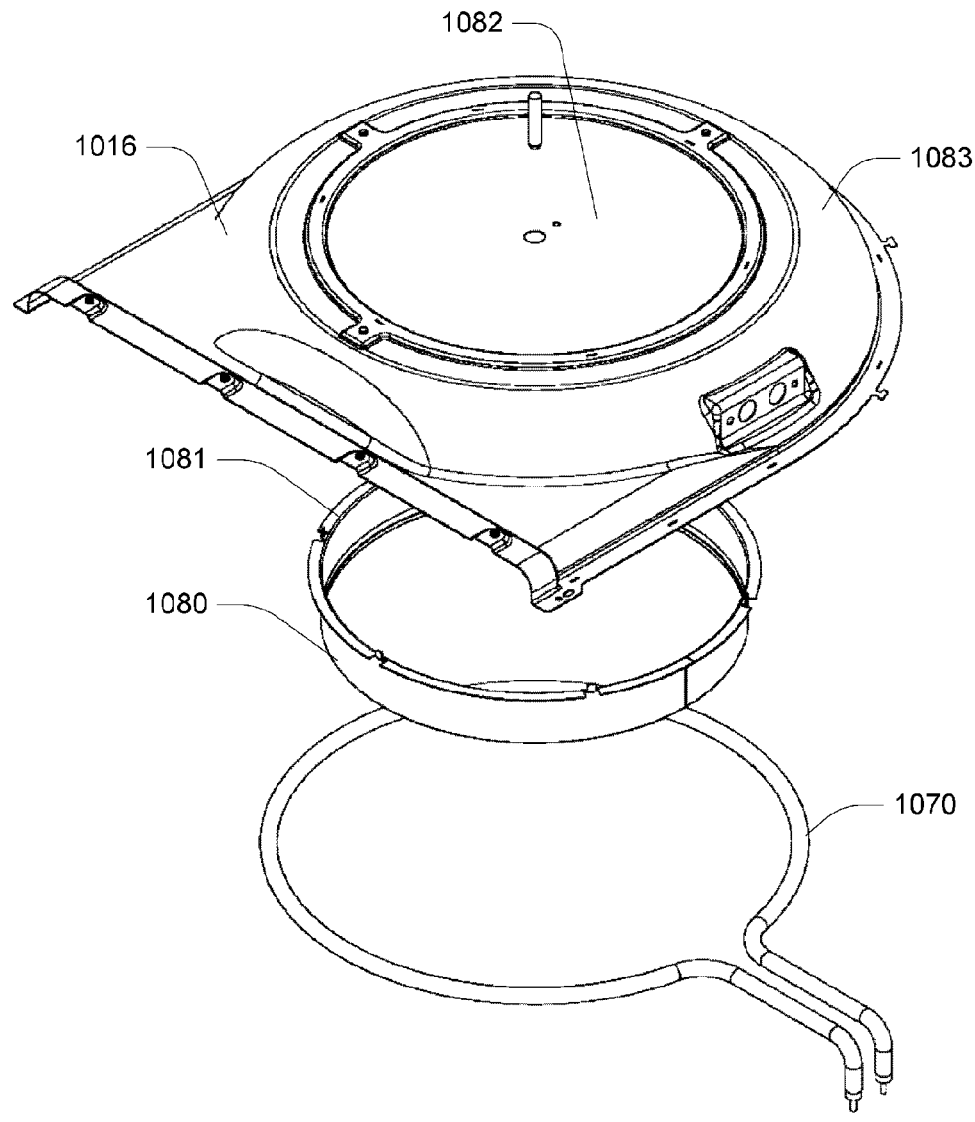
FIG. 14C is an inline for assembly view of a ceiling element of FIG. 14A.

FIG. 14A through FIG. 14C shows an embodiment ceiling element 1082 for a cooking cavity of a pizza oven. The ceiling element 1082 has a curved outer perimeter (at 1083) to define a domed area for receiving the at least one heating element 1070 and the circumferential shield element 1080.

In this embodiment, the shield element 1080 is coupled (e.g. at 1081 via a fastener or means) to the celling element 1082 for defining a cylindrical (or frusto-conical) shield, which defined an annular channel-like region 1085 that encompasses the heating element. The heating element can be supported by the ceiling element, and pass through the ceiling element to enable power connection.

Figure 15:
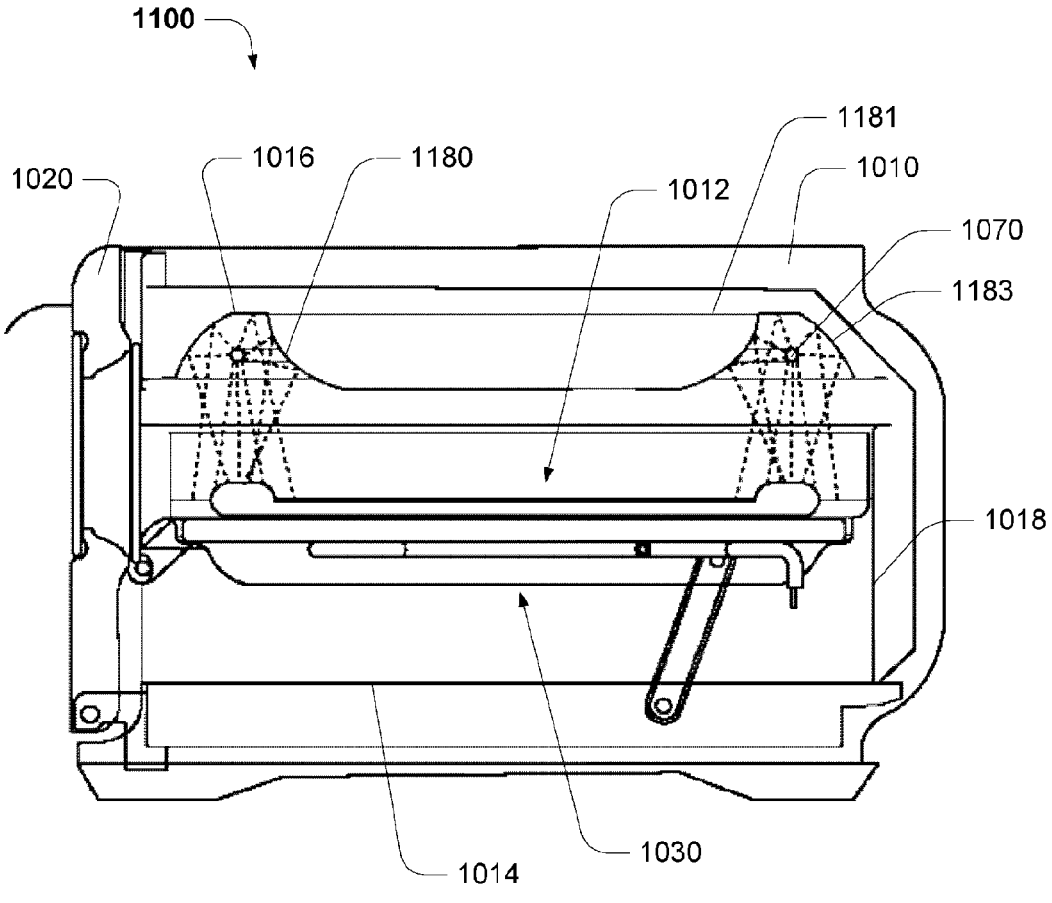
FIG. 15 is a sectional side view of an embodiment pizza oven, shown with a heating profile provided across the pizza deck.

FIG. 15 shows a sectional side view of an embodiment pizza oven 1100, substantially conforms to the oven 1000 except for the ceiling and shield, and provides an alternative heating profile across a pizza deck 1030.

In this embodiment, the shield 1180 is curved or convex, to define an inverted dome like form, and the ceiling 1181 defines an outer dome that supports the shield to define an annular channel-like region 1185 that encompasses the heating element.

In this embodiment the reflector shield directs heat energy from the heating element onto the pizza, such that a more intense heat is focused on the crust, while a less intense heat is applied to the rest of the pizza.

Figure 16A:
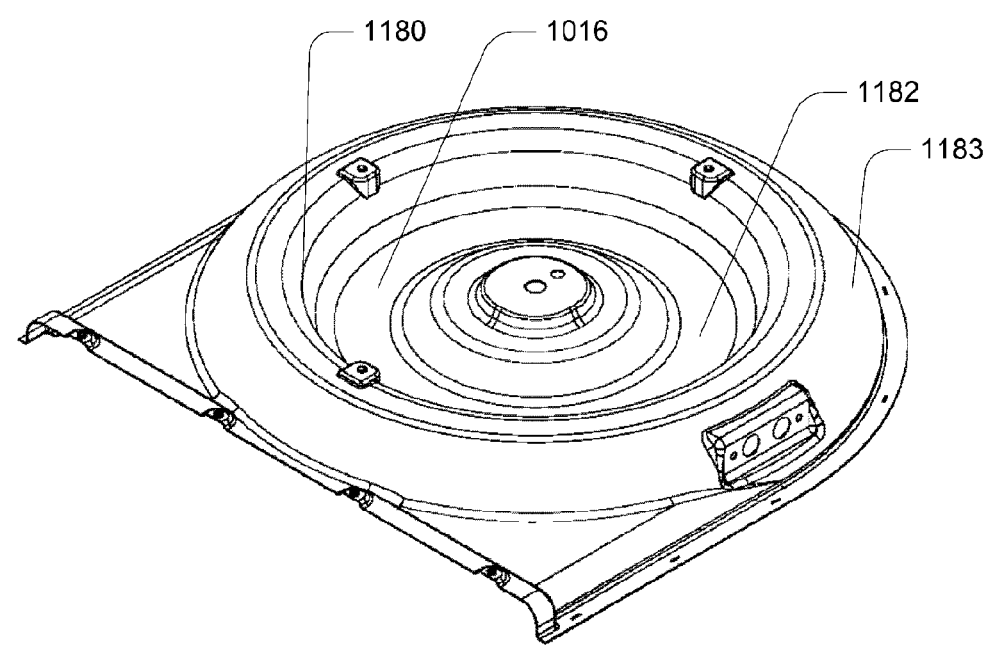
FIG. 16A is a perspective view of an alternative embodiment ceiling element for a cooking cavity of the embodiment pizza oven.
Figure 16B:
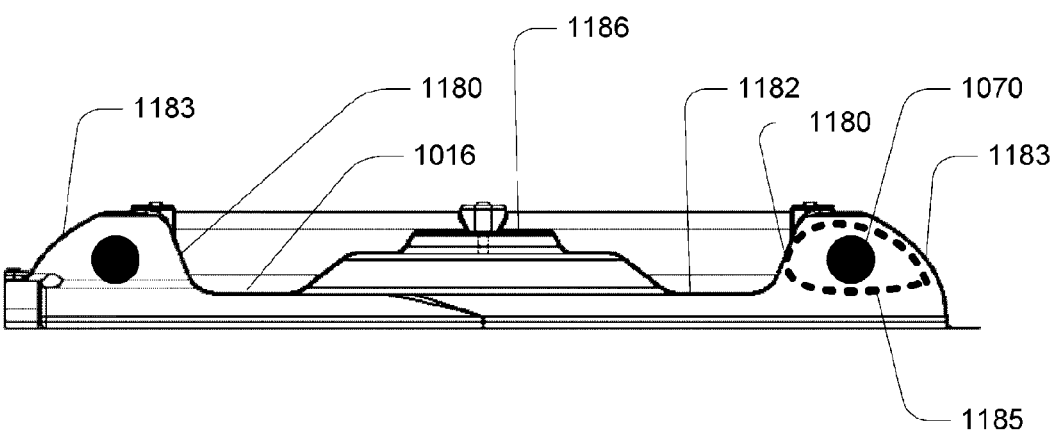
FIG. 16B is a sectional side view of a ceiling element of FIG. 16A.
Figure 16C:
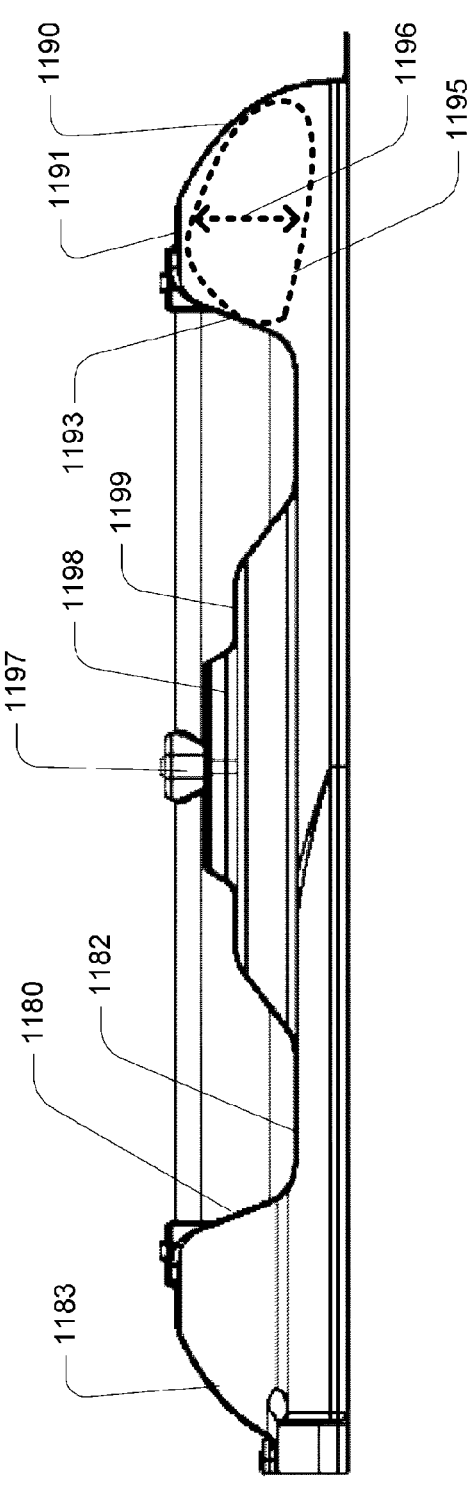
FIG. 16C is a sectional side view of a ceiling element of FIG. 16A.

FIG. 16A through FIG. 16C shows an embodiment ceiling element 1182 for a cooking cavity of the embodiment pizza oven. In this embodiment the ceiling 1182 is integrally formed with the shield portion 1180.

The ceiling element 1182 has a curved outer perimeter (at 1183) to define a domed area and an integrally formed inner convex shield portion 1180 for receiving the at least one heating element 1070 there between. The centre (at 1186) of the ceiling may be recessed as shown for fixing to the oven body. Alternatively the shield portion 1180 may define an inverted dome.

The shield portion reduces radiant heat from the heating element reaching the centre portion of the pizza deck (and pizza), thereby providing a heating or cooking profile across the pizza that has greater radiant heat applied to the crust and less radiant heat applied to the centre.

It will be appreciated that the ceiling and shield (or the portions thereof about the annular channel-like region 1085, 1185) can be formed of a heat reflective material, or have an appropriate finish.

The reflector properties about the annular channel-like region 1085, 1185 can concentrate heat energy, and the inverted dome shield may be constructed of fiberglass and act as a ceiling for the chamber, thereby reducing the need for some metal in the ceiling.

Referring for FIG. 16C, it will be appreciated that the reflector portion may include one or more of the following features:

a) the reflector portion is substantially annular, as defined by a sectional profile, wherein: the periphery 1190 of the reflector is concave and arcuate; a transition to a substantially horizontal portion 1191 at the top ; an inner shield wall 1193 transition downward to define an annular channel-like region 1195; the height 1196 of the annular channel-like region 1195 is sufficient to position of the heating element within, which enables some of the heat from the element to be blocked from the centre of the pizza;

b) the outer periphery 1190 has a curvature about the heating element that causes concentrated heat energy from the heating element to be delivered to the crust of the pizza (thereby causing blistering);

c) a circular heating element disposed near the ceiling of the cooking chamber (e.g. as shown in FIG. 13 and FIG. 15), and suspended from the ceiling by a plurality of metal clips;

d) a temperature sensor 1197 is located in the middle at the ceiling for sensing the cavity temperature;

e) the middle section 1198 of the circular reflector is raised to protect a temperature sensor from accidental touching when the pizza is inserted, and indented with a horizontal step 199 towards the opening for the temperature sensor such that the heat is reflected uniformly;

f) the reflector can be made as a separate piece from the shell;

g) the reflector can be made from stainless steel (or other suitable material);

h) two openings located at the side of the reflector are used to power the heating element; and i) the diameter of the heating element can be sized for the expected pizza size (e.g. 12 inch pizza) such that it is located above expected location of the crust.

FIG. 17, FIG.18, FIG. 19A and FIG. 19B discloses alternative structures for providing a heating or cooking profile across the pizza.

The front half of a D-shaped cooking cavity is less efficient due to there being no sidewalls to reflecting radiant energy to the pizza, and heat loss through the door (particularly when opened).

The cooking cavity being less-efficient in the front half can result in the pizza being cooked unevenly.

Figures 17, 18:
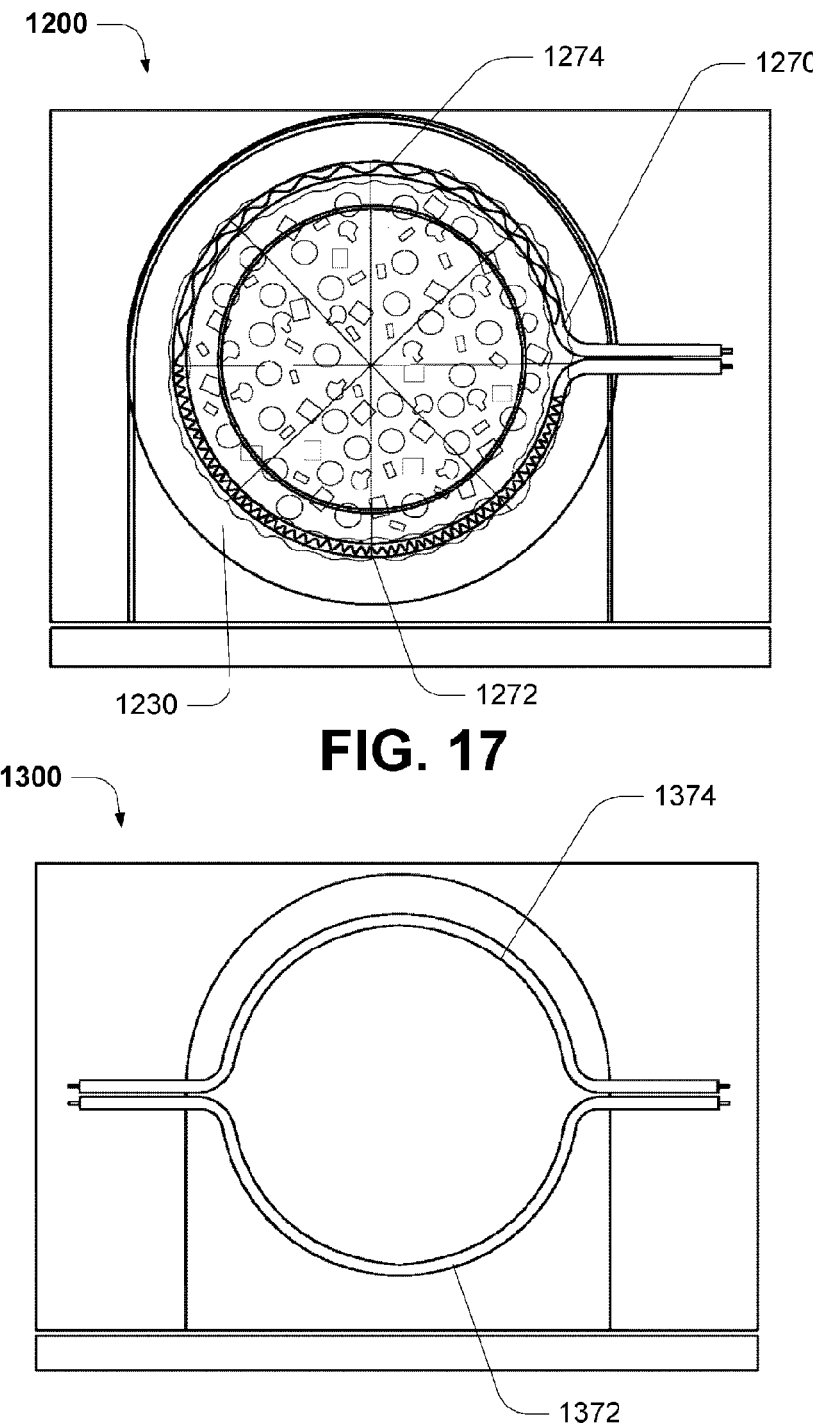
FIG. 17 is a sectional plan view of an embodiment pizza oven, shown with a heating profile provided across the pizza deck.
FIG. 18 is a sectional plan view of an embodiment pizza oven, shown with a heating profile provided across the pizza deck.

FIG. 17 shows a sectional plan view of an embodiment pizza oven 1200, which heating profile provided across the pizza deck 1230. The variable heating or cooking profile may be provided by a heating element 1270 having different heat power output along its length.

In this embodiment, the heater element 1270 may be circular in shape, with the forward half 1272 adapted to heat with greater intensity than the rear half 1274. For example, the front half of the heating element may providing heating power approximately 50% higher in wattage than the rear half of the heater assembly. It will be appreciated that the power output of a heating element can be adapted based on the respective winding density along its length.

FIG. 18 shows a sectional plan view of an embodiment pizza oven 1300, with a heating profile provided across the pizza deck (not shown). The variable heating or cooking profile may be provided by two semi-circular heating elements 1372,1374 having different heat power outputs and can be controlled independently of each other.

The variable heating or cooking profile may be provided by a plurality of heating elements, each heating element having a different heat power output. Different power outputs may be achieved through the specification of the heater elements or independent power control via processor module control.

In this embodiment, the forward semi-circular heating element 1372 adapted to heat with greater intensity than the rear semi-circular heating element 1374. For example, the front heating element of the heating element may provide heating power approximately 50% higher in wattage than the rear heating element.

In this embodiment, each heating element is powered from opposing sides of the oven.

Figure 19A:
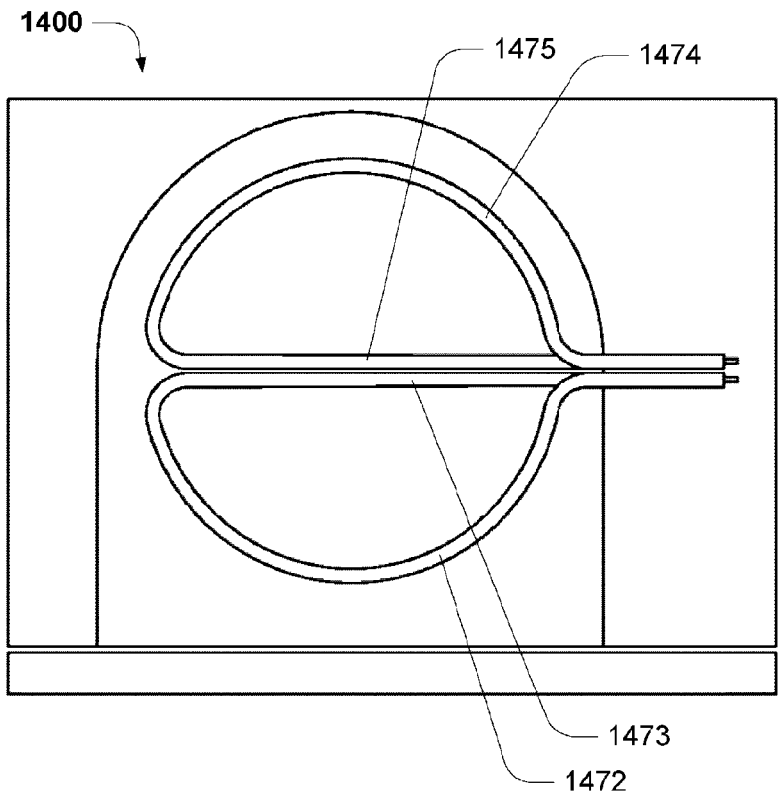
FIG. 19A is a sectional plan view of an embodiment pizza oven, shown with a heating profile provided across the pizza deck.
Figure 19B:
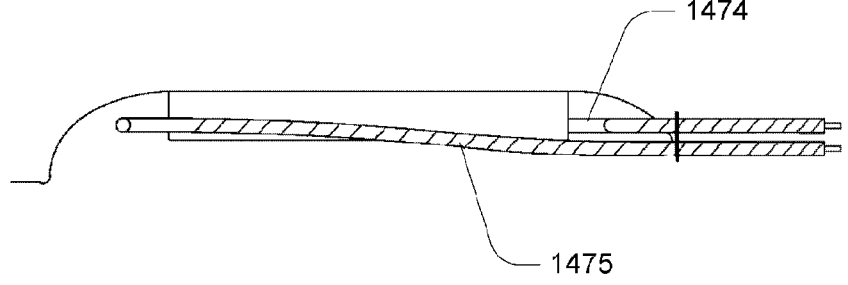
FIG. 19B is a sectional side view of a ceiling element of FIG. 19A.

FIG. 19A and FIG.19B shows a sectional plan view of an embodiment pizza oven 1400, with a heating profile provided across the pizza deck (not shown). The variable heating or cooking profile may be provided by two semi-circular heating elements 1472,1474 having different heat power outputs.

In this embodiment, the forward semi-circular heating element 1472 adapted to heat with greater intensity than the rear semi-circular heating element 1474. For example, the front heating element of the heating element may provide heating power approximately 50% higher in wattage than the rear heating element.

In this embodiment, each heating element is powered from the same sides of the oven. To neatly achieve this configuration, a return lead for each heating element (1472, 1474) may traverse from one end across the diameter of the cooking chamber (1473,1475 respectively) and angle slightly to avoid the other end.

Figure 20:
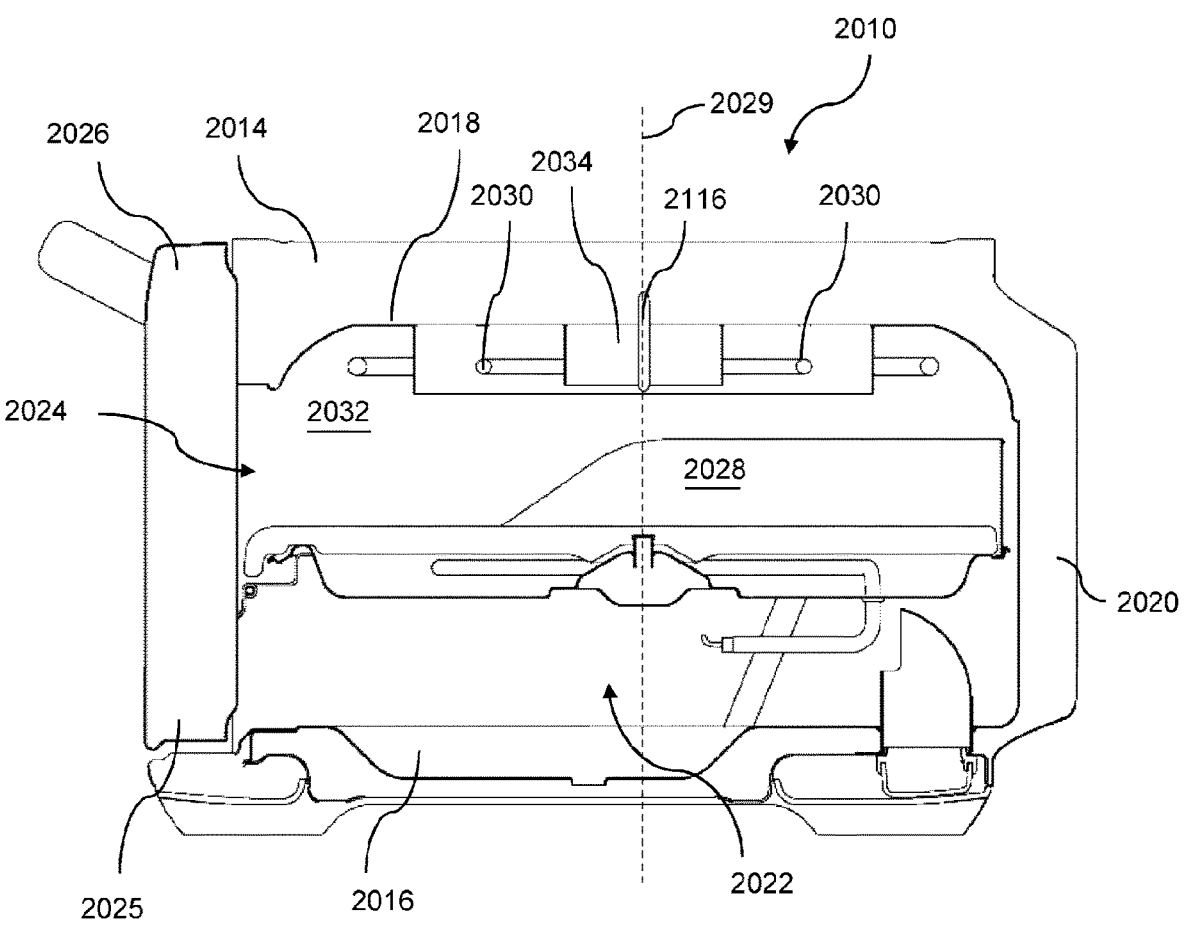
FIG. 20 is a schematic sectioned side elevation of a cooking appliance according to an embodiment of the invention.
Figures 21, 22:
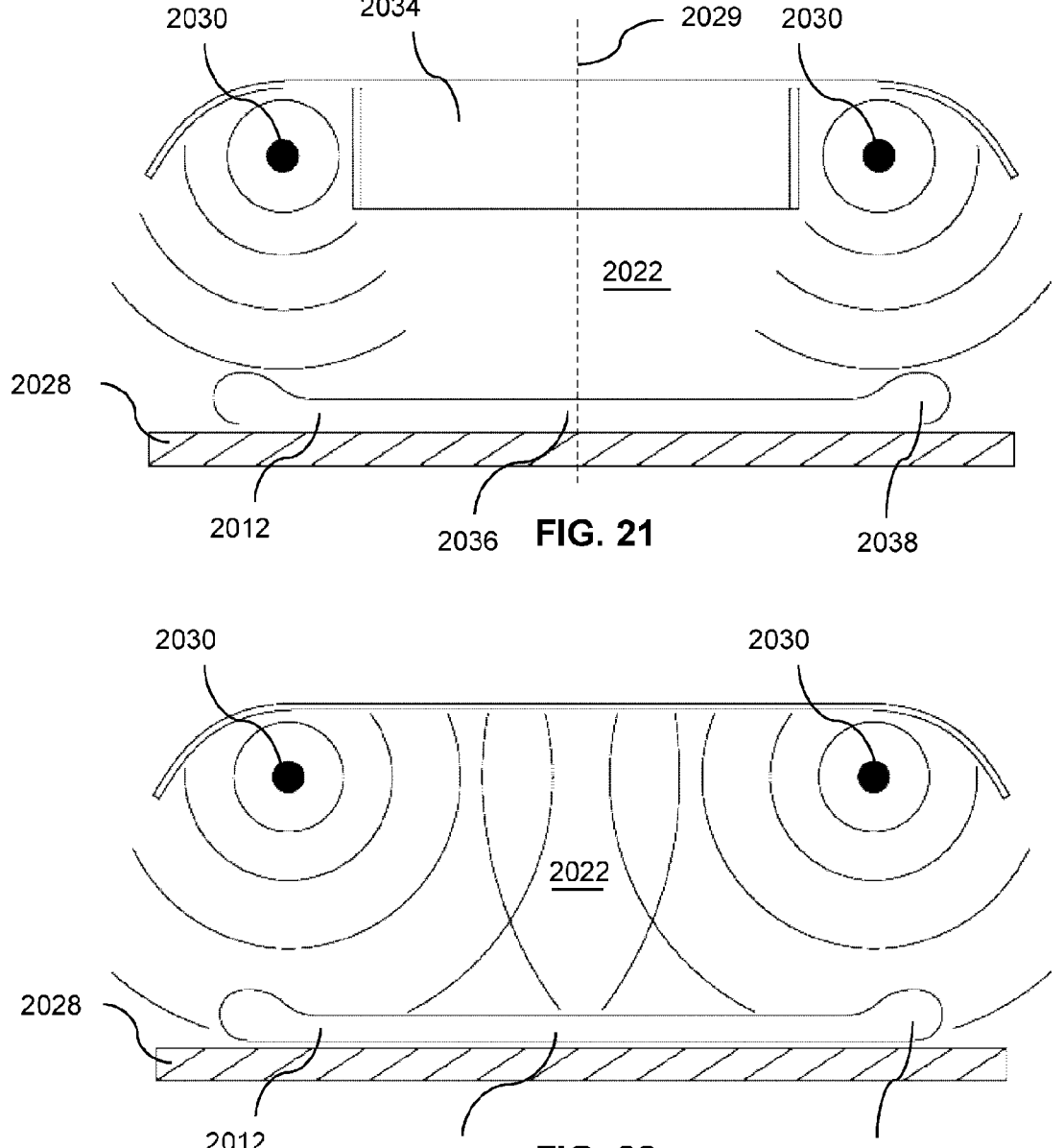
FIG. 21 is a schematic sectioned front elevation of a cooking cavity of the appliance of FIG. 20.
FIG. 22 is a schematic sectioned front elevation of the cooking cavity of FIG. 21 with a shield of the appliance removed.

In FIG. 20, there is depicted a cooking appliance 2010 configured to cook a pizza 2012 (shown in FIG. 21). The appliance 2010 includes a generally cuboidal body 2014 providing a floor 2016, a ceiling 2018 and an intermediate wall 2020 extending between the floor 2016 and the ceiling 2018. The floor 2016, ceiling 2018, and wall 2020 at least partly surround a cooking cavity 2022.

The body 2014 has an opening 2024 via which the pizza 2012 that is to be cooked can be moved in and out of the cavity 2022. The opening 2024 is closed by a door 2026 which is hinged to the body 2014 at a lower portion 2025 of the door 2026.

The appliance 2010 also preferably includes a pizza deck 2028 mounted to the floor 2016 for receiving the pizza 2012. A central axis 2029 of the pizza deck 2028 extends perpendicularly between the floor 2016 and the ceiling 2018.

The appliance 2010 also includes an upper heating element 2030 centrally located on the axis 2029 in an upper portion 2032 of the cavity 2022 to deliver radiant energy to cook the pizza 2012. The element 2030 extends circumferentially around the ceiling 2018.

The appliance 2010 further includes an annular shield 2034 centrally located on the axis 2029 in the upper portion 2032 of the cavity 2022. The shield 2034 is surrounded by the element 2030. The shield 2034 is configured to shield the centre portion 2036 (shown in FIG. 21) of the pizza 2012 from the radiant energy.

As depicted in FIG. 21, the shield 2034 reduces radiant energy from the element 2030 reaching the centre portion 2036 of the pizza 2012 located about the axis 2029 thereby providing a heating or cooking profile across the pizza 2012 that has greater radiant energy applied to the crust 2038 of the pizza 2012 and less radiant energy applied to the centre portion 2036 of the pizza 2012. In contrast, FIG. 22 depicts the effect of the removal of the shield 2034 from the cavity 2022 such that the heating or cooking profile across the pizza 2012 is relatively uniform.

Figure 23:
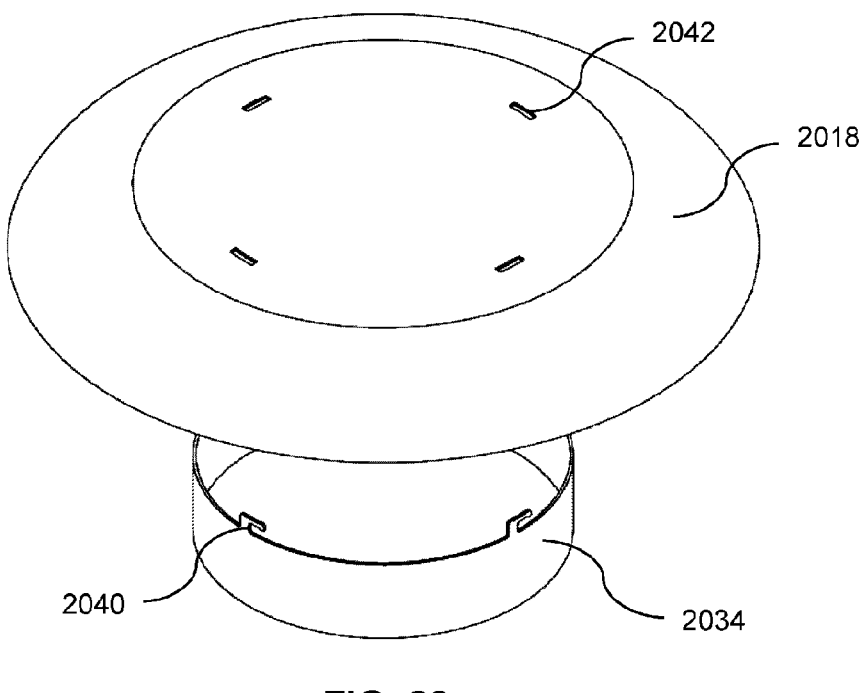
FIG. 23 is a schematic parts exploded isometric view of a ceiling and the shield of the appliance of FIG. 20.

Referring to FIG. 23, the shield 2034 includes a plurality of hooks 2040 configured to be received into respective openings 2042 in the ceiling 2018 so that, upon axial rotation of the shield 2034, the shield 2034 is removably attached to the ceiling 2018.

Figures 24, 25, 26:
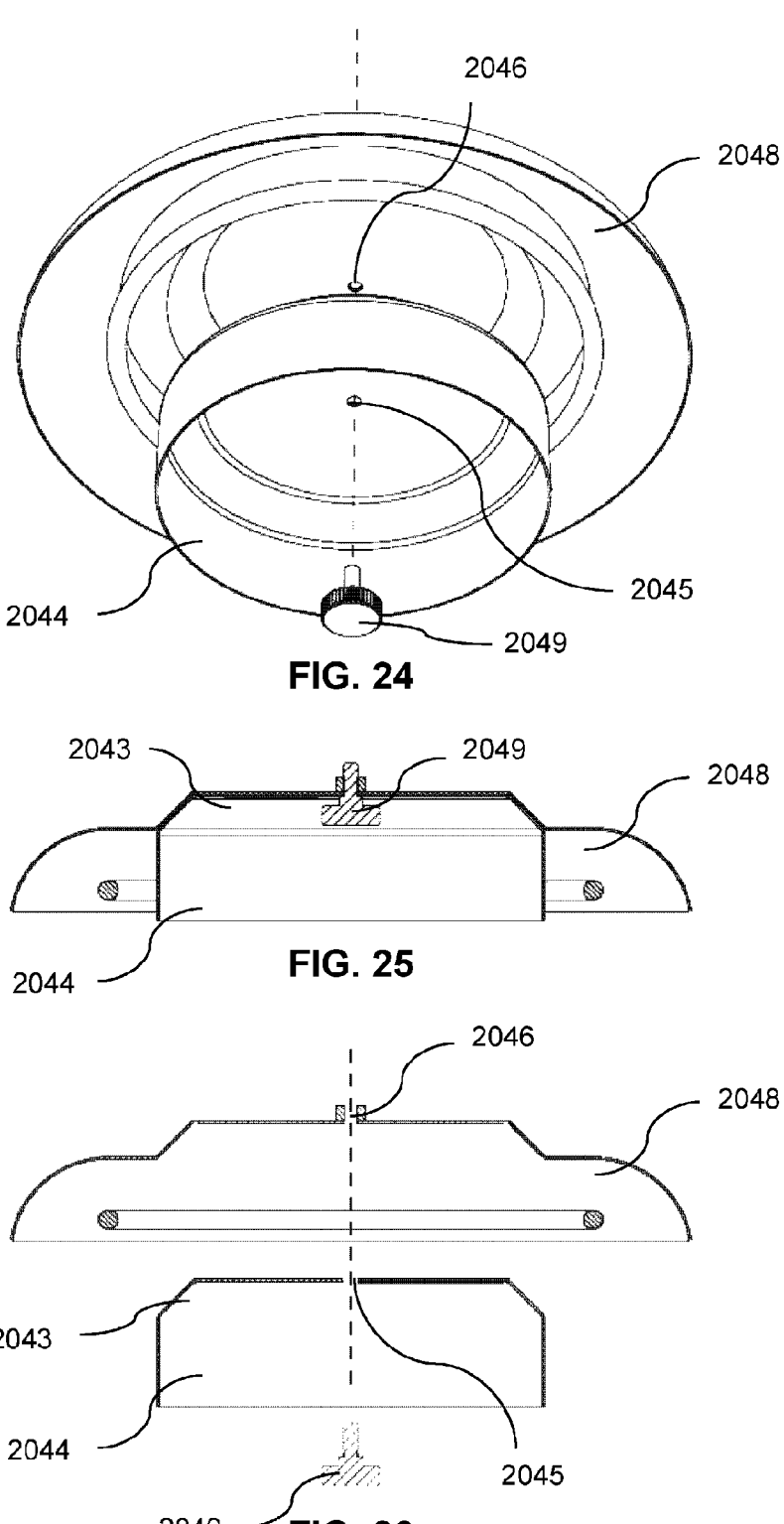
FIG. 24 is a schematic parts exploded bottom isometric view of the ceiling and the shield according to another embodiment.
FIG. 25 is a schematic sectioned side elevation of the ceiling and the shield of FIG. 24.
FIG. 26 is a schematic parts exploded sectioned side elevation of the ceiling and the shield of FIG. 24.

An alternative embodiment of a shield 2044 and a ceiling 2048 is shown in FIGS. 24 to 26. The shield 2044 is domed about its top end 2043 and includes a central hole 2045 for alignment with an orifice 2046 in the ceiling 2048. A nut 2049 is passed through the central hole 2045 and the orifice 2046 to removably attach the shield 2044 to the ceiling 2048.

Figures 27, 28:
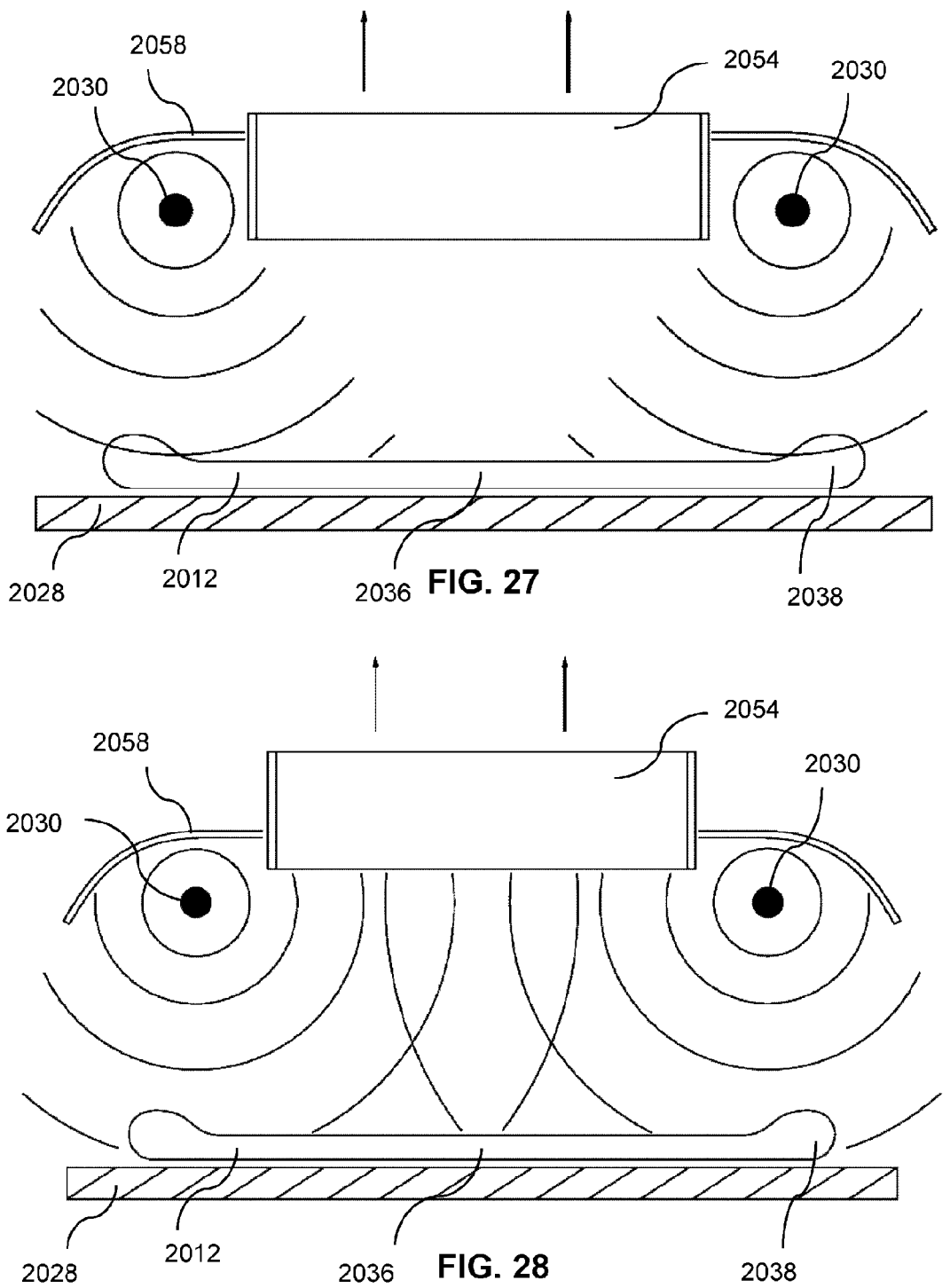
FIG. 27 is a schematic sectioned front elevation of the cooking cavity of FIG. 21 depicting a first position of the shield.
FIG. 28 is a schematic sectioned front elevation of the cooking cavity of FIG. 27 depicting a second position of the shield.
Figures 29, 30, 31:
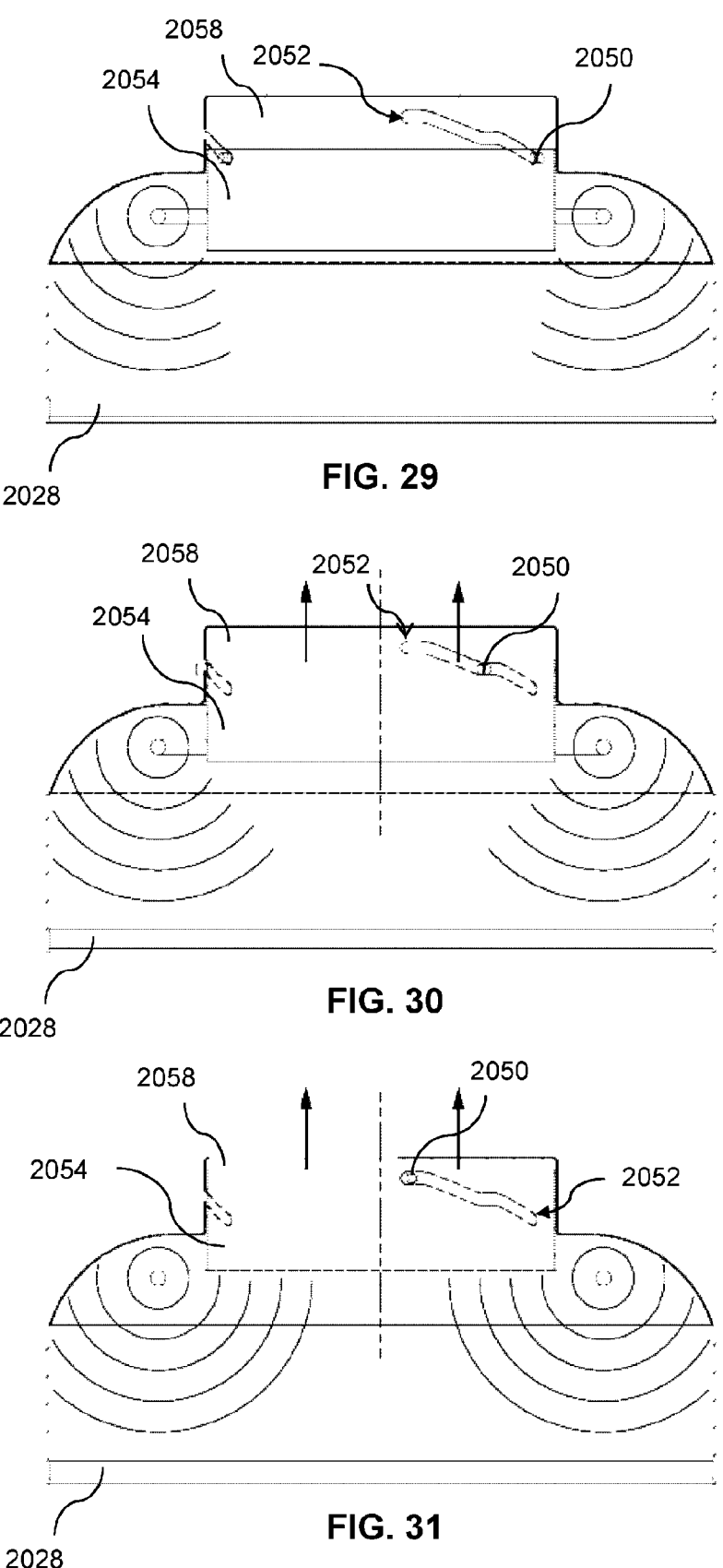
FIG. 29 is a schematic sectioned front elevation of the cooking cavity of FIG. 21 according to another embodiment depicting a first position of the shield.
FIG. 30 is a schematic sectioned front elevation of the cooking cavity of FIG. 29 depicting a second position of the shield.
FIG. 31 is a schematic sectioned front elevation of the cooking cavity of FIG. 29 depicting a third position of the shield.

Yet another embodiment of a shield 2054 and a ceiling 2058 is shown in FIGS. 27 and 28. The shield 2054 is movable relative to the pizza deck 2028 such that the shield 2054 can be lowered towards the pizza deck 2028 or raised away from the pizza deck 2028 to respectively decrease or increase the amount of radiant energy reaching the centre portion 2036 of the pizza 2012 as shown in FIGS. 27 and 28.

Figures 32, 33:
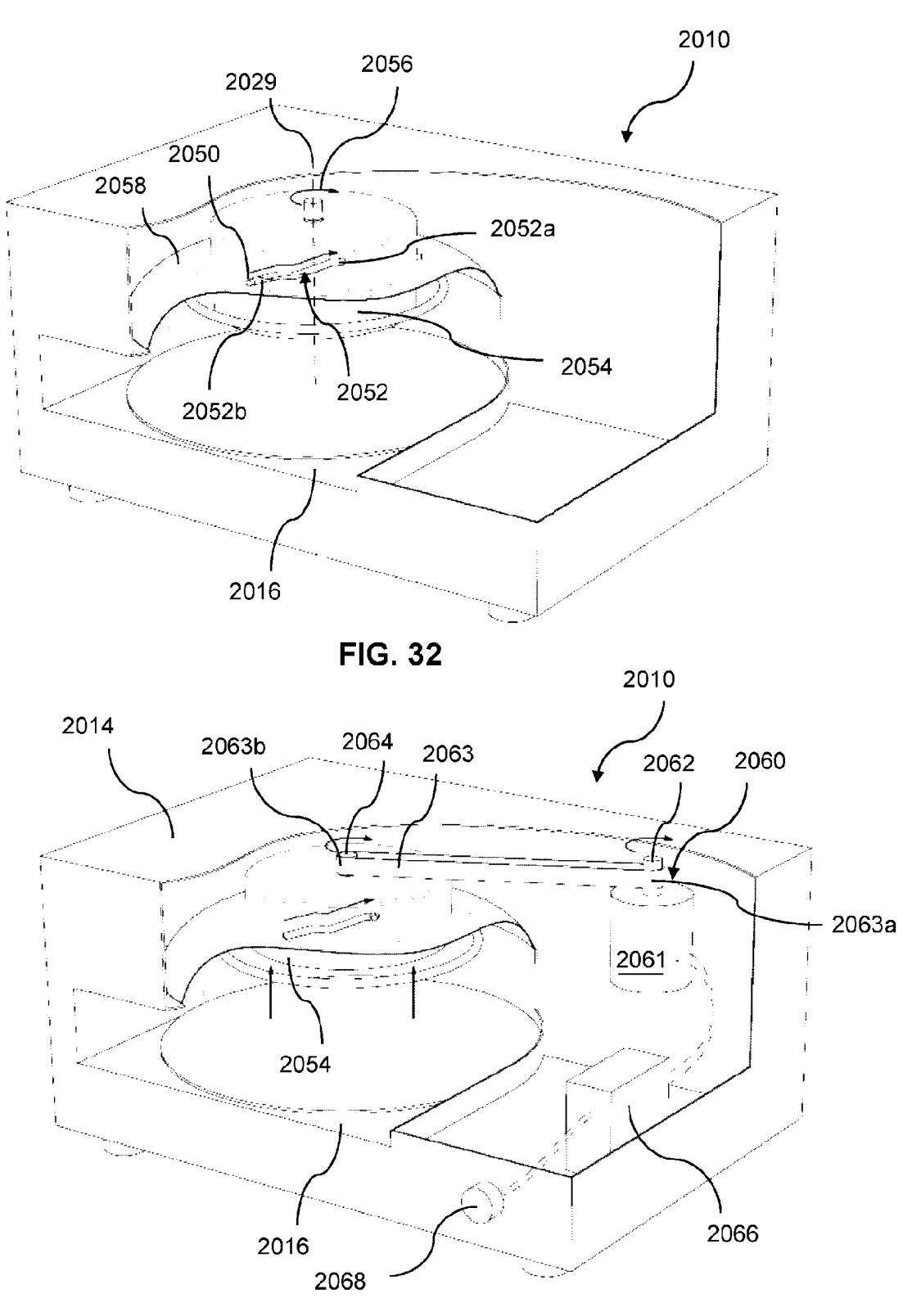
FIG. 32 is a simplified schematic part cut away isometric view of the appliance of FIG. 20 according to one embodiment.
FIG. 33 is a simplified schematic part cut away isometric view of the appliance of FIG. 20 according to another embodiment.

The raising and lowering of the shield 2054 relative to the pizza deck 2028 may be achieved through the use of a radial pin 2050 extending from the shield 2054 and co-operating with a slotted profile 2052 of the ceiling 2058 as best depicted in FIGS. 29 to 32. As shown in FIG. 32, the profile 2052 of the ceiling 2058 is inclined relative to the floor 2016 such that, as the shield 2054 is angularly rotated about the axis 2029 in a counter-clockwise direction 2056 when viewed towards the floor 2016, the pin 2050 slides towards the end 2052a of the profile 2052 which is furthest away from the floor 2016 thereby raising the shield 2054 away from the floor 2016. In an opposite manner, as the shield 2054 is rotated in a clockwise direction when viewed towards the floor 2016, the pin 2050 slides towards the end 2052b of the profile 2052 which is nearest the floor 2016 thereby lowering the shield 2054 towards the floor 2016.

The rotation of the shield 2054 may be controlled by a motor assembly 2060 mounted to the body 2014 as shown in FIG. 33. The motor assembly 2060 includes a motor 2061, a rotatable shaft 2062 driven by the motor 2061, and a belt (in another embodiment a chain may be used or another rotational transfer device) 2063 attached at one end 2063*a* to the shaft 2062 and attached at its opposite end 2063*b* to an axle 2064 attached to the shield 2054 to transmit rotational drive from the shaft 2062 to the axle 2064 thereby rotating the shield 2054. The motor 2061 may be controlled by a motor control unit 2066 configured to receive an input signal from a user operable knob 2068 mounted on the body 2014.

Figure 34:
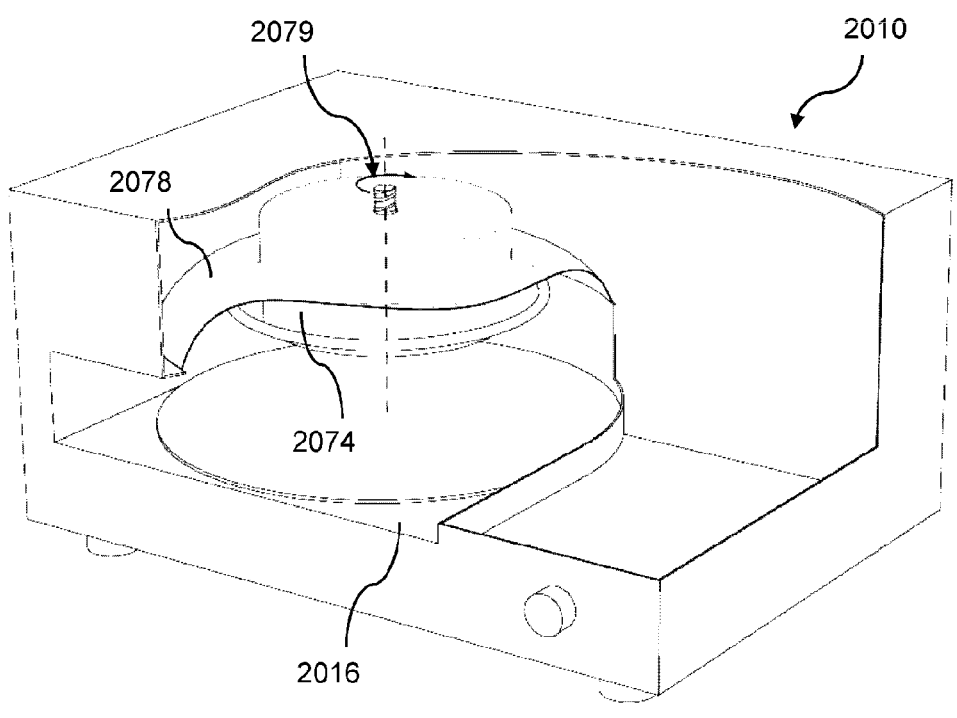
FIG. 34 is a simplified schematic part cut away isometric view of the appliance of FIG. 20 according to yet another embodiment.

Yet another embodiment of a shield 2074 and a ceiling 2078 is shown in FIG. 34. The shield 2074 is in threaded engagement with the ceiling 2078 by way of a screw assembly 2079 attached to the shield 2074. In this regard, the shield 2074 can be rotated in a conventional screw-like manner to raise or lower the shield 2074 relative to the floor 2016.

Figure 35:
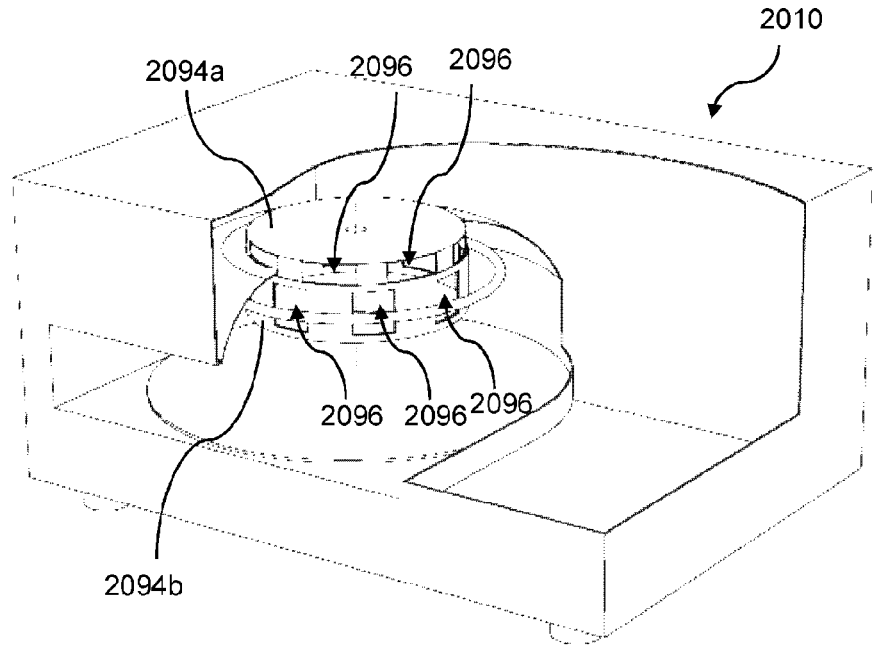
FIG. 35 is a simplified schematic part cut away isometric view of the appliance of FIG. 20 according to still yet another embodiment.

In another embodiment, shown in FIG. 35, the appliance 2010 includes a pair of inner and outer shields 2094*a*, 2094*b*. The inner shield 2094*a* is nested within the outer shield 2094*b*. Each of the inner and outer shields 2094*a*, 2094*b* has a plurality of apertures generally in the form of rectangular vents 2096.

Figure 36:
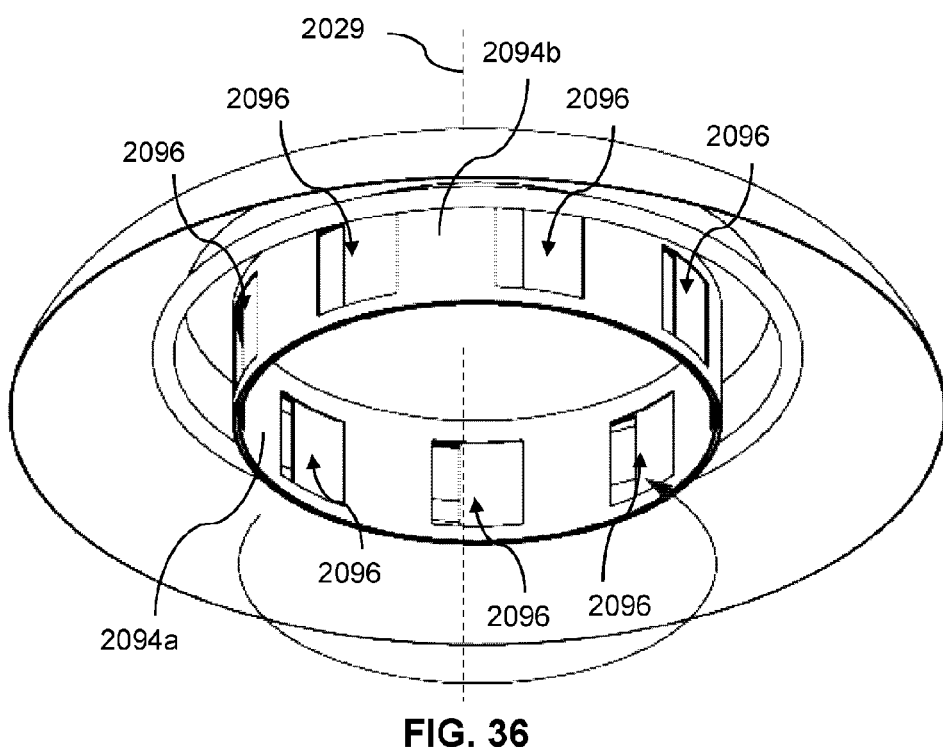
FIG. 36 is a schematic bottom isometric view of the ceiling and the shield of FIG. 35.
Figure 37:
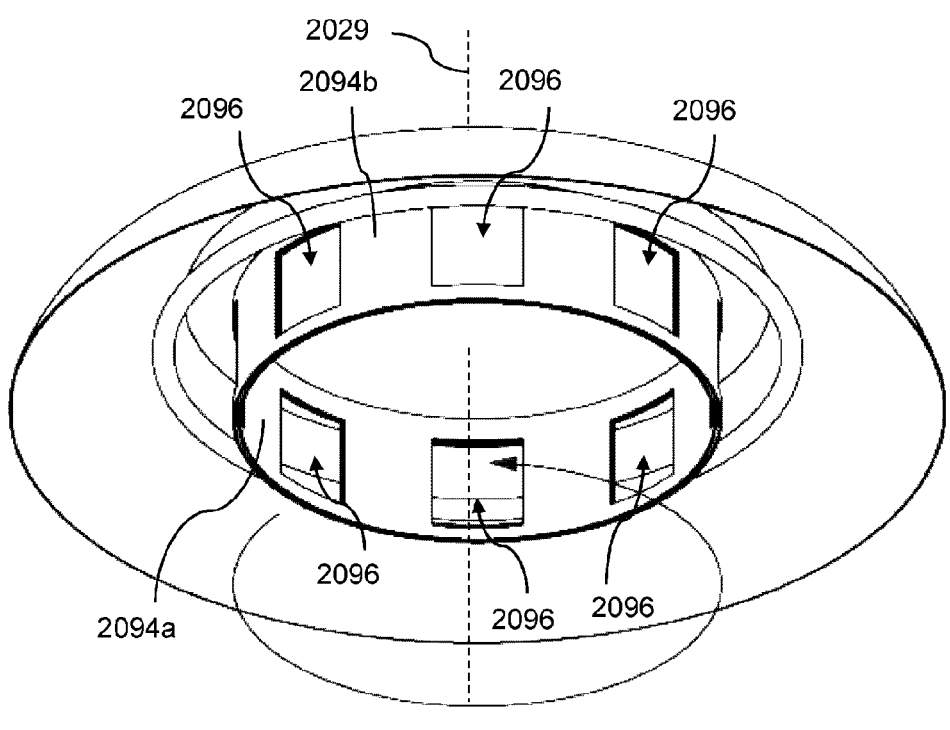
FIG. 37 is a schematic bottom isometric view of the ceiling and the shield of FIG. 36 in another configuration.
Figures 38, 39:
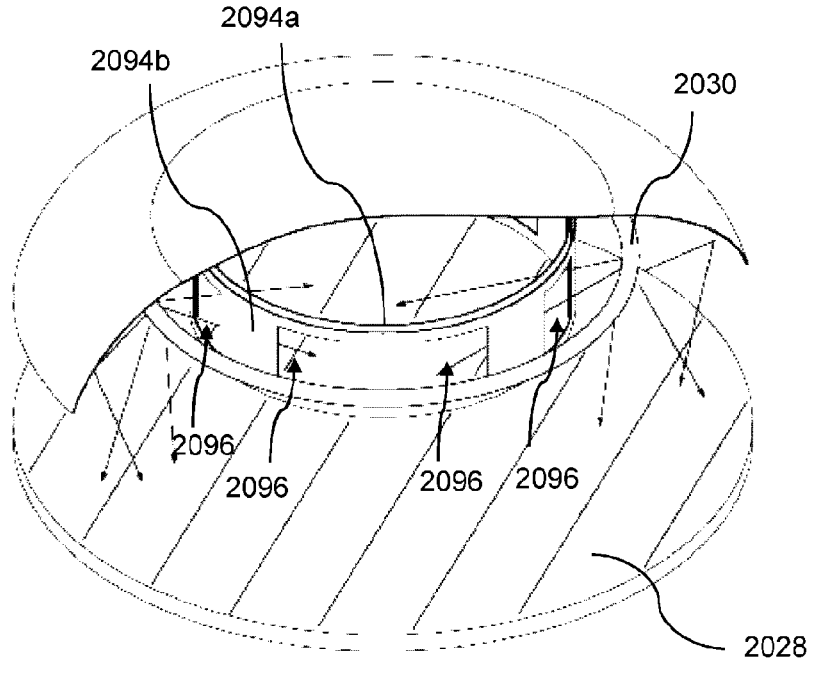
FIG. 38 is a schematic part cut away isometric view of the ceiling and the shield of FIG. 36 interacting with radiant energy from a heating element of the appliance.
FIG. 39 is a schematic part cut away isometric view of the ceiling and the shield of FIG. 38 in another configuration.

With particular reference to FIGS. 36 and 37, the outer shield 2094*b* may be angularly rotated about the axis 2029 with respect to the inner shield 2094*a* to vary the alignment of each of the vents 2096 of each of the inner and outer shields 2094*a*, 2094*b* to in turn vary the amount of radiant energy that is shielded from the centre portion 2036 of the pizza 2012. In this regard, the outer shield 2094*b* may be angularly rotated about the axis 2029 with respect to the inner shield 2094*a* to cause partial or complete alignment of each of the vents 2096 to allow radiant energy to pass through the inner and outer shields 2094*a*, 2094*b* as shown in FIG. 38. In a similar manner, the outer shield 2094*b* may be rotated to cause complete misalignment of each of the vents 2096 to substantially prevent radiant energy from passing through the inner and outer shields 2094*a*, 2094*b* as shown in FIG. 39. Alternate embodiments are envisaged in which the inner shield 2094*a* may be angularly rotated about the axis 2029 with respect to the outer shield 2094*b* to align or misalign each of the vents 2096. Further alternate embodiments are envisaged in which each of the inner and outer shields 2094*a*, 2094*b* is angularly rotatable about the axis 2029 with respect to each other to align or misalign each of the vents 2096.

Figure 40:
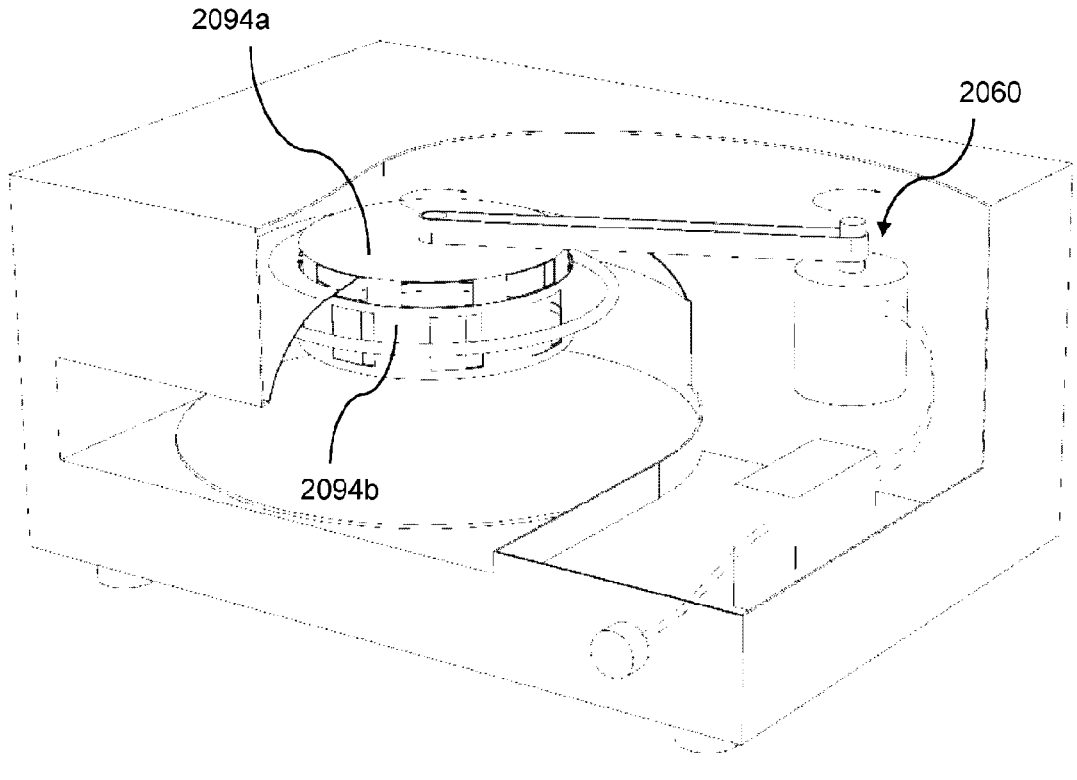
FIG. 40 is a simplified schematic part cut away isometric view of the appliance of FIG. 20 according to still yet another embodiment.

As best depicted in FIG. 40, rotation of the inner shield 2094*a* may be controlled by the motor assembly 2060.

A further embodiment of a cooking appliance 2100 is now described with reference to FIGS. 41 through 48. Features of the cooking appliance 2100 that are identical to those of the cooking appliance 2010 are provided with an identical reference numeral.

Figure 41:
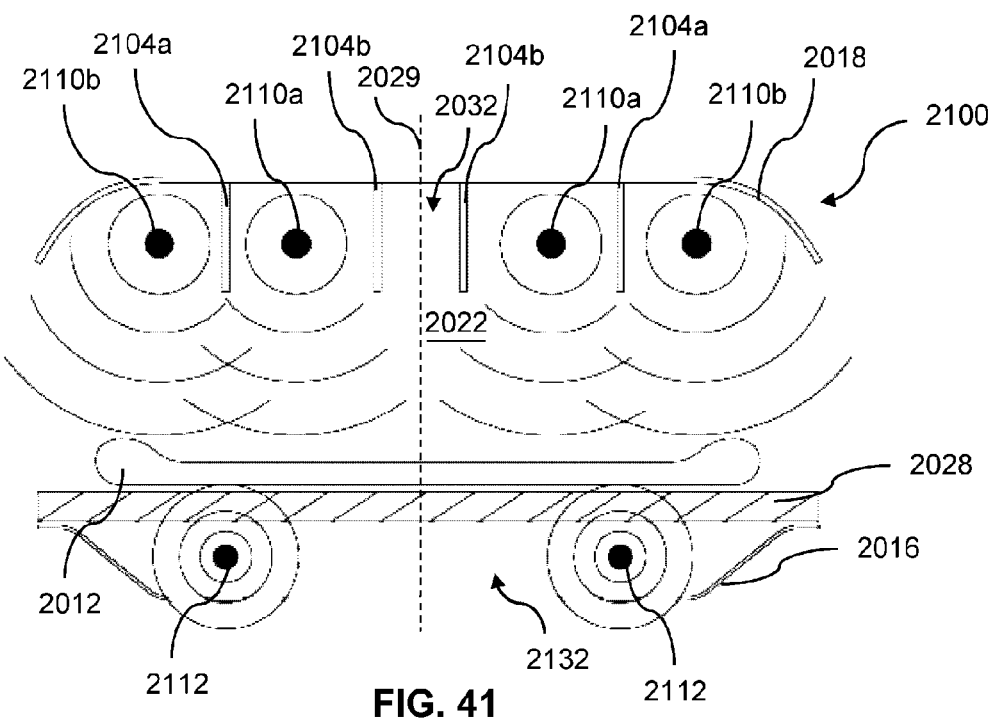
FIG. 41 is a schematic sectioned front elevation of the cooking cavity of FIG. 21 according to another embodiment.

With particular reference to FIG. 41, the appliance 2100 includes a pair of inner and outer upper heating elements 2110*a*, 2110*b* circumferentially extending around the ceiling 2018 and centrally located on the axis 2029 in the upper portion 2032 of the cavity 2022. The appliance 2100 also includes a lower heating element 2112 circumferentially extending around the floor 2016 and centrally located on the axis 2029 in a lower portion 2132 of the cavity 2022 to deliver radiant energy to cook the pizza 2012. The lower heating element 2112 is preferably embedded within the pizza deck 2028.

Figure 41A:
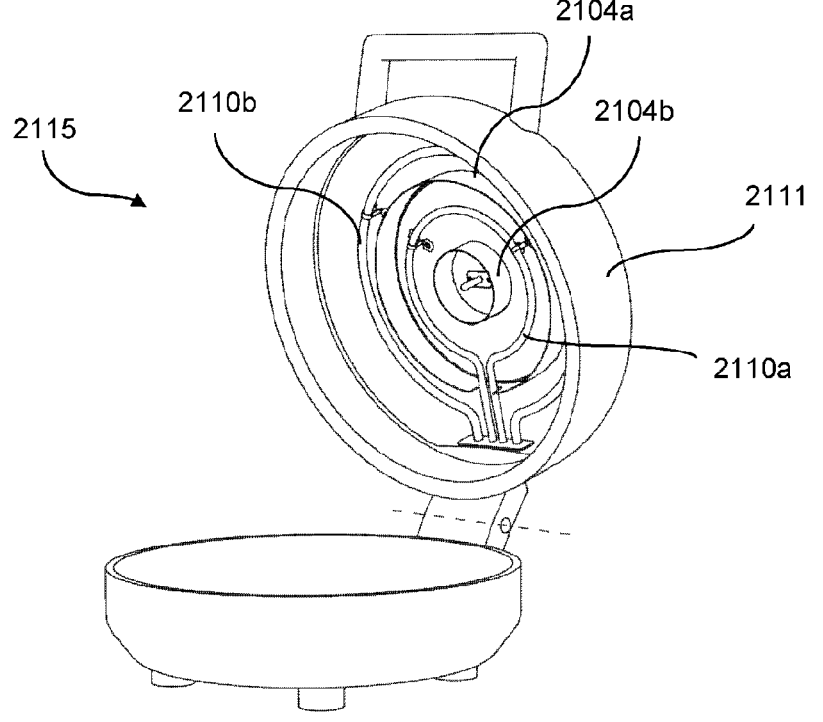
FIG. 41A is a schematic perspective view of a cooking appliance according to another embodiment.

The appliance 2100 also includes a primary annular shield 2104*a* centrally located on the axis 2029 to localise radiant energy to the crust 2038 of the pizza 2012 and a secondary annular shield 2104*b* centrally located on the axis 2029 to localise radiant energy to the centre portion 2036 of the pizza 2012. The primary shield 2104*a* is surrounded by the outer upper heating element 2110*b*. The secondary shield 2104*b* is surrounded by the inner upper heating element 2110*a*. It will be appreciated that the arrangement of the upper heating elements 2110*a*, 2110*b* and the shields 2104*a*, 2104*b* can be housed within the cuboidal body 2014 of the cooking appliance 2010 or a substantially rounded body 2111 of the cooking appliance 2115 as shown in FIG. 41A.

Figure 42:
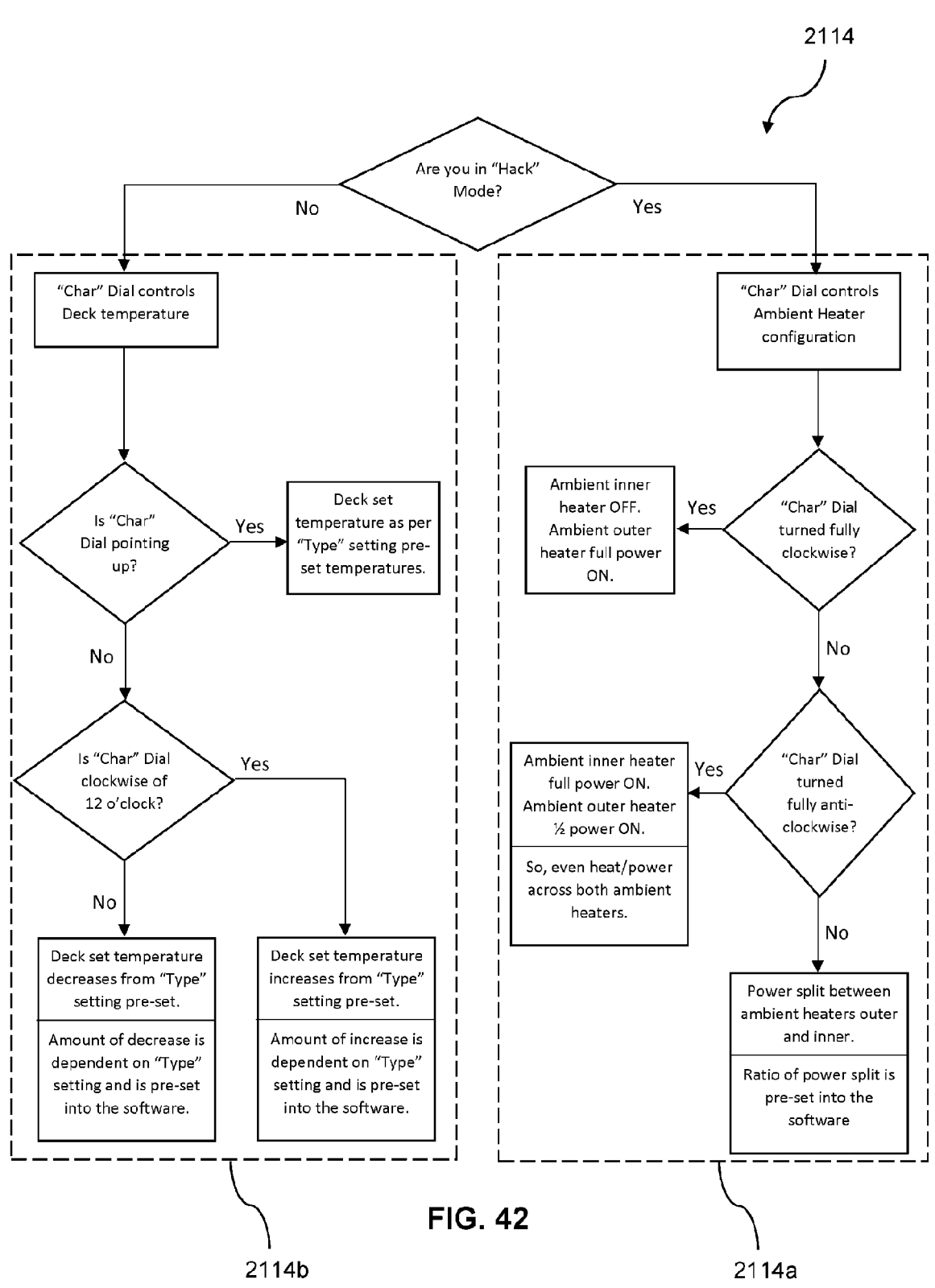
FIG. 42 is a flowchart illustrating an algorithm of the appliance of FIG. 20.

FIG. 42 depicts a controller in the form of an algorithm 2114 operatively associated with each of the inner and outer upper heating elements 2110*a*, 2110*b* and the lower heating element 2112 to provide for selective delivery of electric power to each of the inner and outer upper heating elements 2110*a*, 2110*b* and the lower heating element 2112 thereby to provide a heating profile across the pizza 2012. Each of the inner and outer upper heating elements 2110*a*, 2110*b* is independently controllable by the algorithm 2114.

As depicted in FIGS. 43 to 48, the heating profile across the pizza 2012 is controlled by means of a user operable control hub 2118 of the appliance 2100. The control hub 2118 is operatively associated with the algorithm 2114 to manually and independently alter the electric power and temperature of each of the inner and outer upper heating elements 2110*a*, 2110*b* and the lower heating element 2112. The control hub 2118 includes a first dial (not shown), a second dial 2118*b*, and a third dial 2118*c*.

The algorithm 2114 is configured to operate in a first mode 2114*a* and a second mode 2114*b* (shown in FIG. 42).

Figure 43:
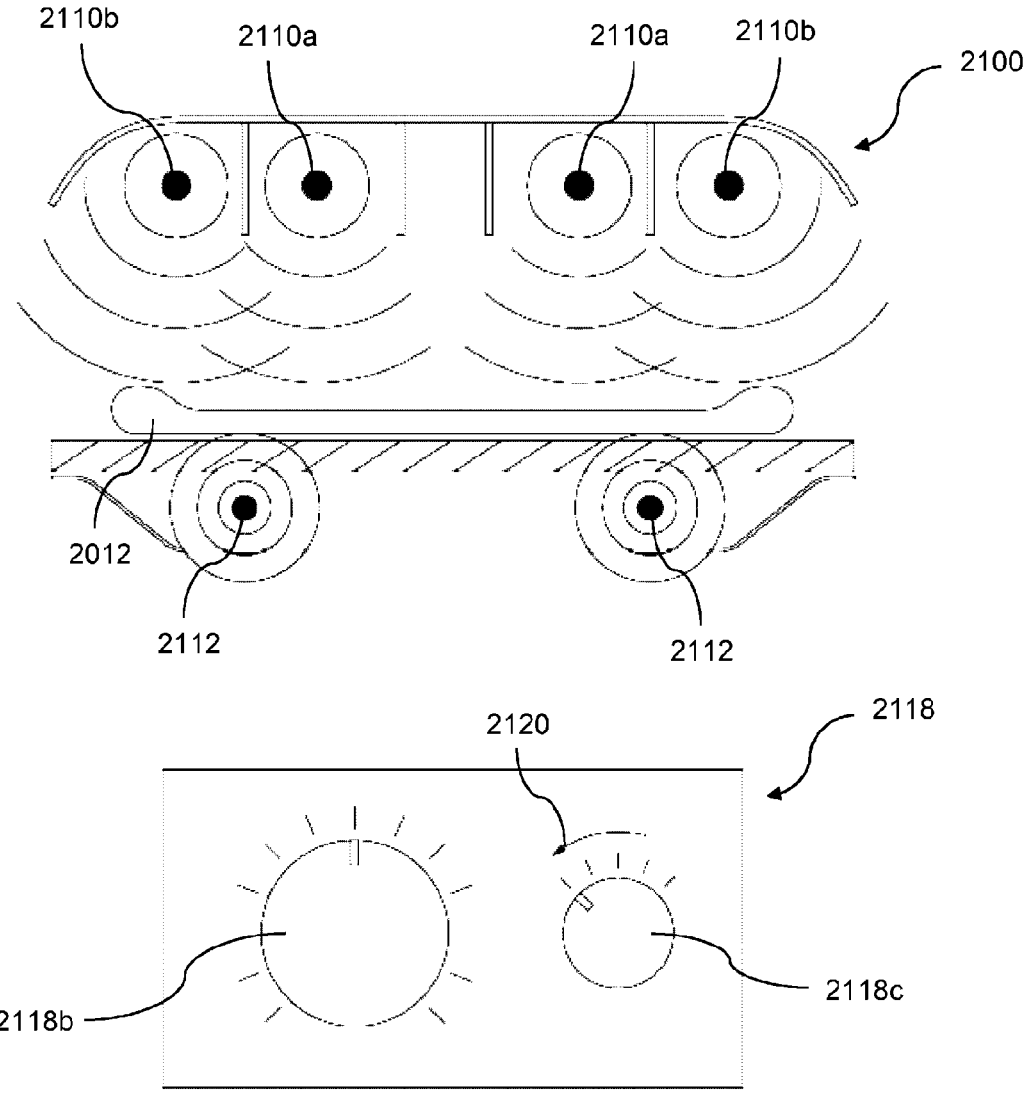
FIG. 43 is a schematic sectioned front elevation of the cooking cavity of FIG. 41 showing the effect of a dial of the appliance on the cooking cavity.
Figure 44:
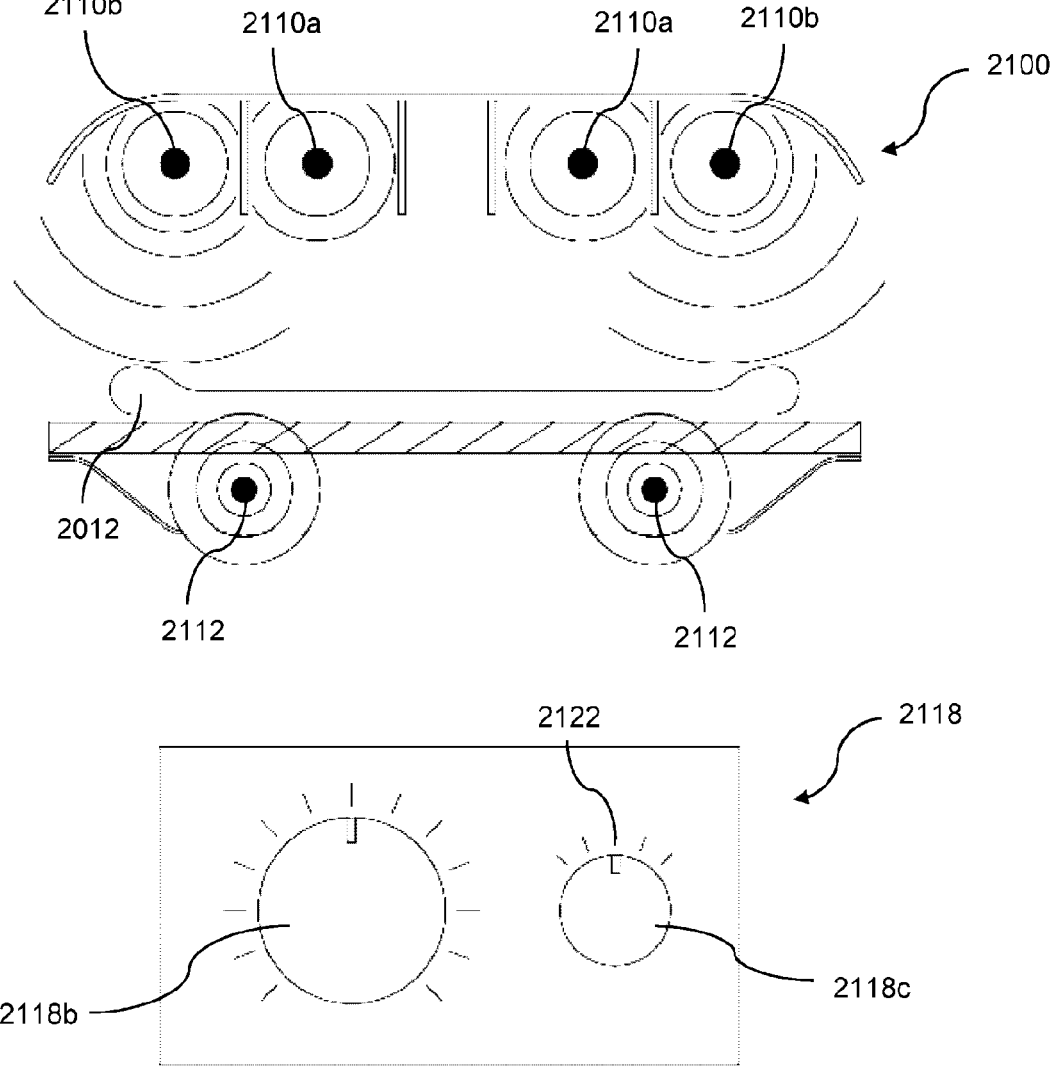
FIG. 44 is a schematic sectioned front elevation of the cooking cavity of FIG. 41 showing the effect of the dial in another configuration.
Figure 45:
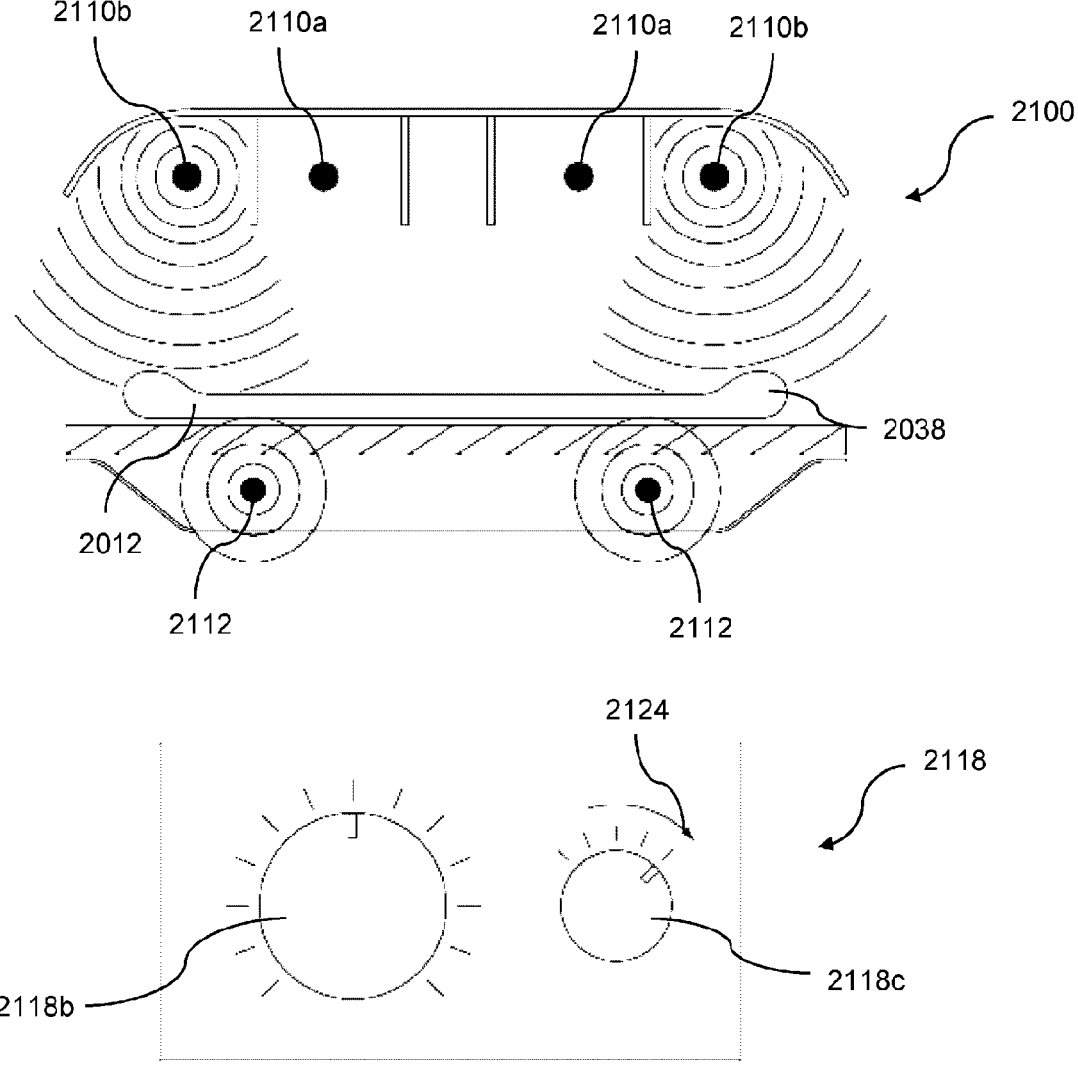
FIG. 45 is a schematic sectioned front elevation of the cooking cavity of FIG. 41 showing the effect of the dial in yet another configuration.

In the first mode 2114*a* of the algorithm 2114, the first dial (not shown) is configured to control the temperature of the lower heating element 2112; the second dial 2118*b* is configured to control the temperature of the inner and outer upper heating elements 2110*a*, 2110*b*; and the third dial 2118*c* is configured to control the electric power of only the inner and outer upper heating elements 2110*a*, 2110*b*. When the third dial 2118*c* is in a first position 2120, the electric power to each of the inner and outer upper heating elements 2110*a*, 2110*b* is adjusted to provide radiant energy relatively uniformly across the pizza 2012 as shown in FIG. 43. When the third dial 2118*c* is in a second position 2122, the electric power to the inner upper heating element 2110*a* is reduced and the power to the outer upper heating element 2110*b* is increased, relative to the power configuration when the third dial 2118*c* is in the first position 2120, as shown in FIG. 44. When the third dial 2118*c* is in a third position 2124, the electric power to the inner upper heating element 2110*a* is reduced to zero and the power to the outer upper heating element 2110*b* is increased to maximum, relative to the power configuration when the third dial 2118*c* is in the second position 2122, as shown in FIG. 45; in this configuration, radiant energy is most focused on the crust 2038 of the pizza 2012. Essentially, the third dial 2118*c*, whilst operating in the first mode 2114*a*, provides fine tuning to crusting the pizza 2012, even cooking across the whole of the pizza 2012, or general control over the cooking of the centre portion 2036 or crust 2038 of the pizza 2012.

Figure 46:
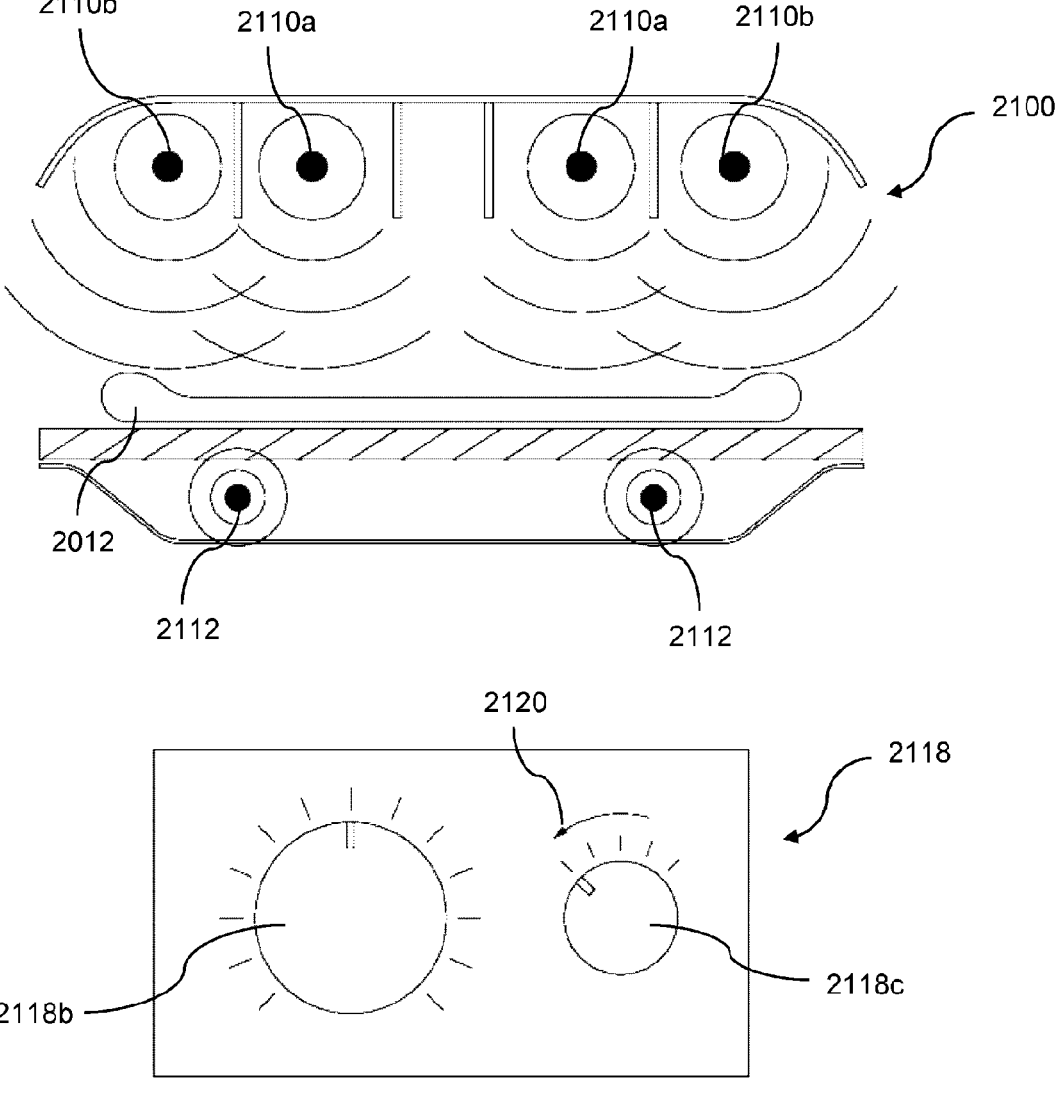
FIG. 46 is a schematic sectioned front elevation of the cooking cavity of FIG. 41 showing the effect of the dial in still yet another configuration.
Figure 47:
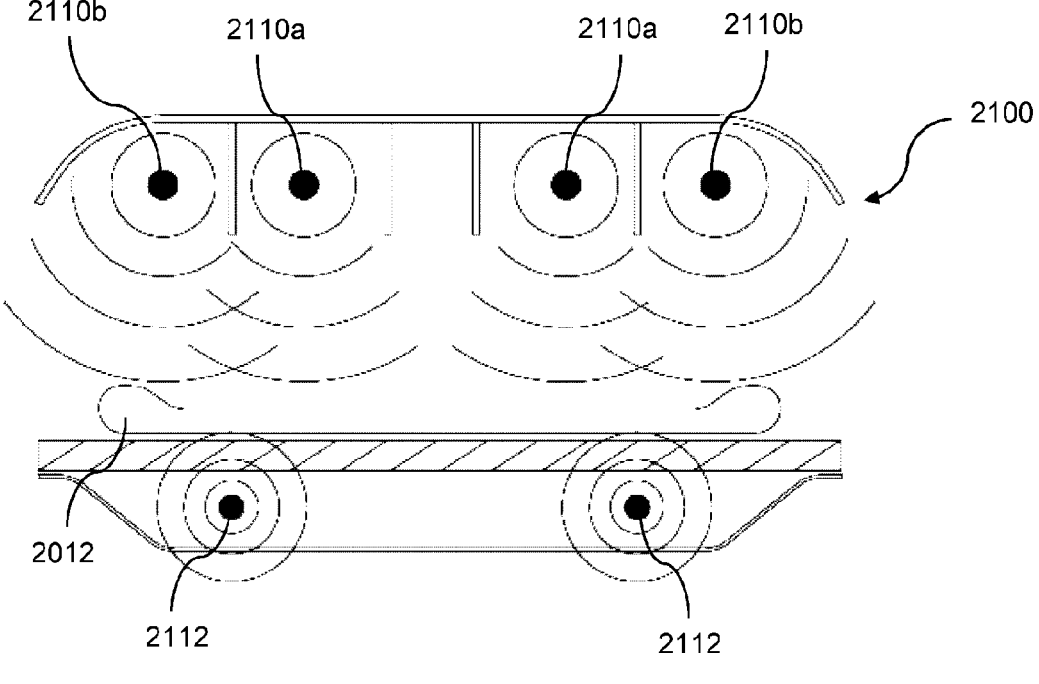
FIG. 47 is a schematic sectioned front elevation of the cooking cavity of FIG. 41 showing the effect of the dial in still yet another configuration.
Figure 47:
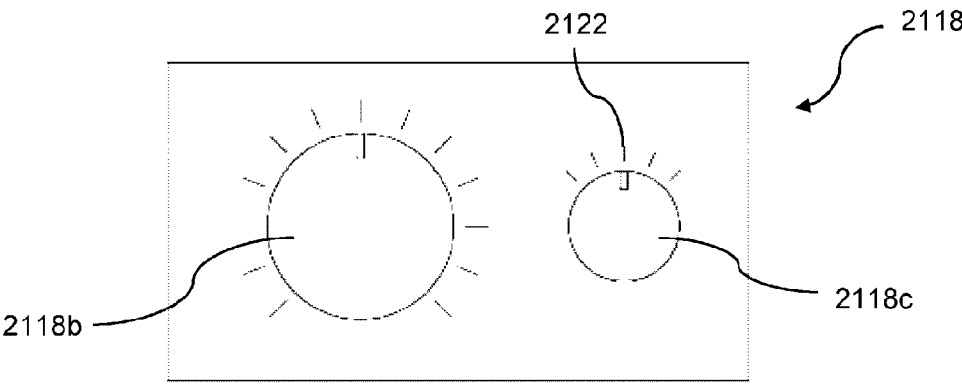
Figure 48:
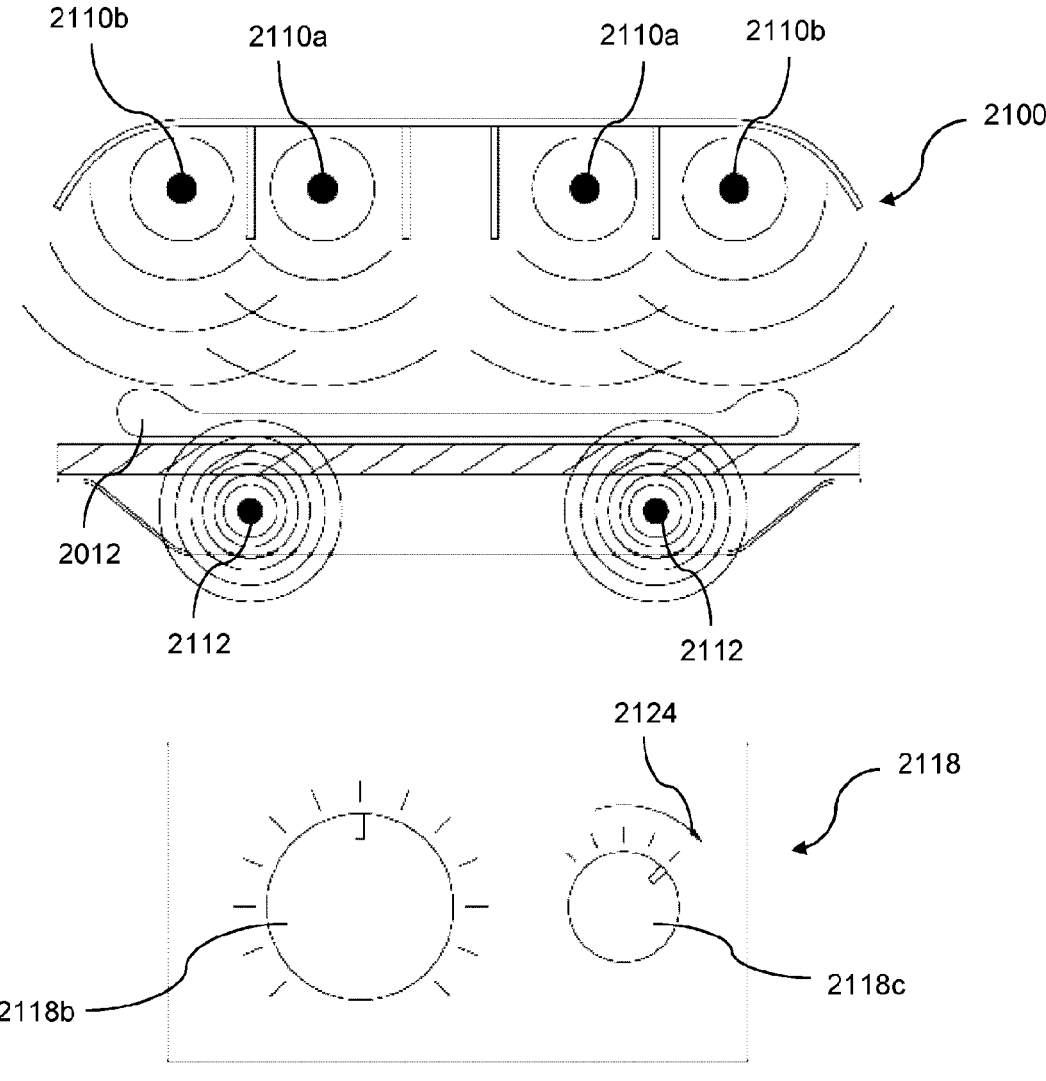
FIG. 48 is a schematic sectioned front elevation of the cooking cavity of FIG. 41 showing the effect of the dial in still yet another configuration.

In the second mode 2114*b* of the algorithm 2114, the first dial (not shown) is configured to control a timer (not shown) of the inner and outer upper heating elements 2110*a*, 2110*b* and the lower heating element 2112; the second dial 2118*b* is configured to control a "type" setting of the appliance 2010 (for example, the "type" can be "thick pizza") to provide a range of pre-set timing intervals and temperatures of the inner and outer upper heating elements 2110*a*, 2110*b* and the lower heating element 2112 to suit a user's particular needs; and the third dial 2118*c* is configured to control the temperature of the lower heating element 2112. When the third dial 2118*c* is in the first position 2120, the temperature to the lower heating element 2112 is decreased, relative to the second dial configuration when the algorithm 2114 is in the first mode 2114*a,* as shown in FIG. 46. When the third dial 2118*c* is in the second position 2122, the temperature to the lower heating element 2112 is normal, relative to the power configuration when the third dial 2118*c* is in the first position 2120 in the second mode 2114*b* of the algorithm 2114, as shown in FIG. 47. When the third dial 2118*c* is in the third position 2124, the temperature to the lower heating element 2112 is increased, relative to the power configuration when the third dial 2118*c* is in the second position 2122 in the second mode 2114*b* of the algorithm 2114, as shown in FIG. 48. Essentially, the third dial 2118*c,* whilst operating in the second mode 2114*b,* provides fine control for the temperature of the lower heating element 2112 in the event that the pre-set temperature settings of the second dial 2118*b* are not completely accurate for the user's particular needs.

The appliance 2100 includes a temperature sensor 2116 (shown in FIG. 20) located about the ceiling 2018 within the cavity 2022 to provide a signal indicative of the temperature within the cavity 2022 to the algorithm 2114 to adjust the delivery of electric power to each of the inner and outer upper heating elements 2110*a,* 2110*b* and the lower heating element 2112 as necessary.

A further embodiment of a cooking appliance 2200 is now described with reference to FIGS. 49 to 57. Features of the cooking appliance 2200 that are identical to those of the cooking appliance 2010 are provided with an identical reference numeral.

Figure 49:
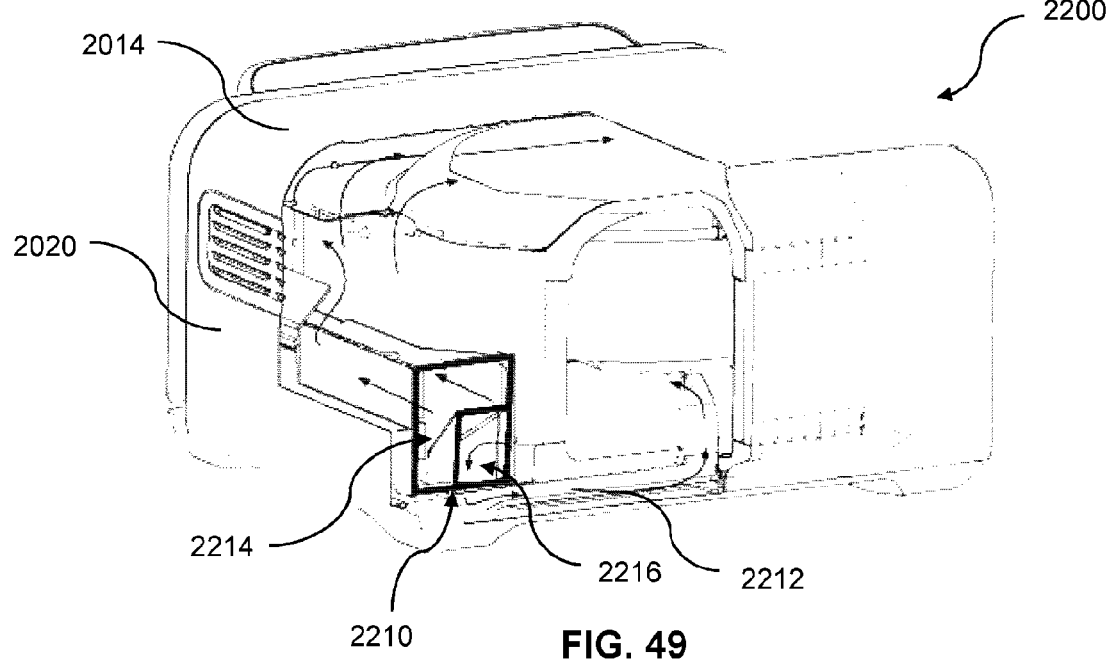
FIG. 49 is a part cut away rear isometric view of the appliance according to another embodiment.
Figure 50:
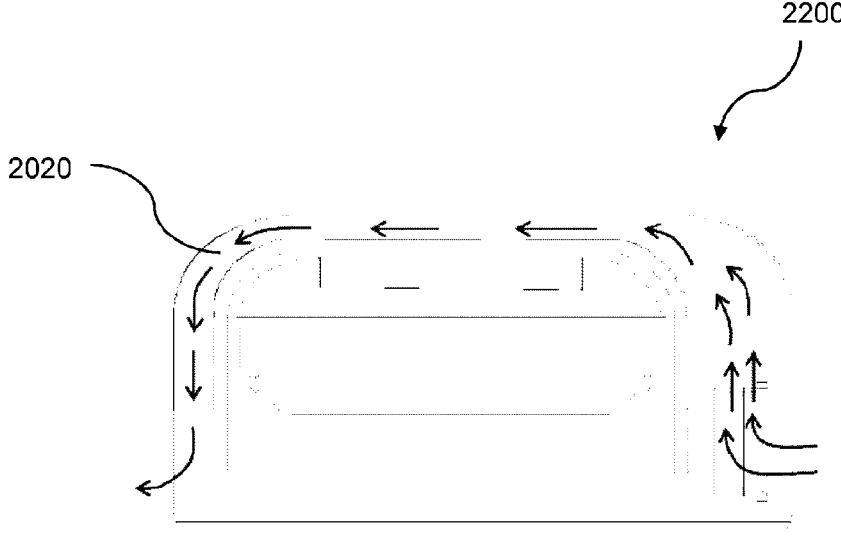
FIGS. 50 and 51 are simplified schematic views of airflow channels of the appliance of FIG. 49.
Figure 51:
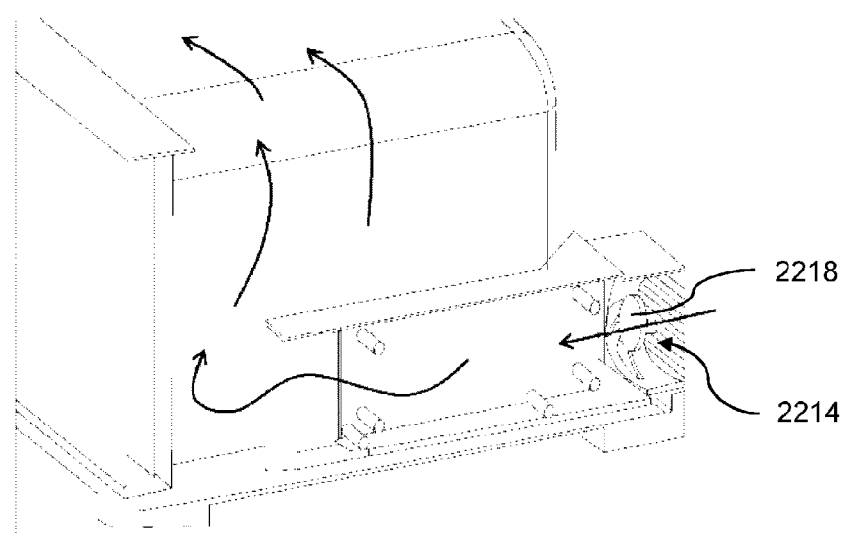
Figure 52:
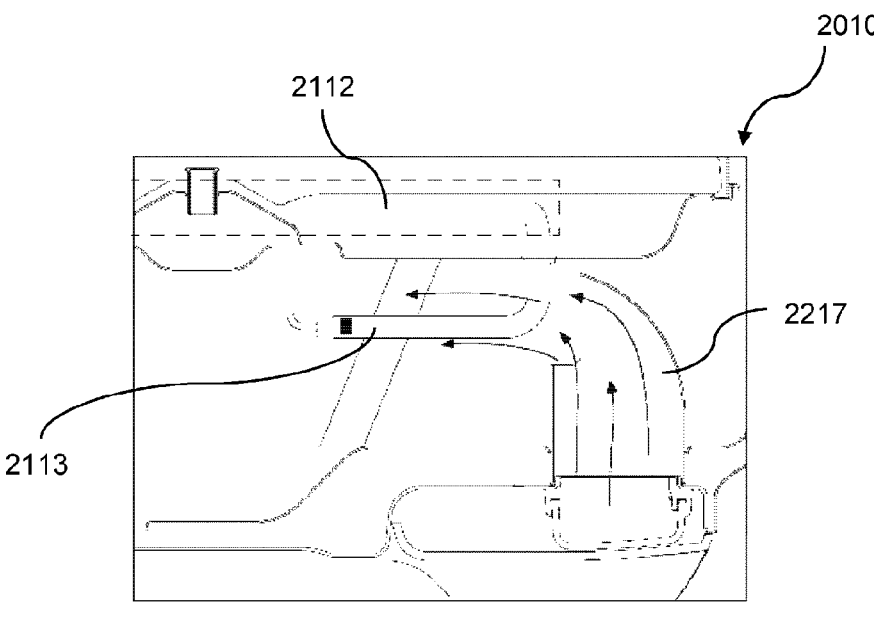
FIG. 52 is a detail view of part of FIG. 20 showing an air vent of the appliance.

The appliance 2200 includes a cooling system 2210 integrated with a periphery 2212 of the body 2014. The cooling system 2210 includes a first airflow channel 2214 and a second airflow channel 2216 as shown in FIG. 49. The first airflow channel 2214 communicates with the cavity of the wall 2020 to cool the cavity of the wall 2020 as a secondary activity as shown in FIG. 50. The primary activity of the first airflow channel 2214 is to cool electronics of the appliance 2010 (such as the PCB) which are located adjacent the entrance of the channel 2214 as shown in FIG. 51. The second airflow channel 2216 communicates with a vent 2217 that expels air and cools cold pins 2113 of the lower heating element 2112 as shown in FIG. 52. In this way, the vent 2217 is proximate the cold pins 2113 when the cold pins 2113 are in their home position when the door 2026 closes the opening 2024 of the cavity 2022. The vent 2217 is aligned so that its height and projection creates an airflow to target the cold pins 2113. The air comes from entrance 2216 and is guided by the channel in the periphery 2212 under the heating cavity 2022. A fan 2218 (shown in FIG. 51) driving the air to the vent 2217 is positioned away from the vent 2217 to distance itself from the air in the cavity 2022 which can reach temperatures of around 400° C. The fan 2218 is actuated when the temperature sensor 2116 (shown in FIG. 20) or a secondary temperature sensor (not shown) mounted on the pizza deck 2028 records a temperature threshold above a certain point, preferably 100° C. The fan 2218 turns off when the temperature sensor 2116 or the secondary temperature sensor (not shown) records a temperature threshold below the certain point.

The lower heating element 2112 can operate at approximately 700° C. which in turn causes the temperature of the cavity to reach 400° C. and the temperature of the lower region below the deck 2028 where the cold pins 2113 reside to reach 200° C. Thus, this dedicated cooling airflow to the cold pins 2113 helps to prevent the cold pins 2113 from being destroyed.

The channel in the periphery 2212 below the floor 2016 of the cavity 2022 is preferably made of a polymer to insulate the channel in the periphery 2212 and the mounting body of the fan 2218 from the cavity 2022 and the vent 2217. The vent 2217 is preferably made of metal to withstand the temperature in the cavity 2022 and is fixed, preferably welded, to the cavity floor 2016 in the cavity 2022.

Figure 53:
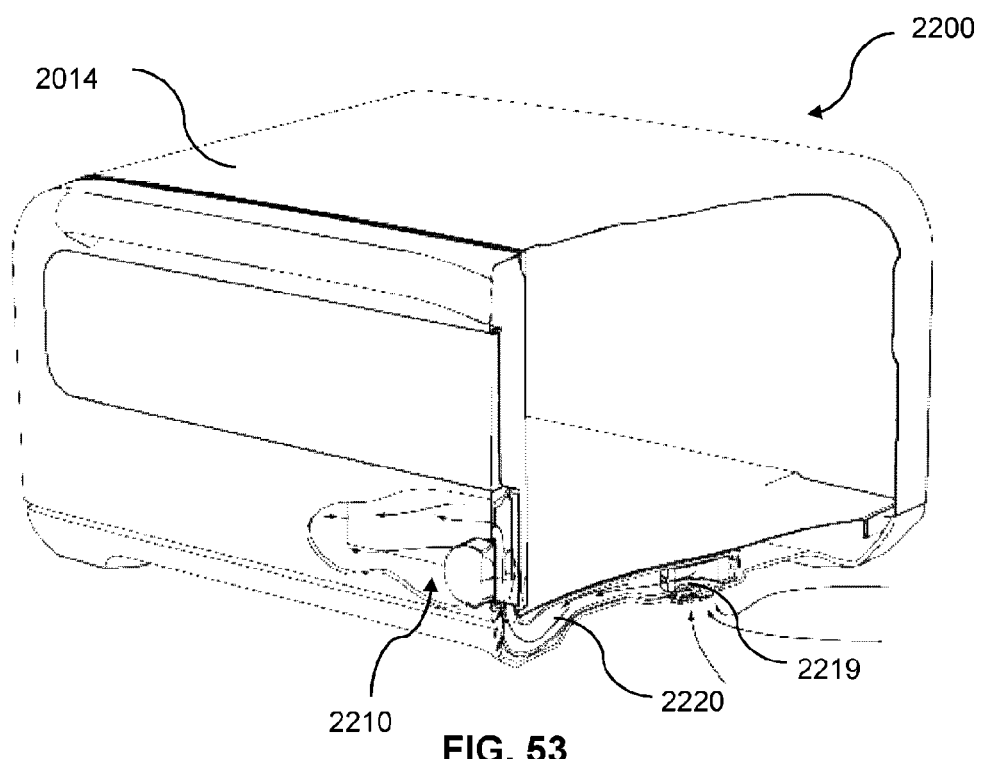
FIG. 53 is a schematic part cut away front isometric view of the appliance of FIG. 49.
Figure 54:
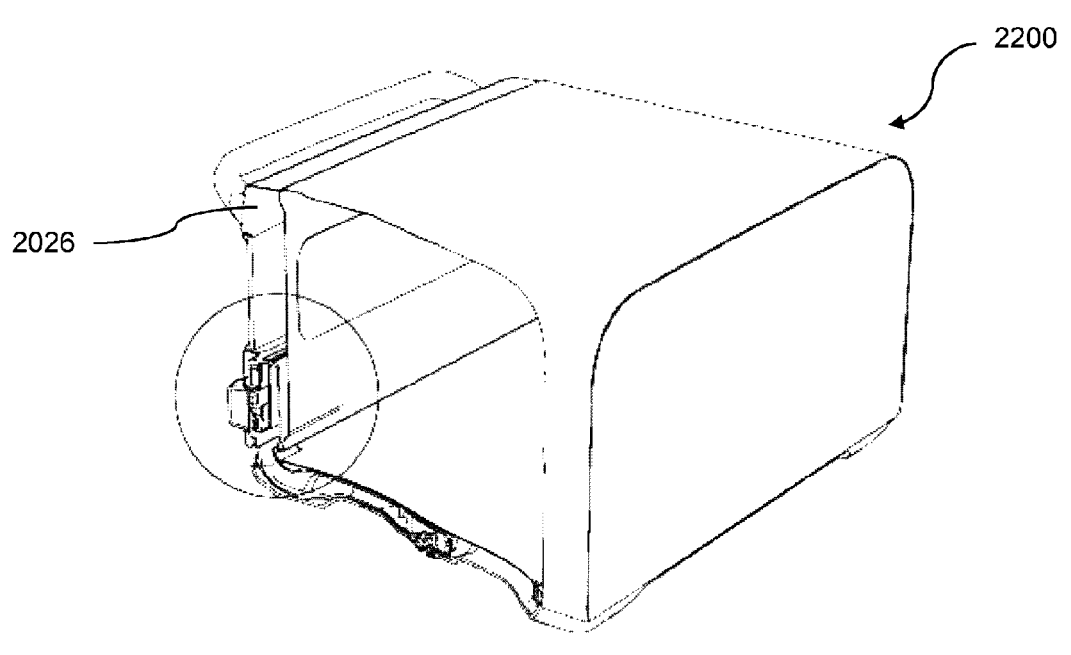
FIG. 54 is a simplified schematic part cut away rear isometric view of the appliance of FIG. 49.
Figure 55:
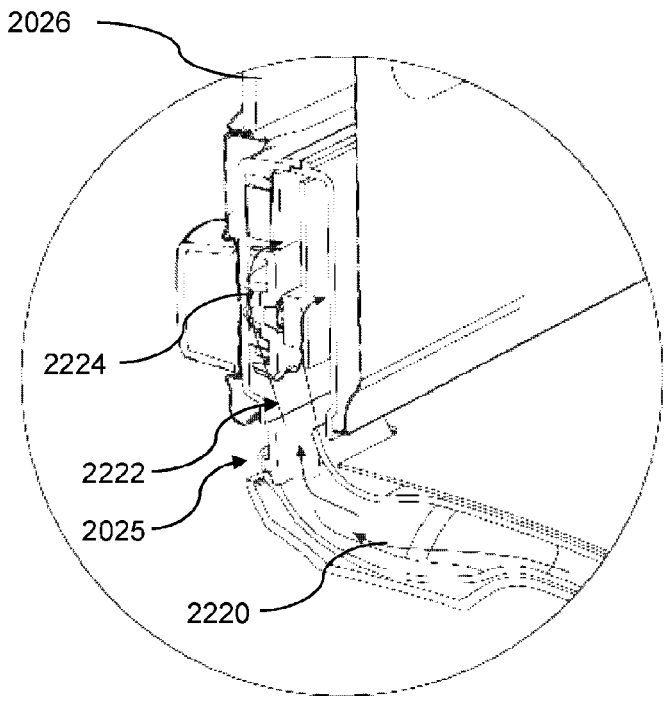
FIG. 55 is a detail view of part of FIG. 54.
Figure 56:
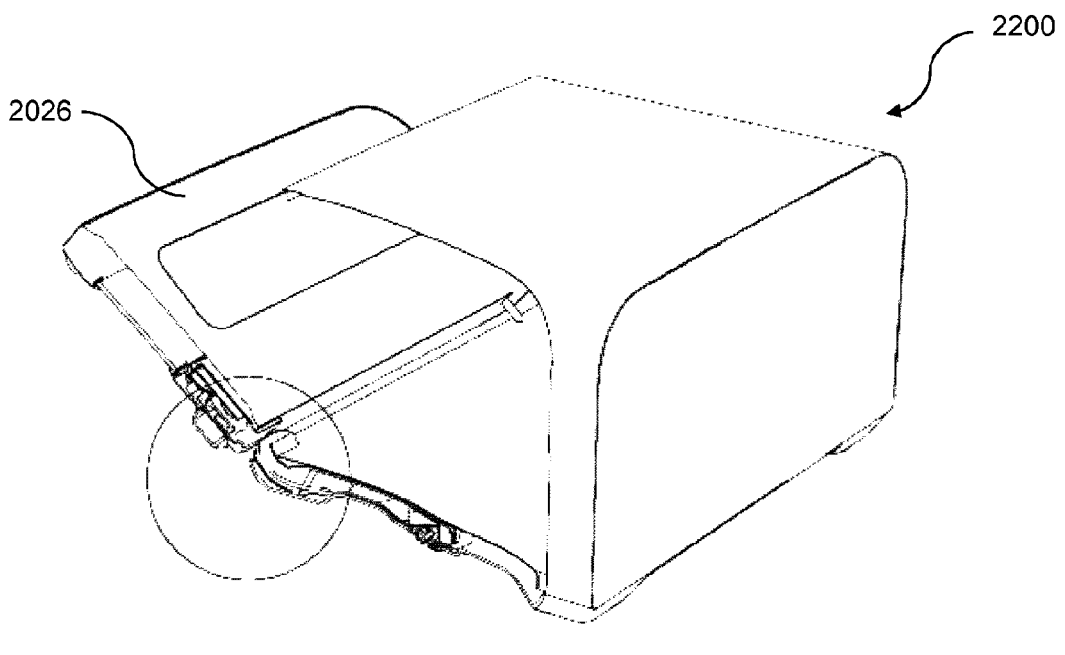
FIG. 56 is a schematic part cut away rear isometric view of the appliance of FIG. 49 in another configuration.
Figure 57:
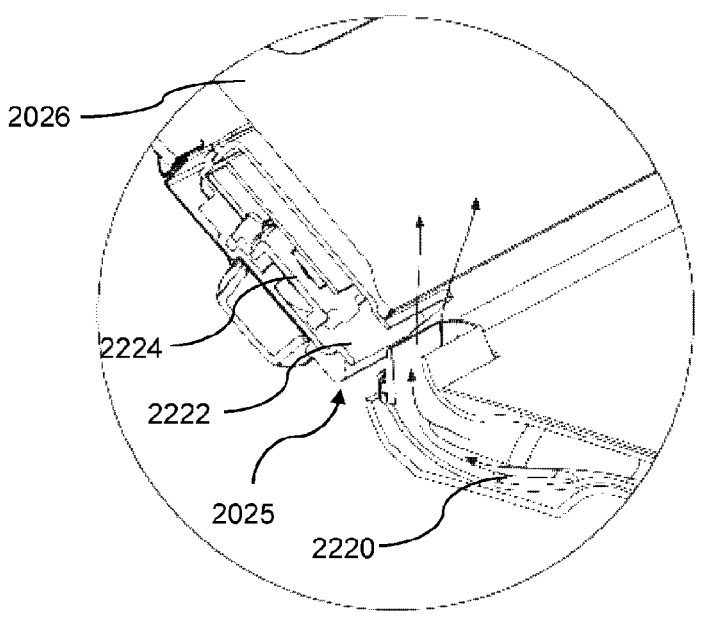
FIG. 57 is a detail view of part of FIG. 56.

With reference to FIG. 53, the cooling system 2210 includes a second fan 2219 mounted on an external portion of the body 2014. The fan 2219 draws air into a third airflow channel 2220. When the door 2026 closes the opening 2024 of the cavity 2022, the third airflow channel 2220 communicates with a passage 2222 of the door 2026 adjacent the lower portion 2025 of the door 2026 as best depicted in FIGS. 54 to 57. The airflow cools electronics 2224 (such as the power PCB and interface) housed in the door 2026 located about the passage 2222.

It will be appreciated that the illustrated embodiments provide an improved or alternative pizza oven.

It would be appreciated that, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment.

Thus, one embodiment of each of the methods described herein is in the form of a computer-readable carrier medium carrying a set of instructions, e.g., a computer program that are for execution on one or more processors.

Unless specifically stated otherwise, as apparent from the following discussions, it is appreciated that throughout the specification discussions utilizing terms such as "processing", "computing", "calculating", "determining" or the like, can refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

The methodologies described herein are, in one embodiment, performable by one or more processors that accept computer-readable (also called machine-readable) code containing a set of instructions that when executed by one or more of the processors carry out at least one of the methods described herein. Any processor capable of executing a set of instructions (sequential or otherwise) that specify actions to be taken is included.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

Similarly, it is to be noticed that the term "coupled", when used in the claims, should not be interpreted as being limitative to direct connections only. The terms "coupled" and "connected", along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may refer to the same embodiment. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description. Although the invention has been described with reference to specific examples, it will be appreciated by those skilled in the art that the invention may be embodied in many other forms.

It will be appreciated that an embodiment of the invention can consist essentially of features disclosed herein. Alternatively, an embodiment of the invention can consist of features disclosed herein. The invention illustratively disclosed herein suitably may be practiced in the absence of any element which is not specifically disclosed herein.

The invention claimed is:

1. A cooking appliance configured to cook pizza, the cooking appliance including:
    a body providing a floor, a ceiling and an intermediate wall locating between the floor and ceiling, the floor, ceiling, and wall at least partly surrounding a cooking cavity, the body having an opening via which a pizza to be cooked can be moved relative to the cavity;
    at least one upper heating element located in an upper portion of the cavity; and
    at least one annular shield circumferentially extending around the ceiling with respect to an axis that is located centrally of the ceiling and extends perpendicularly between the floor and the ceiling, the shield being configured to reduce the radiant energy from the at least one upper heating element reaching a centre portion of the pizza,
    wherein the shield has a height extending from the ceiling in a downwardly direction,
    wherein an annular channel-like region is formed between the ceiling and the shield within which the at least one upper heating element is located, the at least one upper heating element being located radially outwards relative to the shield, and
    wherein a recess is disposed radially inward of the shield, the recess being downwardly open to the cooking cavity towards the floor.

2. The cooking appliance of claim 1 wherein the at least one upper heating element extends circumferentially around the ceiling relative to the axis.

3. The cooking appliance of claim 2 further including a deck depending from the floor for receiving the pizza to be cooked, wherein the deck has a centre locating on the axis to centrally locate the pizza.

4. The cooking appliance of claim 1, wherein the shield is angularly rotatable and movable about the axis relative to the floor such that the shield can be raised away from the floor or lowered towards the floor to vary the amount of radiant energy that is shielded from the centre portion of the pizza.

5. The cooking appliance of claim 4, wherein the ceiling includes a slotted profile inclined relative to the floor, and wherein the shield includes a radial pin extending from a periphery of the shield to cooperate with the profile such that, as the shield is rotated about the axis, the pin slides towards an upper end of the profile or towards a lower end of the profile to respectively raise or lower the shield.

6. The cooking appliance of claim 1 further including an inner annular shield and an outer annular shield, the inner shield having a smaller diameter than a diameter of the outer shield so that the inner shield is nestable within the outer shield, the inner shield being rotatable about the axis relative to the outer shield.

7. The cooking appliance of claim 6, wherein each of the inner and outer shields have at least one aperture to permit radiant energy to pass therethrough, wherein the apertures of both the inner and outer shields are alignable such that rotation of the inner shield relative to the outer shield causes at least partial alignment of the apertures to vary the amount of radiant energy that is shielded from the centre portion of the pizza.

8. The cooking appliance of claim 1, wherein the shield is detachably mounted to the ceiling so that the shield can be removed from the appliance.

9. The cooking appliance of claim 1, wherein the shield is configured to provide a heating profile across the pizza such that the radiant energy being applied to the centre portion of the pizza is less than the radiant energy being applied to a crust of the pizza.

10. The cooking appliance of claim 1, wherein a portion of the ceiling is located in the recess.

11. The cooking appliance of claim 1, wherein an electrical component is located in the recess.

12. The cooking appliance of claim 1, wherein the electrical component is a further heating element.

\* \* \* \* \*